(12) United States Patent
Rabkin et al.

(10) Patent No.: US 12,127,410 B2
(45) Date of Patent: Oct. 22, 2024

(54) MEMORY DEVICE INCLUDING A FERROELECTRIC SEMICONDUCTOR CHANNEL AND METHODS OF FORMING THE SAME

(71) Applicant: SANDISK TECHNOLOGIES LLC, Addison, TX (US)

(72) Inventors: Peter Rabkin, Cupertino, CA (US); Masaaki Higashitani, Cupertino, CA (US)

(73) Assignee: SANDISK TECHNOLOGIES LLC, Addison, TX (US)

(*) Notice: Subject to any disclaimer, the term of this patent is extended or adjusted under 35 U.S.C. 154(b) by 279 days.

(21) Appl. No.: 17/373,973

(22) Filed: Jul. 13, 2021

(65) Prior Publication Data

US 2022/0310656 A1 Sep. 29, 2022

Related U.S. Application Data

(63) Continuation-in-part of application No. 17/215,312, filed on Mar. 29, 2021, now abandoned.

(51) Int. Cl.
| | | |
|---|---|---|
| H10B 51/20 | (2023.01) | |
| H01L 21/28 | (2006.01) | |
| H01L 29/51 | (2006.01) | |
| H10B 51/30 | (2023.01) | |

(52) U.S. Cl.
CPC ........ *H10B 51/20* (2023.02); *H01L 29/40111* (2019.08); *H01L 29/516* (2013.01); *H10B 51/30* (2023.02)

(58) Field of Classification Search
CPC ......... H01L 21/02568; H01L 27/11582; H01L 27/2454; H01L 27/2463; H01L 29/0603; H01L 29/24; H01L 29/66484; H01L 29/66666; H01L 29/66833; H01L 29/66969; H01L 29/7827; H01L 29/78642; H01L 29/78681; H01L 29/78696; H01L 29/7926; H01L 45/065; H01L 45/141; H01L 45/16; H10B 51/20; H10B 51/30

See application file for complete search history.

(56) References Cited

U.S. PATENT DOCUMENTS

| | | |
|---|---|---|
| 5,915,167 A | 6/1999 | Leedy |
| 9,780,108 B2 | 10/2017 | Rabkin et al. |
| 9,876,025 B2 | 1/2018 | Rabkin et al. |
| 10,516,025 B1 | 12/2019 | Nishikawa et al. |
| 10,700,093 B1 | 6/2020 | Kalitsov et al. |

(Continued)

OTHER PUBLICATIONS

Si, M. et al., "A Ferroelectric Semiconductor Field-Effect Transistor," *Nat Electro*, vol. 2, pp. 580-586, (2019). https://doi.org/10.1038/s41928-019-0338-7.

Wan, S. et al., "Room-Temperature Ferroelectricity and Switchable Diode Effect in Two-Dimensional α-In 2 Se 3 Thin Layers," *NanoScale*, vol. 10, No. 31, pp. 1-5, (2018) DOI: 10.1039/C8NR04422H.

(Continued)

*Primary Examiner* — Meiya Li
(74) *Attorney, Agent, or Firm* — THE MARBURY LAW GROUP PLLC

(57) ABSTRACT

A memory device includes a ferroelectric semiconductor channel, a source region contacting a first portion of the ferroelectric semiconductor channel, a drain region located above the source region and contacting a second portion of the ferroelectric semiconductor channel located above the first portion, a word line, and a gate dielectric located between the word line and the ferroelectric semiconductor channel.

17 Claims, 63 Drawing Sheets

(56) References Cited

U.S. PATENT DOCUMENTS

| | | |
|---|---|---|
| 10,720,444 B2 | 7/2020 | Nishikawa et al. |
| 10,957,711 B2 | 3/2021 | Prasad et al. |
| 2015/0200308 A1 | 7/2015 | Karda et al. |
| 2017/0110464 A1 | 4/2017 | Rabkin et al. |
| 2017/0110470 A1 | 4/2017 | Rabkin et al. |
| 2018/0366489 A1* | 12/2018 | Harari .................... H10B 43/27 |
| 2019/0043830 A1 | 2/2019 | Sakakibara et al. |
| 2019/0386108 A1 | 12/2019 | Nishikawa et al. |
| 2020/0020718 A1* | 1/2020 | Harari ............... H01L 21/31144 |
| 2020/0058672 A1 | 2/2020 | Nishikawa et al. |
| 2020/0203381 A1 | 6/2020 | Rabkin et al. |
| 2020/0258897 A1* | 8/2020 | Yan ................... H01L 21/32053 |
| 2021/0091204 A1 | 3/2021 | Rabkin et al. |
| 2021/0175251 A1 | 6/2021 | Zhang et al. |
| 2021/0202703 A1 | 7/2021 | Rajashekhar et al. |

OTHER PUBLICATIONS

Wang, H. et al., "Integrated Circuits Based on Bilayer $MoS_2$ Transistors," Nano Lett 2012, Vo. 12, No. 9, pp. 4674-4680, (2012). https://doi.org/10.1021/nl302015v.

Zhou, Y. et al., "Out-of-Plane Piezoelectricity and Ferroelectricity in Layered $\alpha\text{-}In_2Se_3$ Nanoflakes," *Nano Lett.* 2017, Vo. 17, No. 9, pp. 5508-5513, (2017). https://doi.org/10.1021/acs.nanolett.7b02198.

U.S. Appl. No. 17/215,312, filed Mar. 29, 2021, SanDisk Technologies, LLC.

U.S. Appl. No. 17/237,447, filed Apr. 22, 2021, SanDisk Technologies, LLC.

USPTO Office Communication, Non-Final Office Action for U.S. Appl. No. 17/215,312, mailed Aug. 5, 2022, 13 pages.

U.S. Appl. No. 17/215,312, Final Office Action issued Feb. 28, 2023, 21pgs.

* cited by examiner

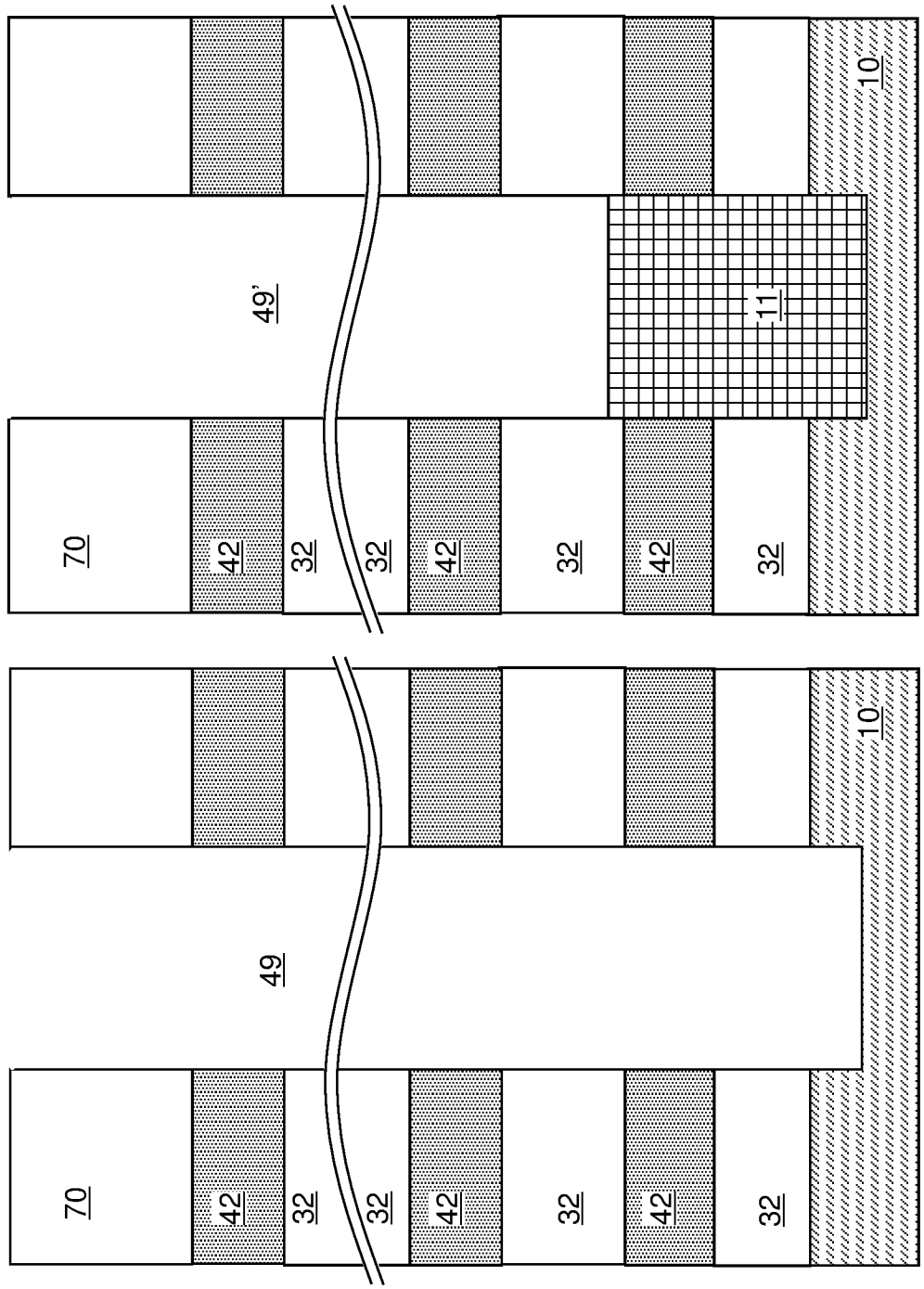

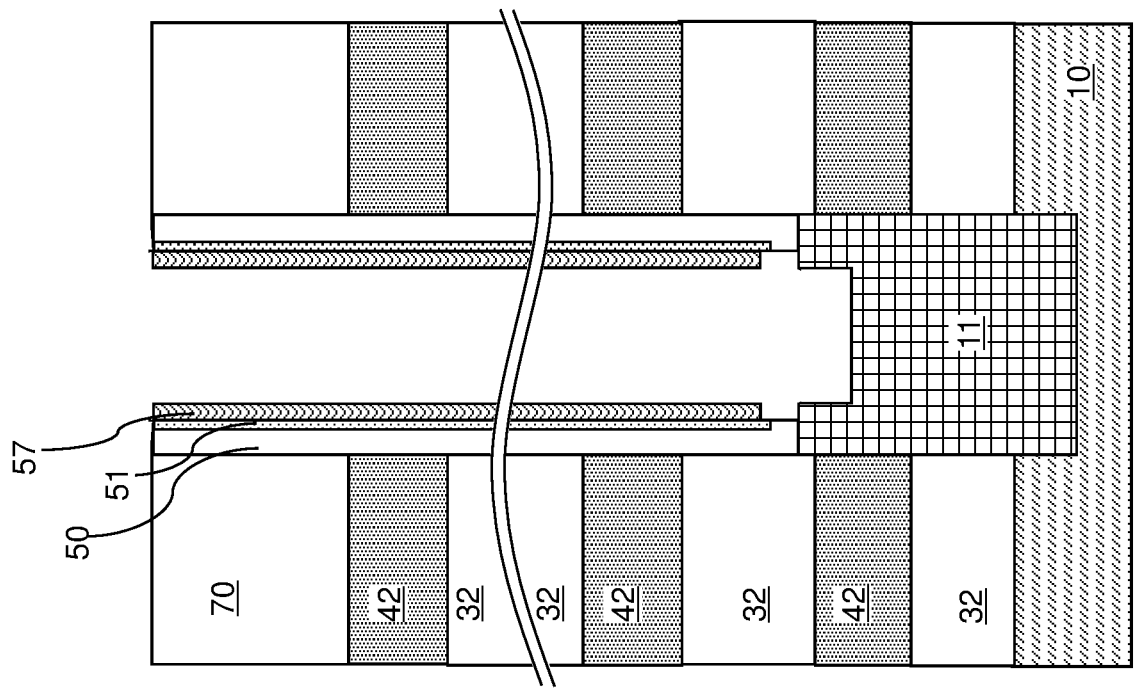
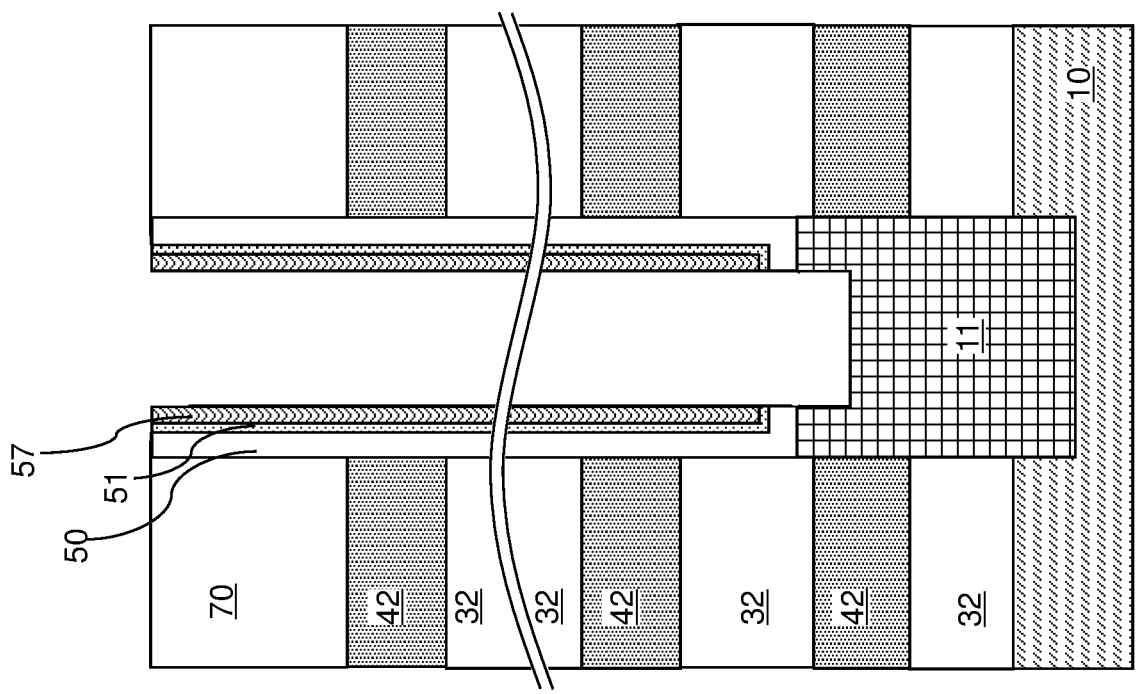

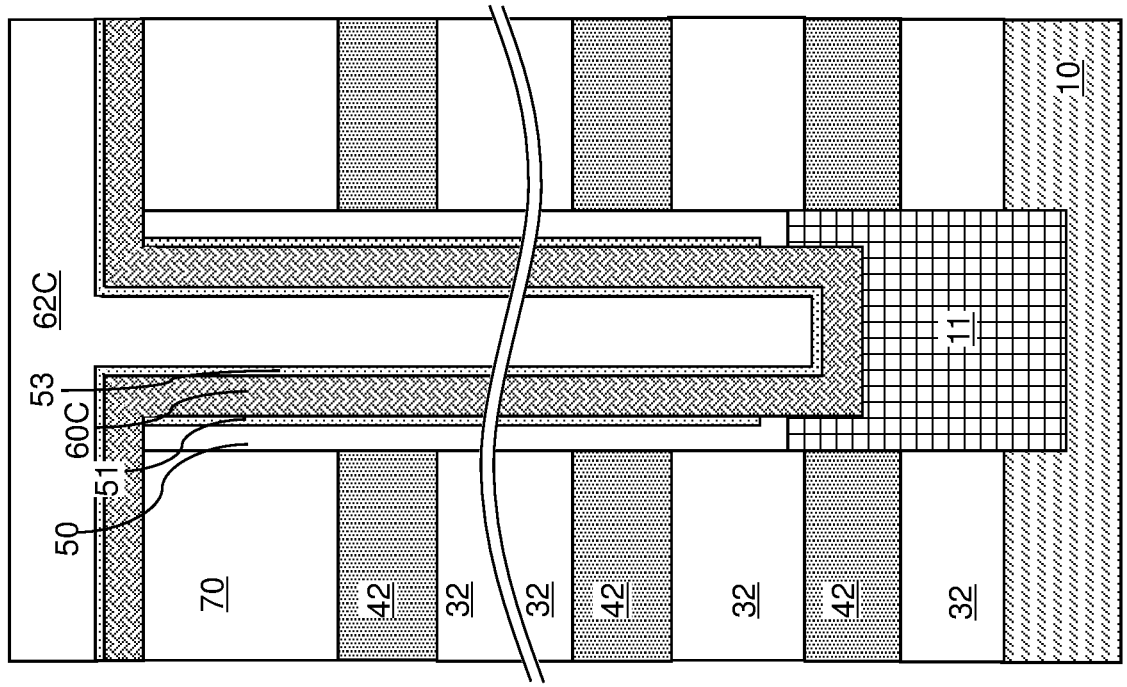
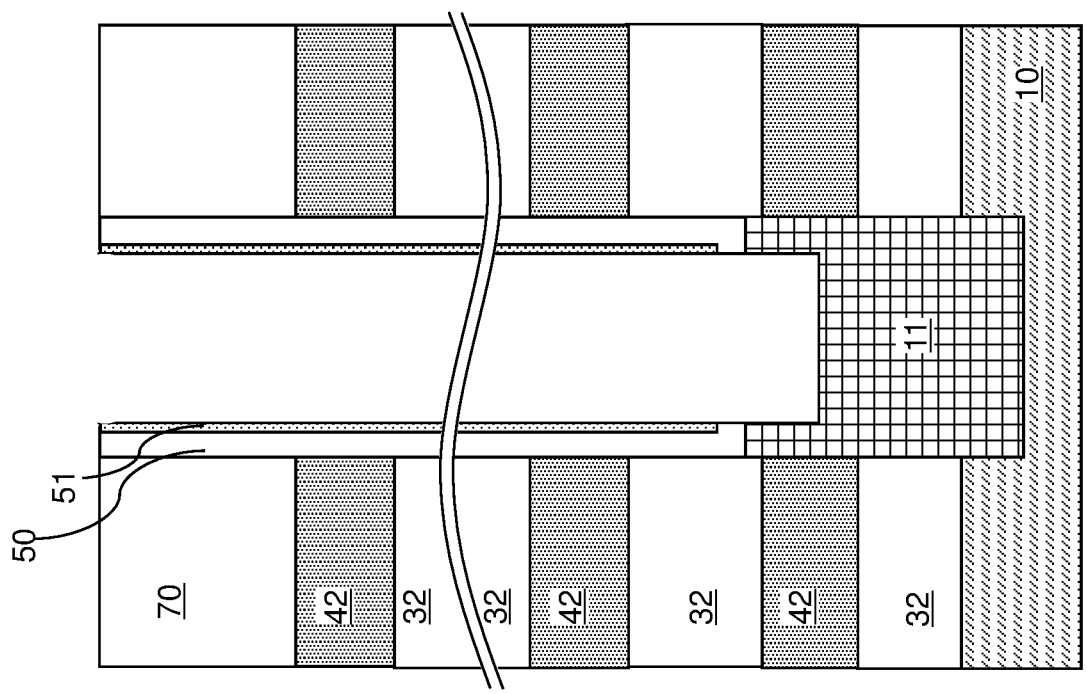

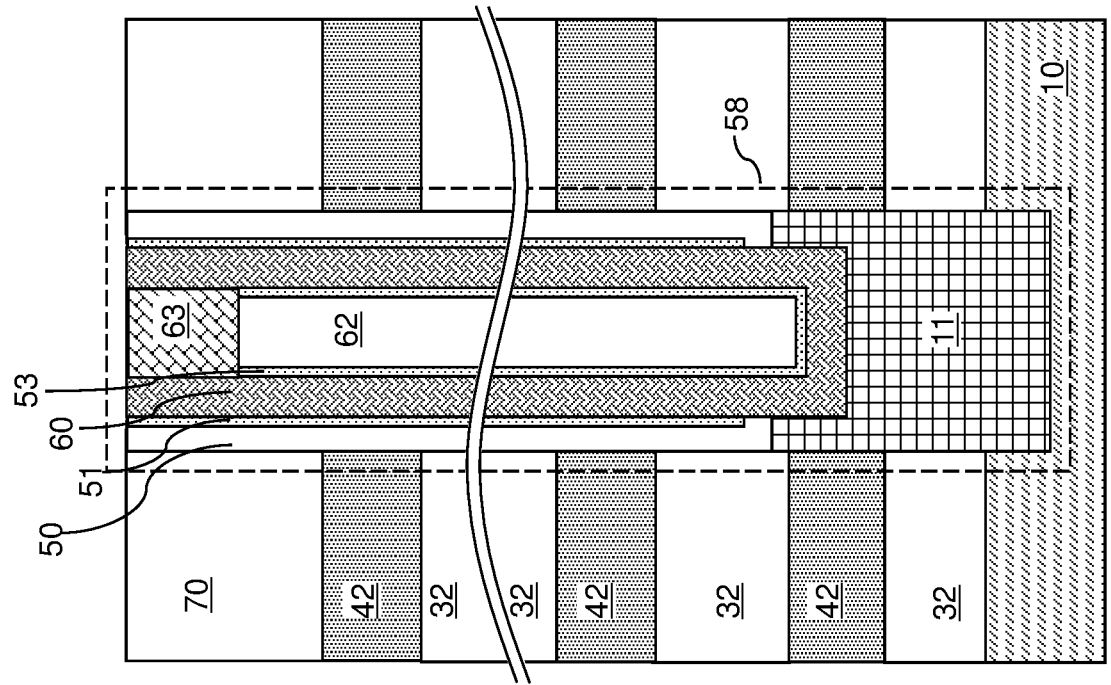
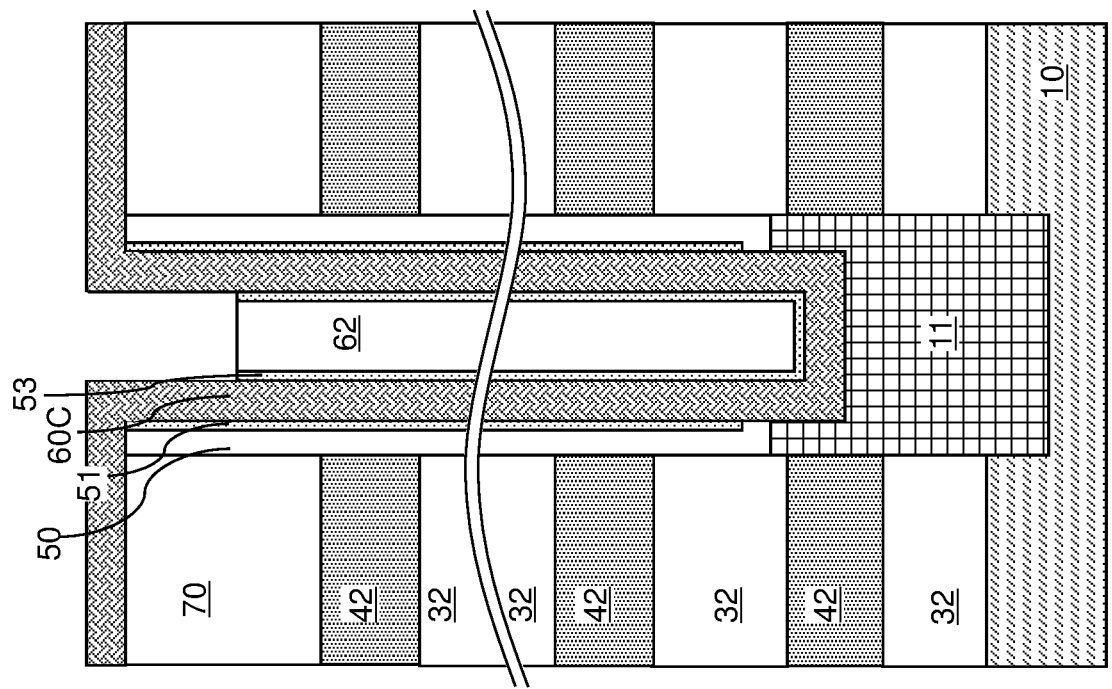

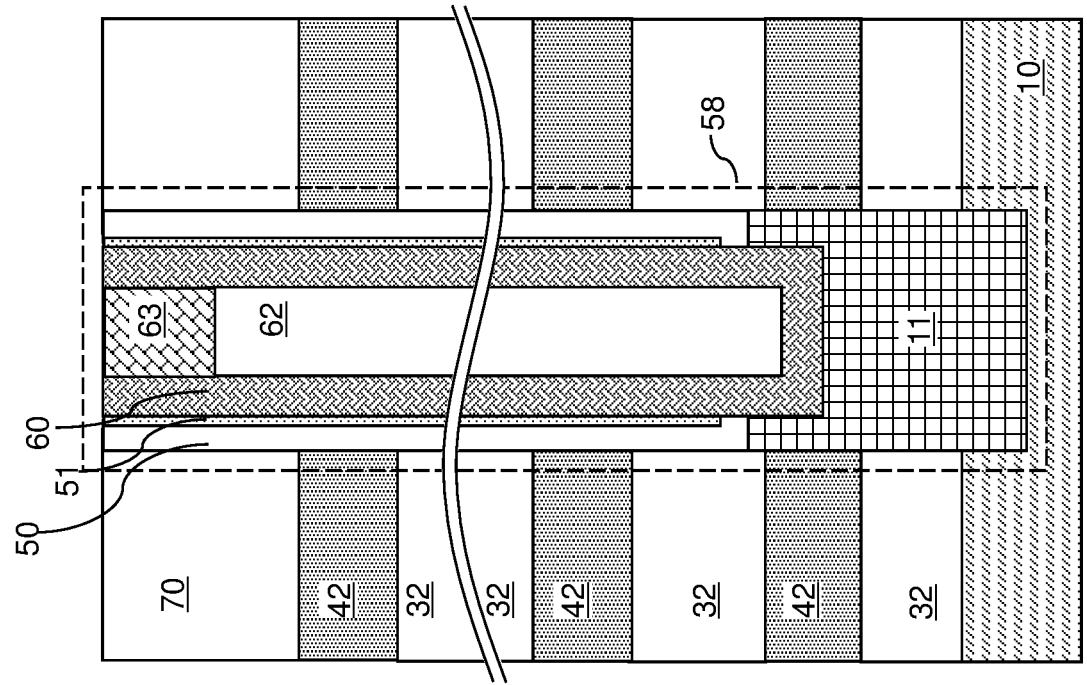
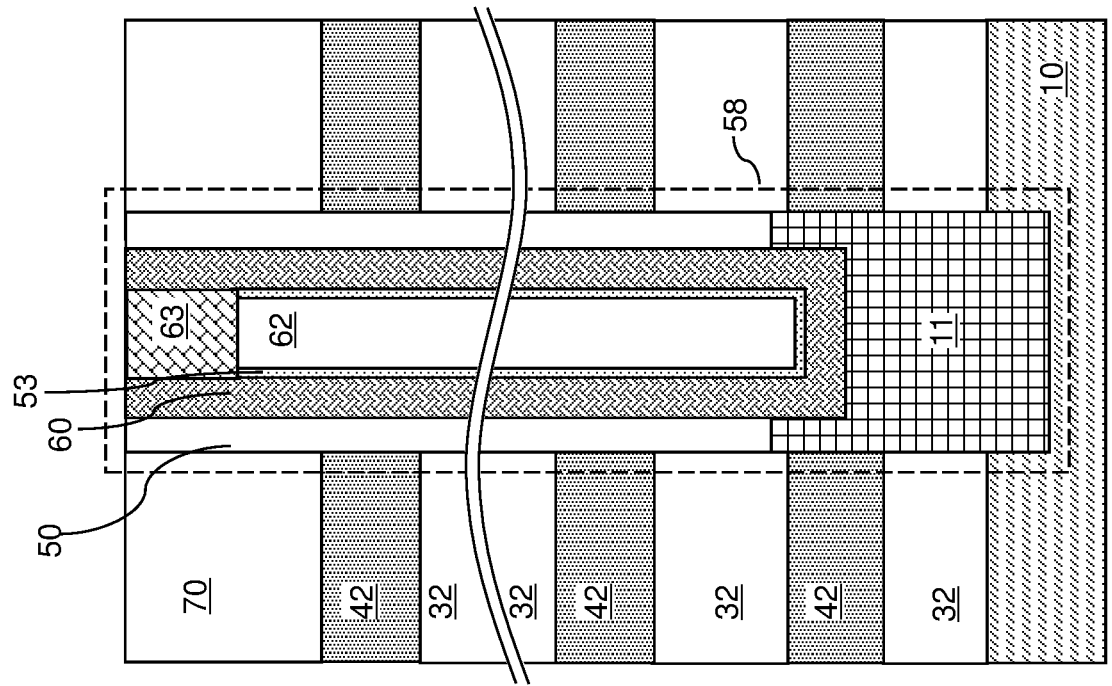

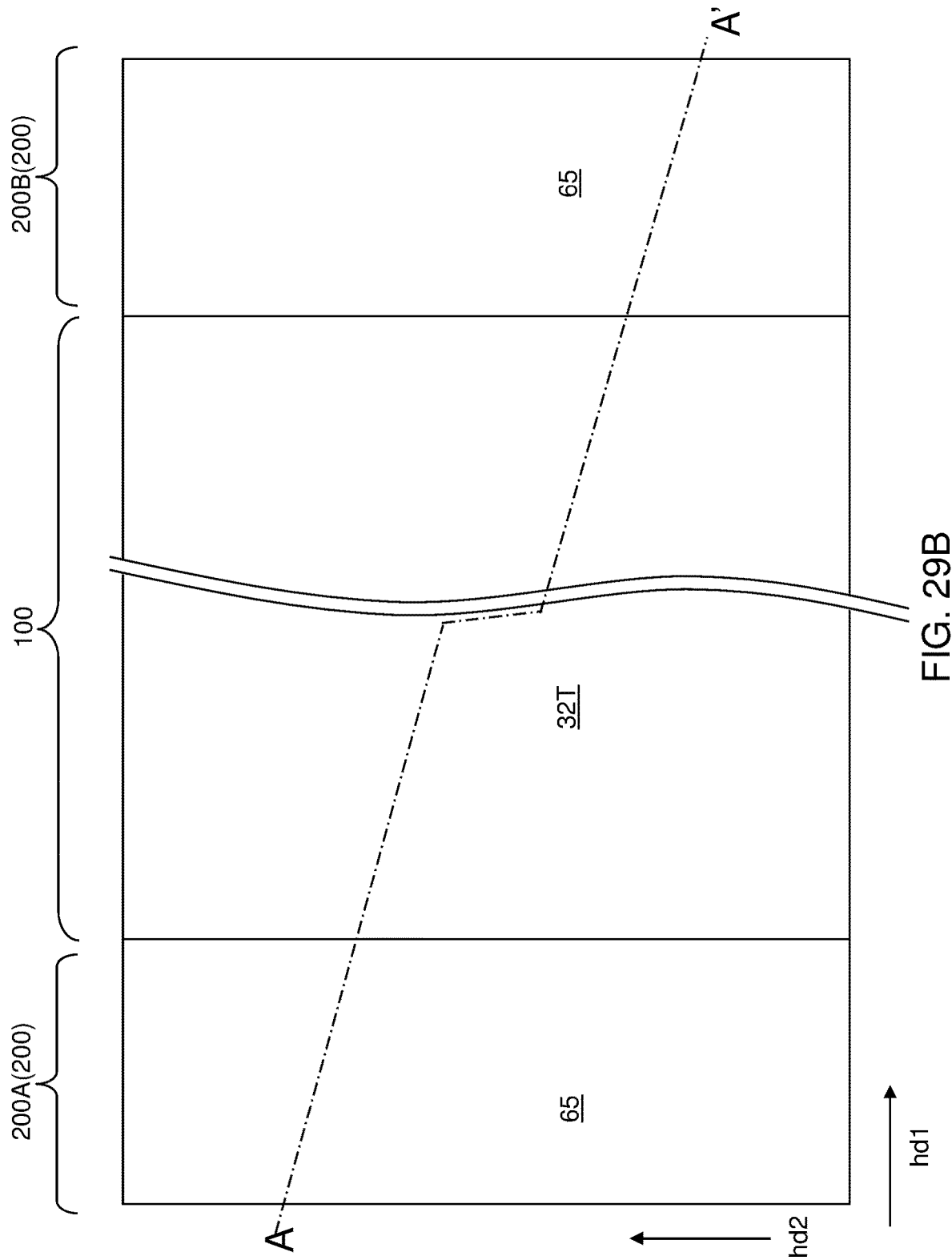

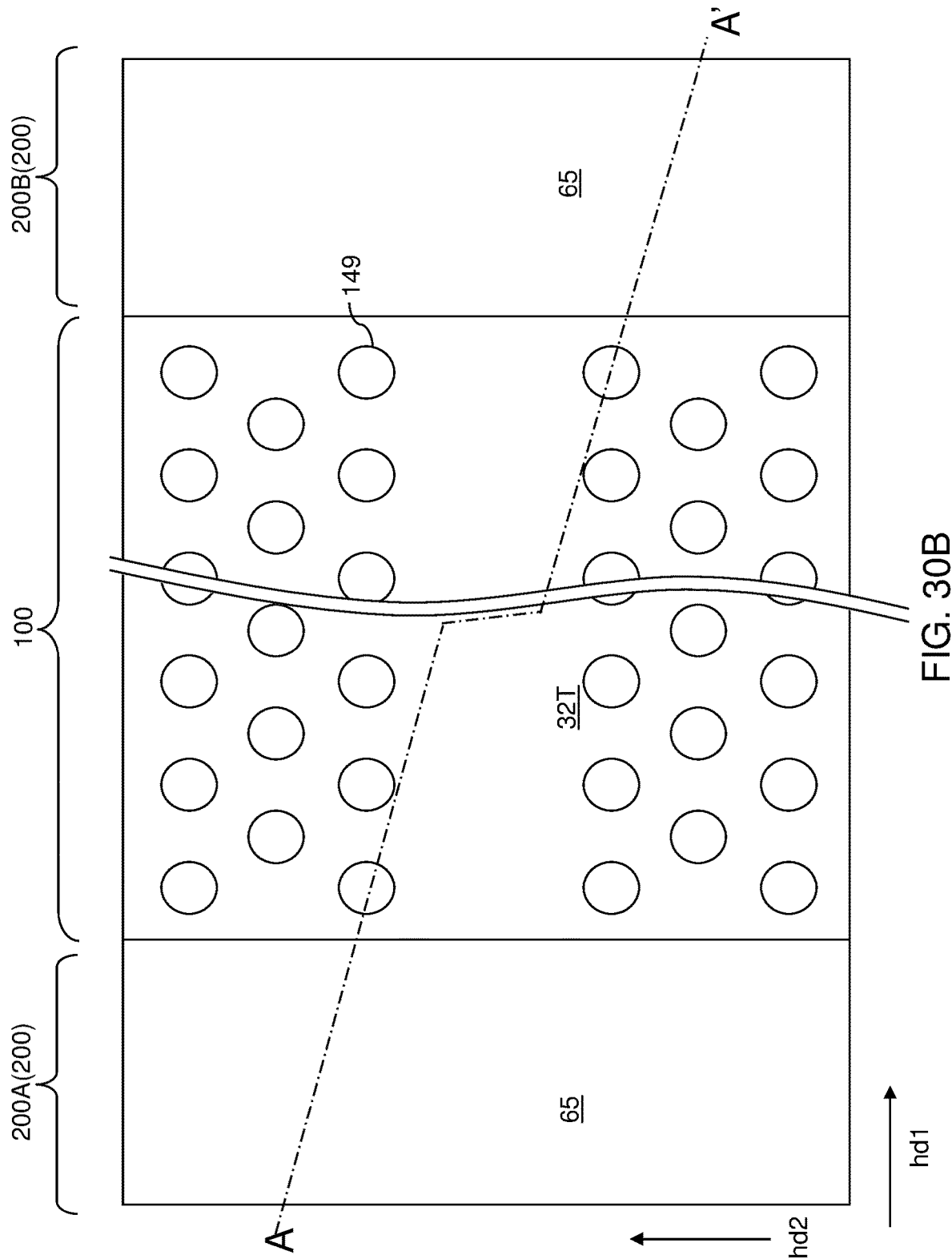

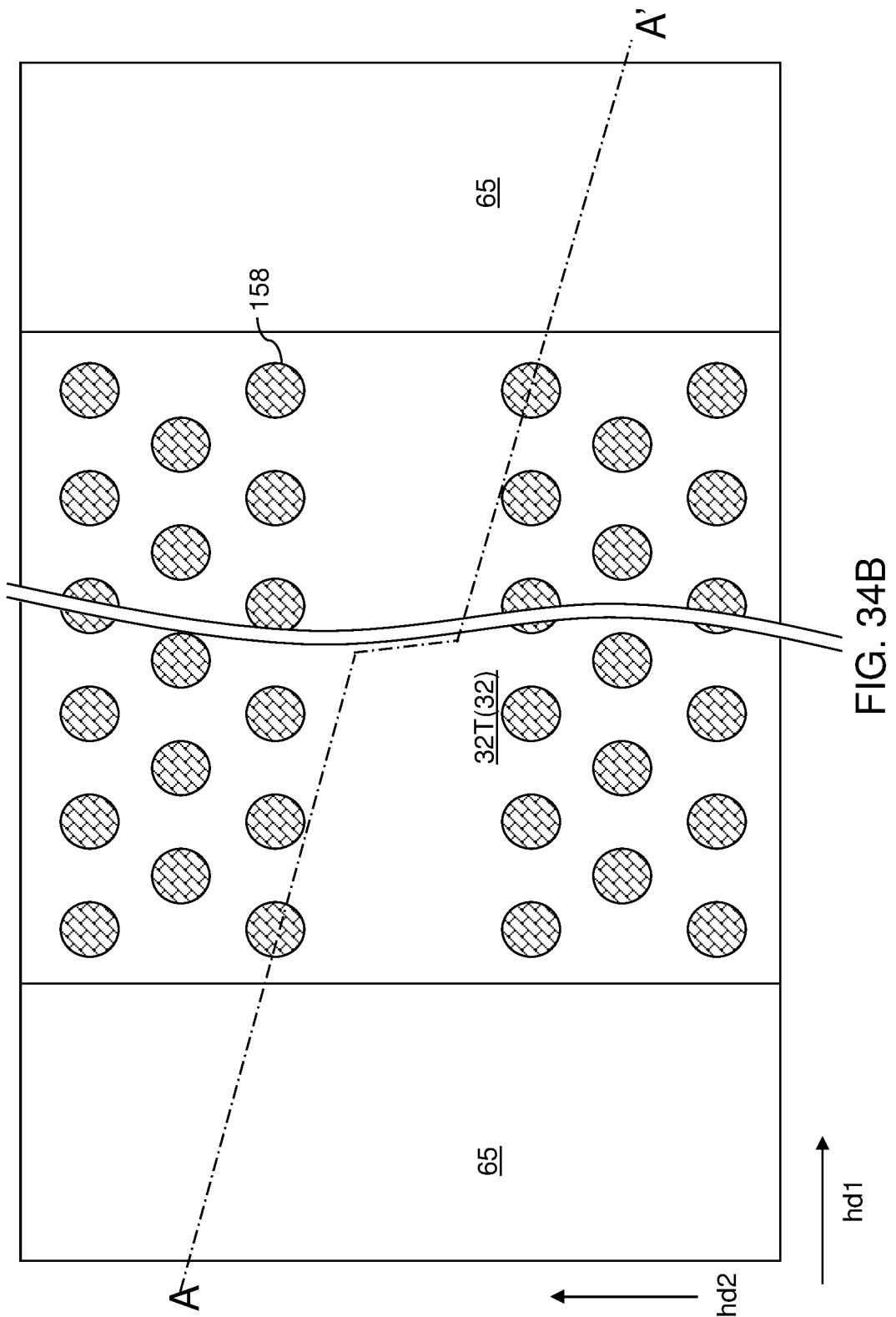

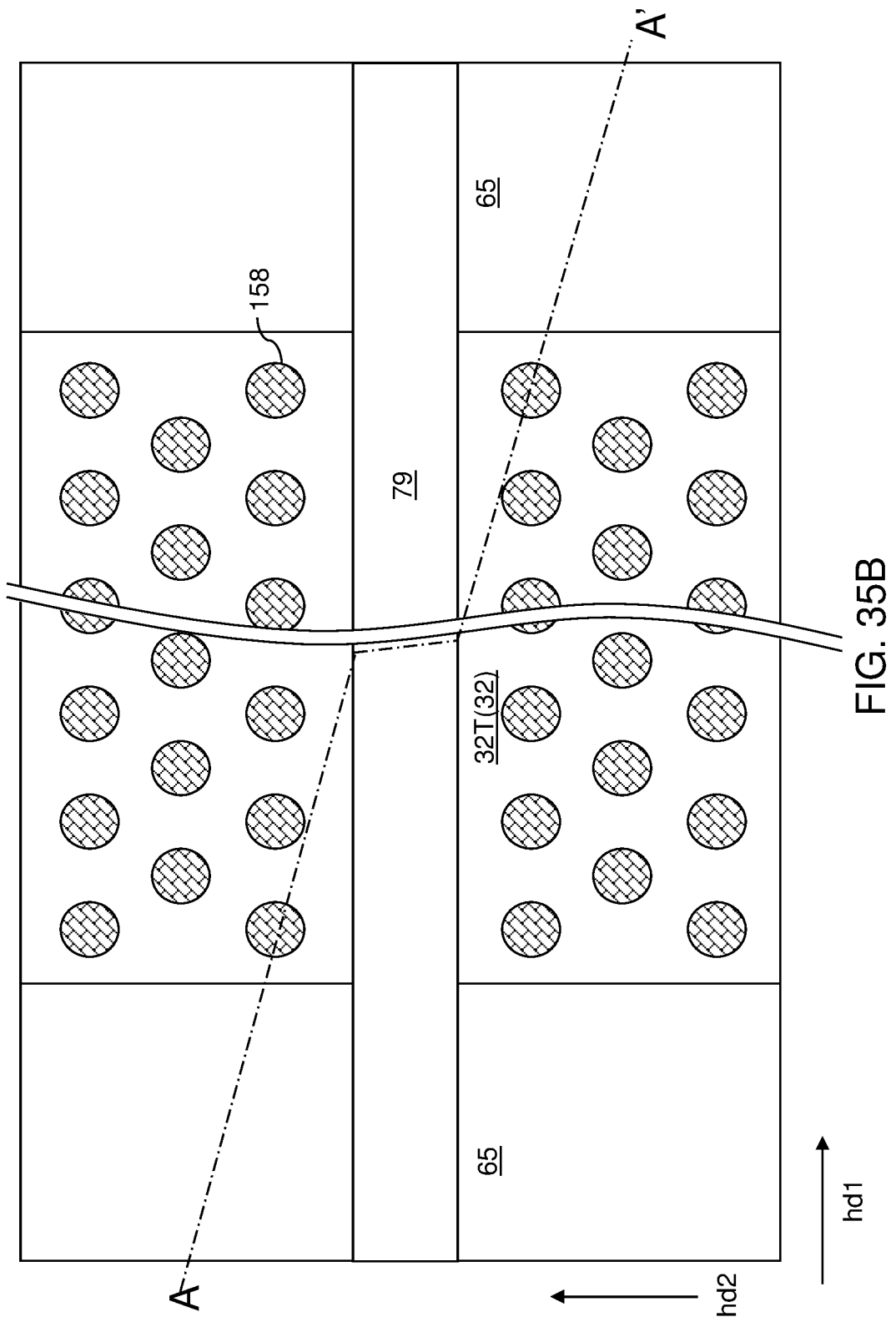

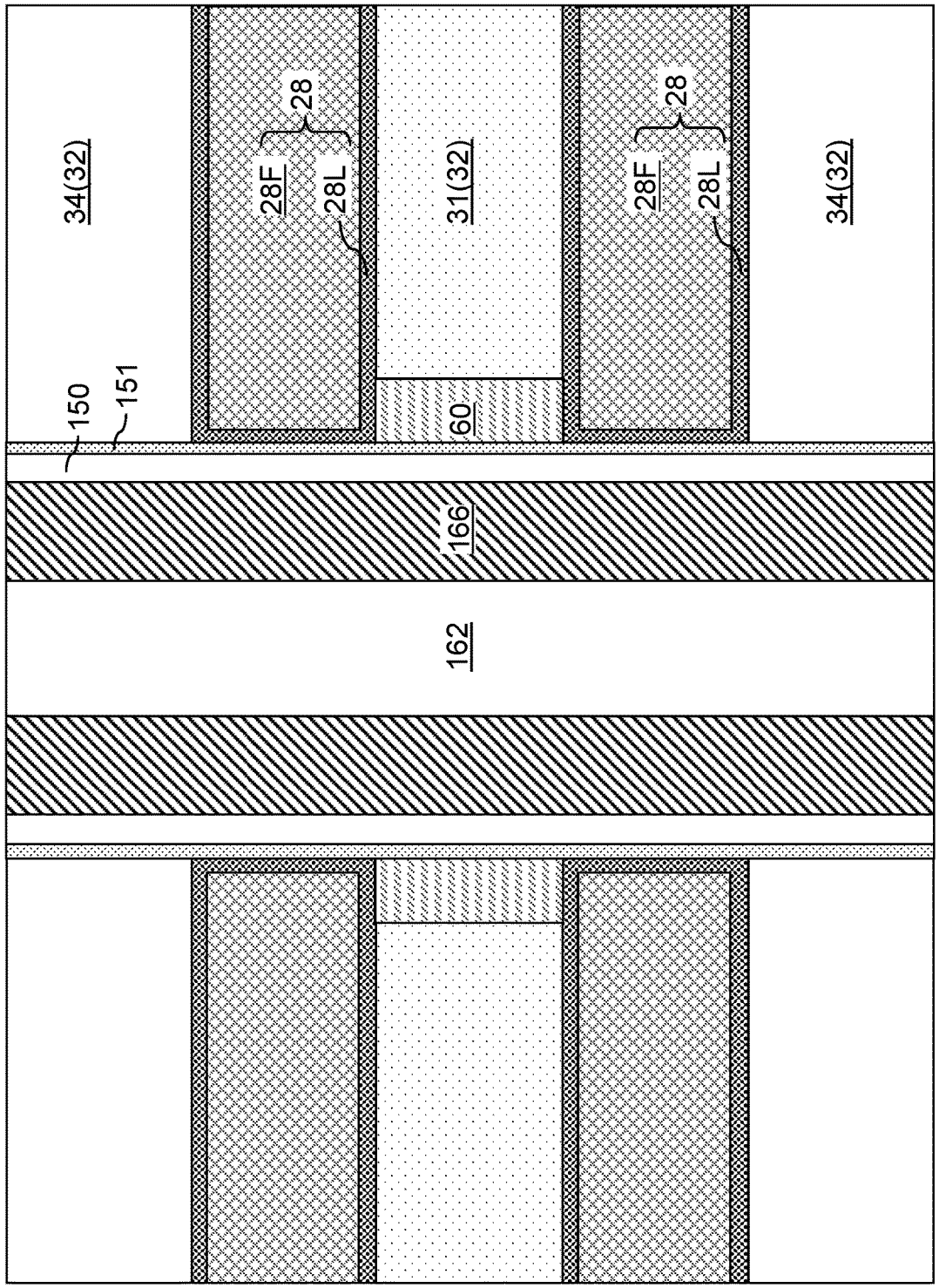

MEMORY DEVICE INCLUDING A FERROELECTRIC SEMICONDUCTOR CHANNEL AND METHODS OF FORMING THE SAME

RELATED APPLICATIONS

This application is a continuation-in-part (CIP) application of U.S. patent application Ser. No. 17/215,312 filed on Mar. 29, 2021, the entire contents of which are incorporated herein by reference.

FIELD

The present disclosure relates generally to the field of semiconductor devices, and particularly to a memory device including a ferroelectric semiconductor channel and methods of manufacturing the same.

BACKGROUND

A ferroelectric material refers to a material that displays spontaneous polarization of electrical charges in the absence of an applied electric field. The net polarization P of electrical charges within the ferroelectric material is non-zero in the minimum energy state. Thus, spontaneous ferroelectric polarization of the material occurs, and the ferroelectric material accumulates surfaces charges of opposite polarity types on two opposing surfaces. Polarization P of a ferroelectric material as a function of an applied voltage V thereacross displays hysteresis. The product of the remanent polarization and the coercive field of a ferroelectric material is a metric for characterizing effectiveness of the ferroelectric material.

A ferroelectric memory device is a memory device containing the ferroelectric material which is used to store information. The ferroelectric material acts as the memory material of the memory device. The dipole moment of the ferroelectric material is programmed in two different orientations (e.g., "up" or "down" polarization positions based on atom positions, such as oxygen and/or metal atom positions, in the crystal lattice) depending on the polarity of the applied electric field to the ferroelectric material to store information in the ferroelectric material. The different orientations of the dipole moment of the ferroelectric material may be detected by the electric field generated by the dipole moment of the ferroelectric material. For example, the orientation of the dipole moment may be detected by measuring electrical current passing through a semiconductor channel provided adjacent to the ferroelectric material in a field effect transistor ferroelectric memory device.

SUMMARY

According to an aspect of the present disclosure, a memory device includes a ferroelectric semiconductor channel, a source region contacting a first portion of the ferroelectric semiconductor channel, a drain region located above the source region and contacting a second portion of the ferroelectric semiconductor channel located above the first portion, a word line, and a gate dielectric located between the word line and the ferroelectric semiconductor channel.

According to yet another aspect of the present disclosure, a method of forming a memory device comprises: forming one or more instances of a unit layer stack located over a substrate, wherein the unit layer stack comprises a vertical-isolation insulating layer, a source spacer material layer, a channel-level insulating layer, and a drain spacer material layer, wherein each source spacer material layer is formed as or is subsequently replaced with a source layer, and each drain spacer material layer is formed as or is subsequently replaced with a drain layer; forming a memory opening through the one or more instances of the unit layer stack; forming at least one lateral recess by laterally recessing each channel-level insulating layer selective to all other layers within the one or more instances of the unit layer stack; forming a ferroelectric semiconductor channel within each of the at least one lateral recess; and forming a memory opening fill structure within the memory opening, wherein the memory opening fill structure comprises, from outside to inside, a gate dielectric and a vertical word line.

BRIEF DESCRIPTION OF THE DRAWINGS

FIGS. 5A-5J are sequential schematic vertical cross-sectional views of a memory opening within the first exemplary structure during formation of a memory stack structure, an optional dielectric core, and a drain region therein according to the first embodiment of the present disclosure.

FIGS. 5K-5M are alternative configurations for a memory opening fill structure according to the first embodiment of the present disclosure.

FIG. 29B is a top-down view of the third exemplary structure of FIG. 29A. The zig-zag vertical plane A-A' is the plane of the vertical cross-sectional view of FIG. 29A.

FIG. 30B is a top-down view of the third exemplary structure of FIG. 30A. The zig-zag vertical plane A-A' is the plane of the vertical cross-sectional view of FIG. 30A.

FIG. 34B is a top-down view of the third exemplary structure of FIG. 34A. The zig-zag vertical plane A-A' is the plane of the vertical cross-sectional view of FIG. 34A.

FIG. 35B is a top-down view of the third exemplary structure of FIG. 35A. The zig-zag vertical plane A-A' is the plane of the vertical cross-sectional view of FIG. 35A.

FIG. 37B is a top-down view of the third exemplary structure of FIG. 37A. The zig-zag vertical plane A-A' is the plane of the vertical cross-sectional view of FIG. 37A.

DETAILED DESCRIPTION

Figure 1:
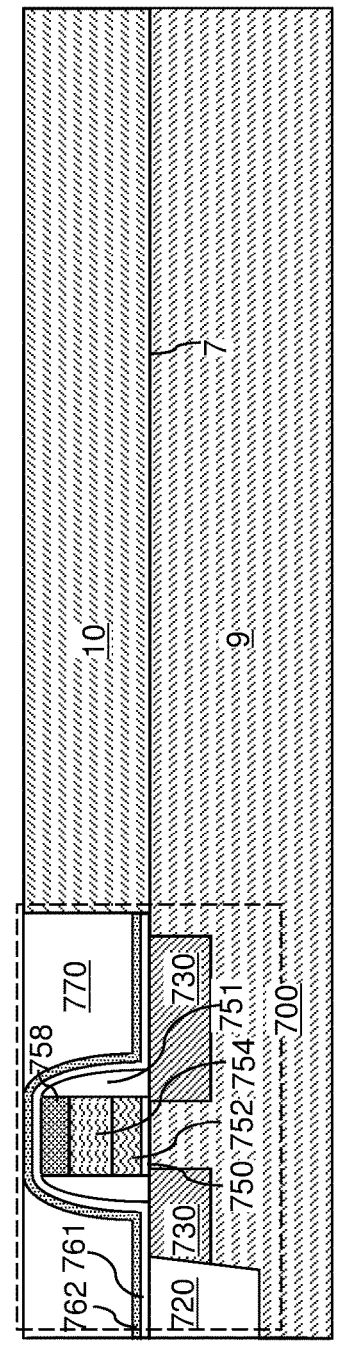
FIG. 1 is a schematic vertical cross-sectional view of a first exemplary structure after formation of at least one peripheral device and a semiconductor material layer according to a first embodiment of the present disclosure.

As discussed above, the present disclosure is directed to a memory device including a ferroelectric semiconductor channel and methods of manufacturing the same, the various aspects of which are described below. The embodiments of the disclosure may be employed to form various structures including a multilevel memory structure, non-limiting examples of which include three-dimensional ferroelectric memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated employing the various embodiments described herein.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming A page is also the smallest unit that may be selected to a read operation.

Referring to FIG. 1, a first exemplary structure according to the first embodiment of the present disclosure is illustrated, which may be employed, for example, to fabricate a device structure containing vertical NAND memory devices. The first exemplary structure includes a substrate (9, 10), which may be a semiconductor substrate. The substrate may include a substrate semiconductor layer 9 and an optional semiconductor material layer 10. The substrate semiconductor layer 9 maybe a semiconductor wafer or a semiconductor material layer, and may include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate may have a major surface 7, which may be, for example, a topmost surface of the substrate semiconductor layer 9. The major surface 7 may be a semiconductor surface. In one embodiment, the major surface 7 may be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

In one embodiment, at least one semiconductor device 700 for a peripheral circuitry may be formed on a portion of the substrate semiconductor layer 9. The at least one semiconductor device may include, for example, field effect transistors. For example, at least one shallow trench isolation structure 720 may be formed by etching portions of the substrate semiconductor layer 9 and depositing a dielectric material therein. A gate dielectric, at least one gate conductor layer, and a gate cap dielectric layer may be formed over the substrate semiconductor layer 9, and may be subsequently patterned to form at least one gate structure (750, 752, 754, 758), each of which may include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 may be formed around the at least one gate structure (750, 752, 754, 758) by depositing and anisotropically etching a dielectric liner. Active regions 730 may be formed in upper portions of the substrate semiconductor layer 9, for example, by introducing electrical dopants employing the at least one gate structure (750, 752, 754, 758) as masking structures. Additional masks may be employed as needed. The active region 730 may include source regions and drain regions of field effect transistors. A first dielectric liner 761 and a second dielectric liner 762 may be optionally formed. Each of the first and second dielectric liners (761, 762) may comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 may be a silicon oxide layer, and the second dielectric liner 762 may be a silicon nitride layer. The least one semiconductor device for the peripheral circuitry may contain a driver circuit for memory devices to be subsequently formed, which may include at least one NAND device.

A dielectric material such as silicon oxide may be deposited over the at least one semiconductor device, and may be subsequently planarized to form a planarization dielectric layer 770. In one embodiment the planarized top surface of the planarization dielectric layer 770 may be coplanar with a top surface of the dielectric liners (761, 762). Subsequently, the planarization dielectric layer 770 and the dielectric liners (761, 762) may be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, may be formed on the top surface of the substrate semiconductor layer 9 prior to, during, or after, formation of the at least one semiconductor device 700 by deposition of a single crystalline semiconductor material, for example, by selective epitaxy. The deposited semiconductor material may be the same as, or may be different from, the semiconductor material of the substrate semiconductor layer 9. The deposited semiconductor material may be any material that may be employed for the substrate semiconductor layer 9 as described above. The single crystalline semiconductor material of the semiconductor material layer 10 may be in epitaxial alignment with the single crystalline structure of the substrate semiconductor layer 9. Portions of the deposited semiconductor material located above the top surface of the planarization dielectric layer 770 may be removed, for example, by chemical mechanical planarization (CMP). In this case, the semiconductor material layer 10 may have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers may be provided between the memory array region 100 and the peripheral device region 200. In an alternative embodiment, the at least one semiconductor device 700 is formed under the memory array region 100 in a CMOS under array ("CUA") configuration. In this case, the peripheral device region 200 may be omitted or used in combination with the CUA configuration. In another alternative embodiment, the at least one semiconductor device 700 may be formed on a separate substrate and then bonded to substrate (9, 10) containing the memory array region 100.

Figure 2:
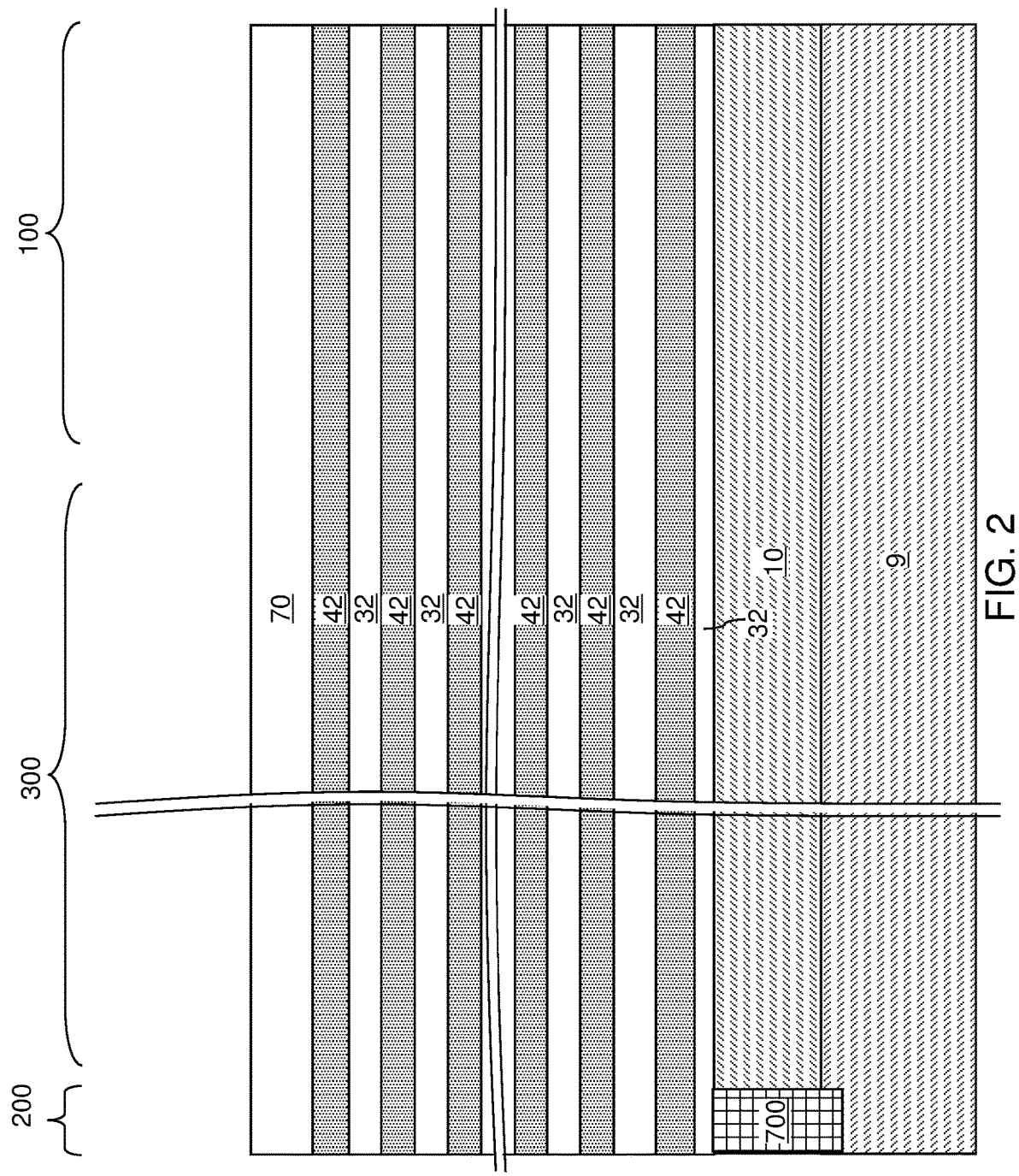
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which may be insulating layers 32) and second material layers (which may be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer may be an insulating layer 32, and each second material layer may be a sacrificial material layer. In this case, the stack may include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) may include insulating layers 32 composed of the first material, and sacrificial material layers 42 composed of a second material different from that of insulating layers 32. The first material of the insulating layers 32 may be at least one insulating material. As such, each insulating layer 32 may be an insulating material layer. Insulating materials that may be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 may be silicon oxide.

The second material of the sacrificial material layers 42 is a sacrificial material that may be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 may be subsequently replaced with electrically conductive electrodes which may function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 may be spacer material layers that comprise silicon nitride or a semiconductor material including at least one of silicon and germanium.

In one embodiment, the insulating layers 32 may include silicon oxide, and sacrificial material layers may include silicon nitride sacrificial material layers. The first material of the insulating layers 32 may be deposited, for example, by chemical vapor deposition (CVD). For example, if silicon oxide is employed for the insulating layers 32, tetraethyl orthosilicate (TEOS) may be employed as the precursor material for the CVD process. The second material of the sacrificial material layers 42 may be formed, for example, CVD or atomic layer deposition (ALD).

The sacrificial material layers 42 may be suitably patterned so that conductive material portions to be subsequently formed by replacement of the sacrificial material layers 42 may function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 may be in a range from 20 nm to 50 nm, although lesser and greater thicknesses may be employed for each insulating layer 32 and for each sacrificial material layer 42. The number of repetitions of the pairs of an insulating layer 32 and a sacrificial material layer (e.g., a control gate electrode or a sacrificial material layer) 42 may be in a range from 2 to 1,024, and typically from 8 to 256, although a greater number of repetitions may also be employed. The top and bottom gate electrodes in the stack may function as the select gate electrodes. In one embodiment, each sacrificial material layer 42 in the alternating stack (32, 42) may have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers may be omitted.

Optionally, an insulating cap layer 70 may be formed over the alternating stack (32, 42). The insulating cap layer 70 includes a dielectric material that is different from the material of the sacrificial material layers 42. In one embodiment, the insulating cap layer 70 may include a dielectric material that may be employed for the insulating layers 32 as described above. The insulating cap layer 70 may have a greater thickness than each of the insulating layers 32. The insulating cap layer 70 may be deposited, for example, by chemical vapor deposition. In one embodiment, the insulating cap layer 70 may be a silicon oxide layer.

Figure 3:
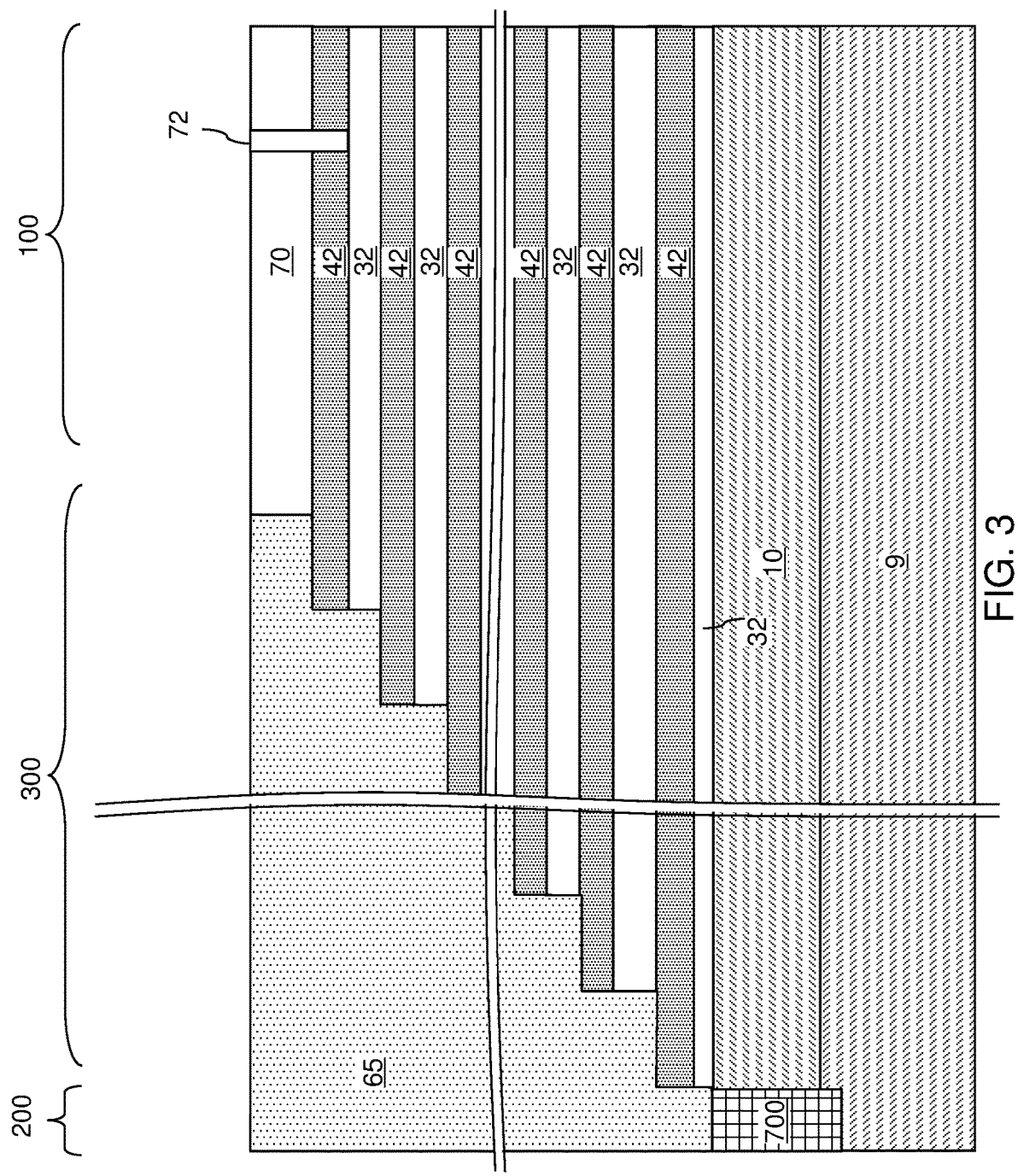
FIG. 3 is a schematic vertical cross-sectional view of the first exemplary structure after formation of stepped terraces and a retro-stepped dielectric material portion according to the first embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity may have various stepped surfaces such that the horizontal cross-sectional shape of the stepped cavity changes in steps as a function of the vertical distance from the top surface of the substrate (9, 10). In one embodiment, the stepped cavity may be formed by repetitively performing a set of processing steps. The set of processing steps may include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces may have the height of one or more pairs of an insulating layer 32 and a sacrificial material layer. In one embodiment, each vertical step may have the height of a single pair of an insulating layer 32 and a sacrificial material layer 42. In another embodiment, multiple "columns" of staircases may be formed along a first horizontal direction hd1 such that each vertical step has the height of a plurality of pairs of an insulating layer 32 and a sacrificial material layer 42, and the number of columns may be at least the number of the plurality of pairs. Each column of staircase may be vertically offset from each other such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) may be formed in the stepped cavity by deposition of a dielectric material therein. For example, a dielectric material such as silicon oxide may be deposited in the stepped cavity. Excess portions of the deposited dielectric material may be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 may be formed through the insulating cap layer 70 and a subset of the sacrificial material layers 42 located at drain select levels. The drain-select-level isolation structures 72 may be formed, for example, by forming drain-select-level isolation trenches and filling the drain-select-level isolation trenches with a dielectric material such as silicon oxide. Excess portions of the dielectric material may be removed from above the top surface of the insulating cap layer 70.

Figure 4A:
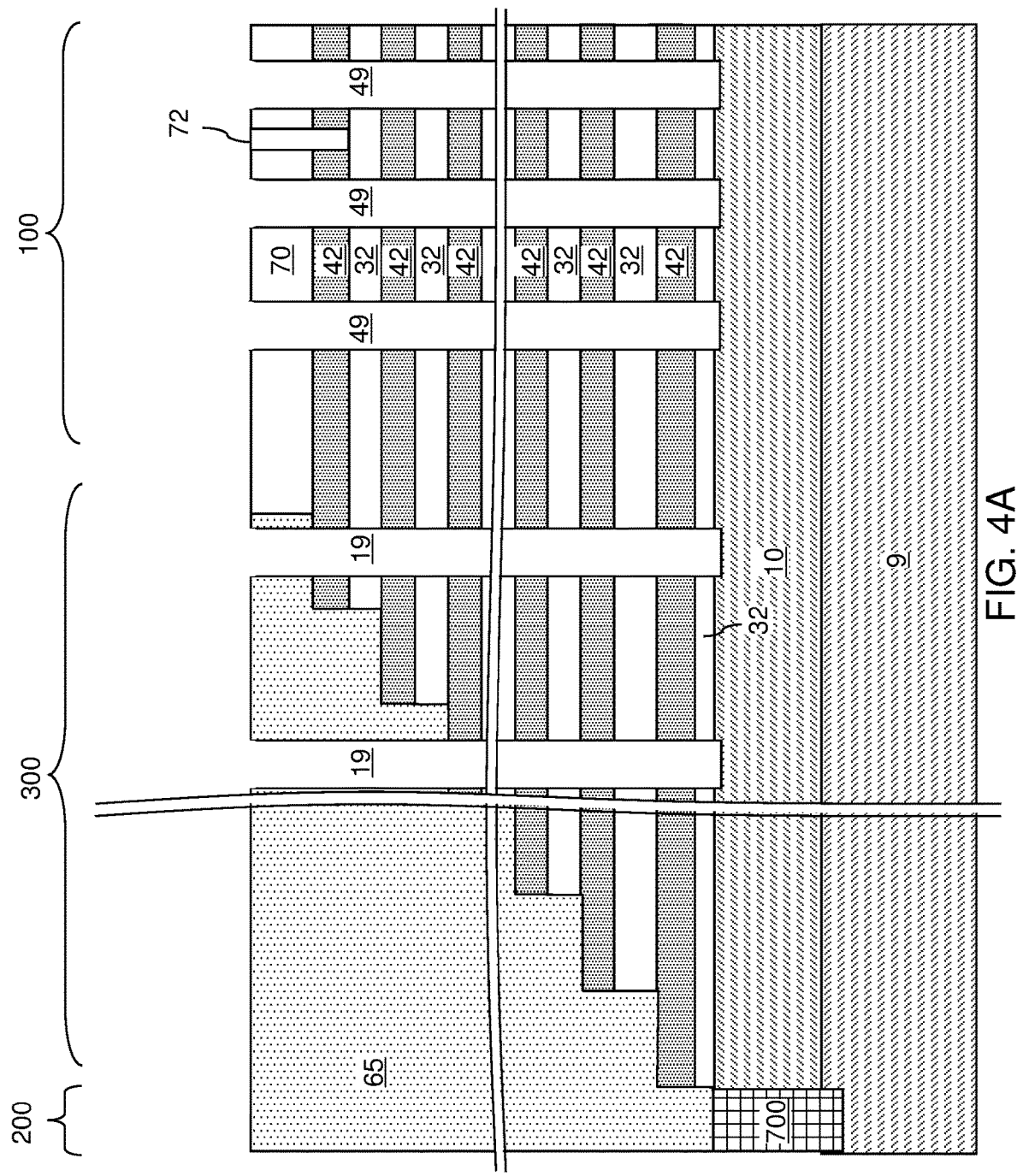
FIG. 4A is a schematic vertical cross-sectional view of the first exemplary structure after formation of memory openings and support openings according to the first embodiment of the present disclosure.
Figure 4B:
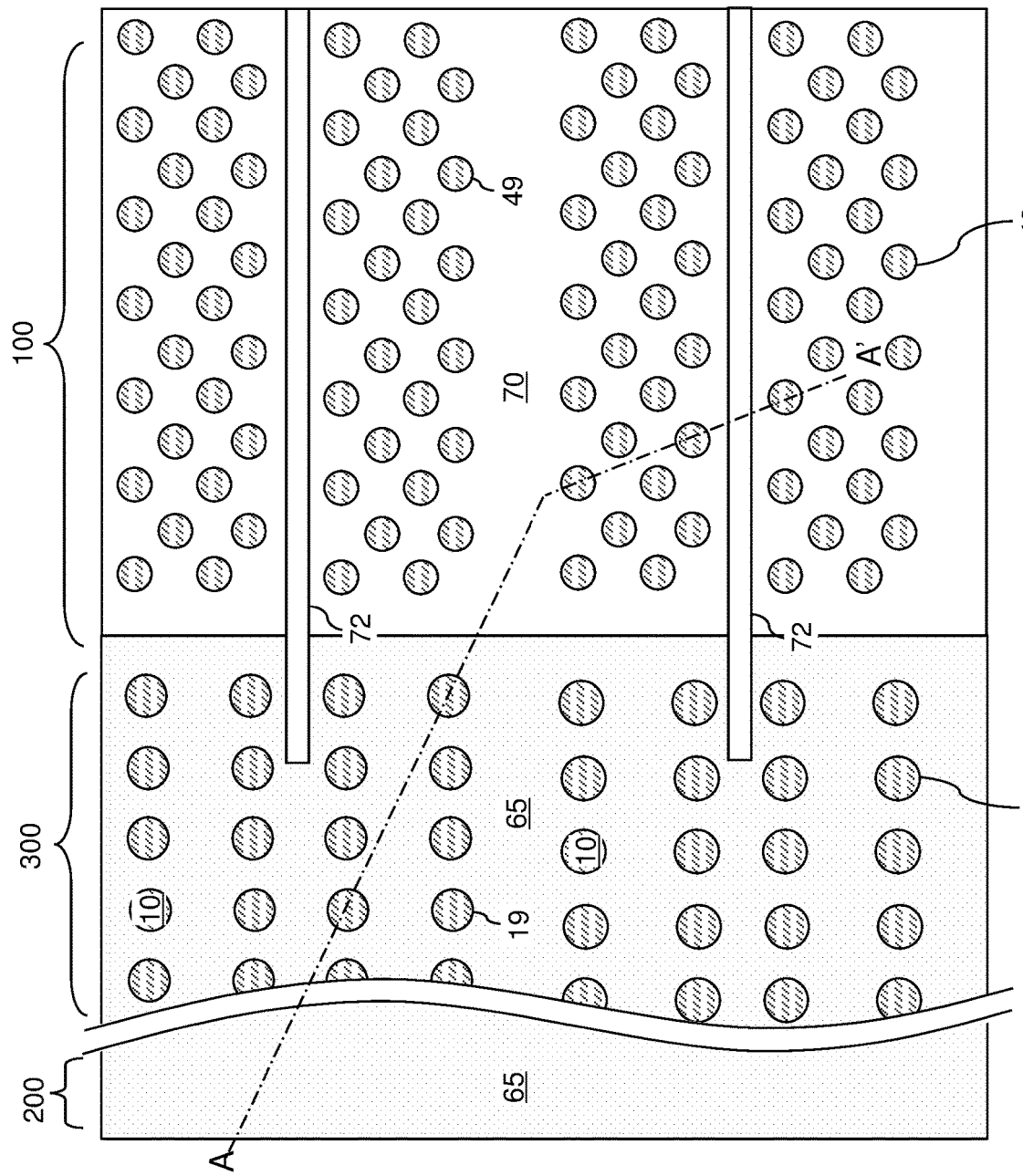
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer may be formed over the insulating cap layer 70 and the retro-stepped dielectric material portion 65, and may be lithographically patterned to form openings therein. The openings include a first set of openings formed over the memory array region 100 and a second set of openings formed over the staircase region 300. The pattern in the lithographic material stack may be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) may alternate to optimize etching of the first and second materials in the alternating stack (32, 42). The anisotropic etch may be, for example, a series of reactive ion etches. The sidewalls of the memory openings 49 and the support openings 19 may be substantially vertical, or may be tapered. The patterned lithographic material stack may be subsequently removed, for example, by ashing.

The memory openings 49 and the support openings 19 may extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, during, or after, removal of the lithographic material stack. In other words, the recessed surfaces of the semiconductor material layer 10 may be vertically offset from the un-recessed top surfaces of the semiconductor material layer 10 by a recess depth. The recess depth may be, for example, in a range from 1 nm to 50 nm, although lesser and greater recess depths may also be employed. The overetch is optional, and may be omitted. If the overetch is not performed, the bottom surfaces of the memory openings 49 and the support openings 19 may be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 may be formed in the memory array region 100. A two-dimensional array of support openings 19 may be formed in the staircase region 300. The substrate semiconductor layer 9 and the semiconductor material layer 10 collectively constitutes a substrate (9, 10), which may be a semiconductor substrate. Alternatively, the semiconductor material layer 10 may be omitted, and the memory openings 49 and the support openings 19 may be extend to a top surface of the substrate semiconductor layer 9.

FIGS. 5A-5J illustrate structural changes during formation of a memory opening fill structure in a memory opening 49, which is one of the memory openings 49 in the first exemplary structure of FIGS. 4A and 4B. The same structural change occurs simultaneously in each of the other memory openings 49 and in each of the support openings 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 may extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 may be in a range from 0 nm to 30 nm, although greater recess depths may also be employed. Optionally, the sacrificial material layers 42 may be laterally recessed partially to form lateral recesses (not shown), for example, by an isotropic etch.

Referring to FIG. 5B, an optional pedestal channel portion (e.g., an epitaxial pedestal) 11 may be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the top surface of each pedestal channel portion 11 may be formed above a horizontal plane including the top surface of a bottommost sacrificial material layer 42. In this case, a source select gate electrode may be subsequently formed by replacing the bottommost sacrificial material layer 42 with a conductive material layer. The pedestal channel portion 11 may be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 may comprise single crystalline silicon. In one embodiment, the pedestal channel portion 11 may have a doping of the first conductivity type, which is the same as the conductivity type of the semiconductor material layer 10 that the pedestal channel portion contacts. If a semiconductor material layer 10 is not present, the pedestal channel portion 11 may be formed directly on the substrate semiconductor layer 9, which may have a doping of the first conductivity type.

Figure 5D:
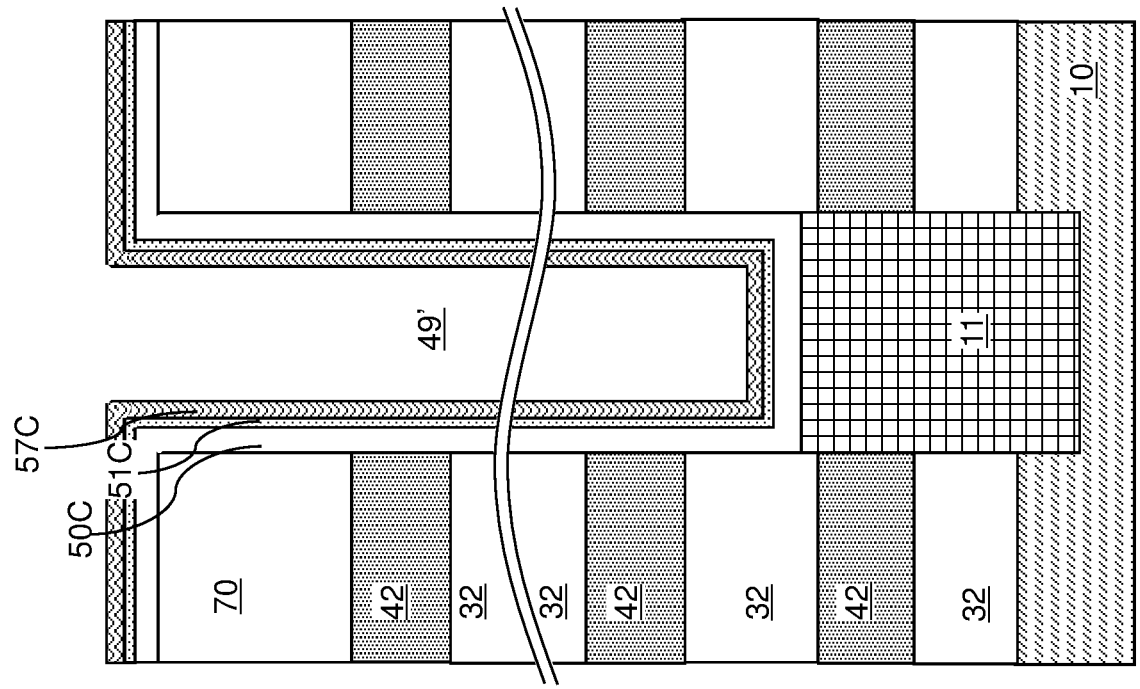
Figure 5C:
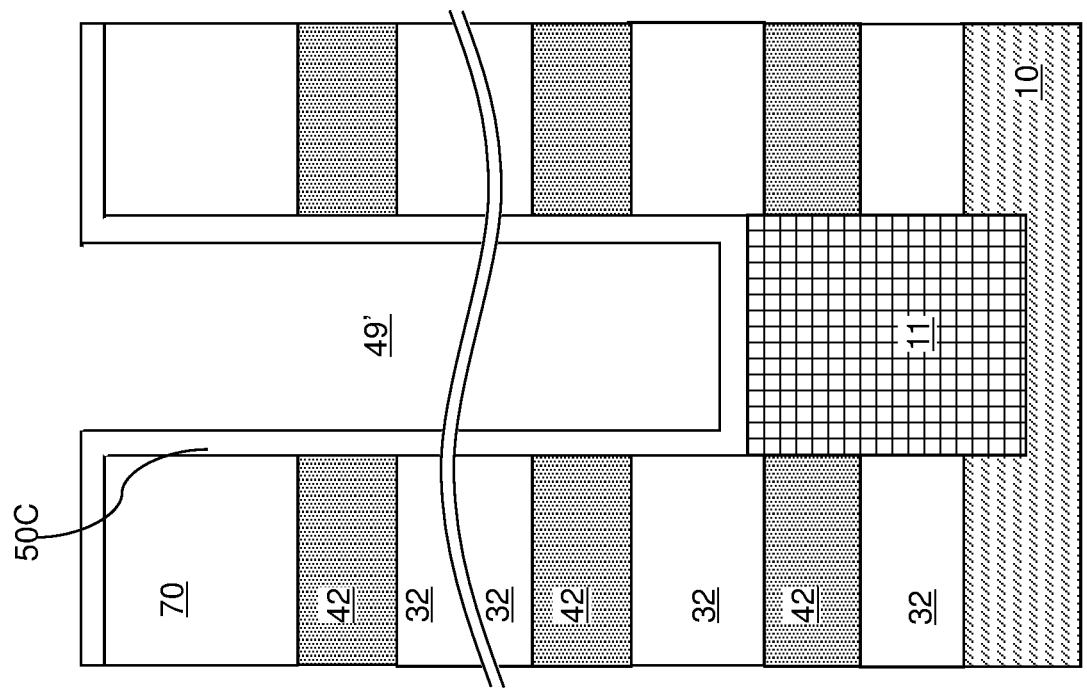

Referring to FIG. 5C, a continuous gate dielectric layer 52C can be formed on the sidewalls of the memory openings 49 and over the insulating cap layer 70 by a conformal deposition process. The continuous gate dielectric layer 52C may include any dielectric material that can be employed as a gate dielectric material. The continuous gate dielectric layer 52C can include a single dielectric material layer or a stack of a plurality of dielectric material layers.

In one embodiment, the continuous gate dielectric layer 52C can include a dielectric semiconductor compound such as silicon oxide, silicon oxynitride, silicon nitride, or a combination thereof. In one embodiment, the continuous gate dielectric layer 52C can include silicon oxide. In this case, the dielectric semiconductor compound of the continuous gate dielectric layer 52C can be formed by a conformal deposition method such as low pressure chemical vapor deposition or atomic layer deposition.

Alternatively or additionally, the continuous gate dielectric layer 52C can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the continuous gate dielectric layer 52C can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($La_2O_3$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the continuous gate dielectric layer 52C includes aluminum oxide. In one embodiment, the continuous gate dielectric layer 52C can include multiple dielectric metal oxide layers having different material compositions.

Referring to FIG. 5D, an optional continuous outer interfacial dielectric layer 51C and a continuous sacrificial cover material layer 57C may be formed over the continuous gate dielectric layer 50C. The optional continuous outer interfacial dielectric layer 51C, if present, includes a passivation dielectric material that can reduce interfacial states within outer surface portions of a ferroelectric semiconductor channel layer to be subsequently formed within each memory opening 49 and within each support opening 19. In one embodiment, the continuous outer interfacial dielectric layer 51C includes at least one dielectric metal oxide material, which may be, for example, one or more of aluminum oxide, hafnium oxide, aluminum hafnium oxide, lanthanum, oxide, etc. The thickness of the continuous outer interfacial dielectric layer 51C may be in a range from 1 nm to 3 nm, such as from 1.5 nm to 2.5 nm, although lesser and greater thicknesses may also be employed.

The continuous sacrificial cover material layer 57C, if present, may include a sacrificial cover material such as amorphous carbon, amorphous silicon, or silicon oxide. The continuous sacrificial cover material layer 57C may be deposited employing a conformal deposition process such as a chemical vapor deposition process, and may have a thickness in a range from 4 nm to 10 nm.

Referring to FIG. 5E, an anisotropic etch process can be performed to remove horizontally-extending portions of the continuous sacrificial cover material layer 57C, the optional continuous outer interfacial dielectric layer 51C, and the continuous gate dielectric layer 50C. Each remaining portion of the continuous sacrificial cover material layer 57C located in a memory opening 49 or a support opening 19 constitutes a sacrificial cover material layer 57. Each remaining portion of the continuous outer interfacial dielectric layer 51C located in a memory opening 49 or a support opening 19 constitutes an outer interfacial dielectric layer 51. Each remaining portion of the continuous gate dielectric layer 50C located in a memory opening 49 or a support opening 19 constitutes a gate dielectric 50. The sacrificial cover material layer 57 protects the outer interfacial dielectric layer 51 and the gate dielectric 50 during the anisotropic etch process.

Referring to FIG. 5F, an isotropic etch process may be optionally performed to isotropically recess the materials of the gate dielectric 50 and/or the outer interfacial dielectric layer 51 within each memory opening 49 and within each support opening 19. A wet etch process that etches the material(s) of the gate dielectric 50 and/or the outer interfacial dielectric layer 51 may be employed. The recess distance may be about the same as the thickness of the sacrificial cover material layers 57.

Referring to FIG. 5G, remaining portions of the sacrificial cover material layer 57 may subsequently be removed by an isotropic etch process or by an ashing process selective to the material of the gate dielectrics 50 and/or selective to the material of the outer interfacial dielectric layer 51. A cylindrical inner surface of the outer interfacial dielectric layer 51 and a recessed top surface of the pedestal channel portion 11 can be physically exposed in each of the memory openings 49 and the support openings 19. If an outer interfacial dielectric layer 51 is not employed, a cylindrical inner surface of a gate dielectric 50 can be physically exposed.

Referring to FIG. 5H, a continuous ferroelectric semiconductor channel layer 60C can be deposited by a conformal deposition process. The continuous ferroelectric semiconductor channel layer 60C includes a semiconducting ferroelectric material, i.e., a ferroelectric material having electrical conductivity in a range from $1.0 \times 10^{-5}$ S/m to $1.0 \times 10^{5}$ S/m. Generally, most ferroelectric materials are insulating, i.e., have electrical conductivity less than $1.0 \times 10^{-5}$ S/m. A vertical portion of the continuous ferroelectric semiconductor channel layer 60C is subsequently employed as a ferroelectric semiconductor channel layer within a vertical NAND string.

In one embodiment, the continuous ferroelectric semiconductor channel layer 60C comprises, and/or consists essentially of, an indium selenide material. In one embodiment, the indium selenide material may be an alpha indium selenide material having a rhombohedral R3m crystalline structure and may have a material composition of $In_2Se_{3+\delta}$ as deposited, or after a subsequent anneal process. The value of $\delta$ may be in a range from 0 to 0.8, such as 0.3 to 0.5, for example 0.35 to 0.4. For example, the alpha indium selenide may comprise 37 atomic percent indium and 63 atomic percent selenium, a bandgap of ~1.39 eV, room temperature ferroelectricity with Curie temperature above 200° C., and ability to maintain ferroelectricity down to a few atomic layers. In one embodiment, the continuous ferroelectric semiconductor channel layer 60C may have an electron mobility in range from 100 $cm^2/(V \cdot s)$ to 2,000 $cm^2/(V \cdot s)$, such as 400 to 500 $cm^2/(V \cdot s)$, which is about two orders of magnitude higher than that of polysilicon. This material provides a high performance with a large memory window and low leakage (e.g., individual transistor may have a high on/off ratio over $1 \times 10^8$).

In one embodiment, the continuous ferroelectric semiconductor channel layer 60C can have a lateral thickness in a range from 0.65 nm to 8 nm, such as from 2 nm to 6 nm. The continuous ferroelectric semiconductor channel layer 60C may be 1 to 10 atomic monolayers thick, and comprise a two-dimensional or quasi-two dimensional layer. The continuous ferroelectric semiconductor channel layer 60C may be deposited by a conformal deposition process such as a chemical vapor deposition process or an atomic layer deposition process. The continuous ferroelectric semiconductor channel layer 60C can have a uniform thickness throughout. The continuous ferroelectric semiconductor channel layer 60C may be annealed at an elevated temperature, which may be in a range from 500 degrees Celsius to 750 degrees Celsius. The duration of the anneal process may be in a range from 10 minutes to 30 minutes. The anneal process induces crystallization of the deposited material of the continuous ferroelectric semiconductor channel layer 60C into a ferroelectric phase.

An optional continuous inner interfacial dielectric layer 53C may be formed over the continuous ferroelectric semiconductor channel layer 60C. The optional continuous inner interfacial dielectric layer 53C, if present, includes a passivation dielectric material that can reduce interfacial states on inner surface portions of the ferroelectric semiconductor channel layer 60. In one embodiment, the continuous inner interfacial dielectric layer 53C includes at least one dielectric metal oxide material, which may be, for example, one or more of aluminum oxide, hafnium oxide, aluminum hafnium oxide, lanthanum, oxide, etc. The thickness of the continuous inner interfacial dielectric layer 53C may be in a range from 1 nm to 3 nm, although lesser and greater thicknesses may also be employed.

A dielectric core layer 62C may be deposited in the memory cavity 49' to fill any remaining portion of the memory cavity 49' within each memory opening 49. The dielectric core layer 62C includes a dielectric material such as silicon oxide or organosilicate glass. Alternatively, the dielectric core layer 62C may include a film of an inner silicon oxide layer and an outer aluminum oxide layer. The dielectric core layer 62C may be deposited by a conformal deposition method such as low pressure chemical vapor deposition (LPCVD), or by a self-planarizing deposition process such as spin coating.

Referring to FIG. 5I, the horizontal portion of the dielectric core layer 62C may be removed, for example, by a recess etch from above the top surface of the continuous ferroelectric semiconductor channel layer 60C. Further, the material of the dielectric core layer 62C may be vertically recessed selective to the continuous ferroelectric semiconductor channel layer 60C into each memory opening 49 down to a depth between a first horizontal plane including the top surface of the insulating cap layer 70 and a second horizontal plane including the bottom surface of the insulating cap layer 70. Each remaining portion of the dielectric core layer 62C constitutes a dielectric core 62.

Referring to FIG. 5J, a drain electrode material may be deposited within each recessed region above the dielectric cores 62. In one embodiment, the drain electrode material may be selected from a doped elemental semiconductor material, such as doped polysilicon, a doped compound semiconductor material, a stack including a titanium layer and a gold layer, a stack including a nickel layer and a gold layer, or a metal silicide material. In case a doped electrical semiconductor material or a doped compound semiconductor material is employed as the drain electrode material, the drain electrode material may have a doping of a second conductivity type that is the opposite of the first conductivity type. For example, if the first conductivity type is p-type, the second conductivity type is n-type, and vice versa. The dopant concentration of the doped semiconductor material of the drain electrode material may be in a range from $5.0 \times 10^{18}/cm^3$ to $2.0 \times 10^{21}/cm^3$, although lesser and greater dopant concentrations may also be employed. Alternatively or additionally, the drain electrode material may comprise at least one metallic material, such as a stack including a titanium layer and a gold layer, a stack including a nickel layer and a gold layer, or a metal silicide, such as nickel silicide material. In an illustrative example, a Ti/Au layer stack may be employed to provide good ohmic contact to the continuous ferroelectric semiconductor channel layer 60C if $\alpha$-$In_2Se_{3+\delta}$ is employed for the continuous ferroelectric semiconductor channel layer 60C. In this case, a titanium layer having a thickness of about 3 nm may be deposited as a barrier metal layer, followed by deposition of a gold layer having a thickness of about 5 nm. The layer stack may be anneal at a temperature of about 350 degrees Celsius in an ambient including argon and optionally hydrogen, for 10 to 30 minutes. The anneal process can provide a clean surface with low contact resistance.

Excess portions of the drain electrode material and the continuous ferroelectric semiconductor channel layer 60C may be removed from above the horizontal plane including the top surface of the insulating cap layer 70, for example, by chemical mechanical planarization (CMP) or a recess etch. Each remaining portion of the drain electrode material constitutes a drain region 63. Each remaining portion of the continuous ferroelectric semiconductor channel layer 60C may be located entirety within a memory opening 49 or entirely within a support opening 19, and constitutes a ferroelectric semiconductor channel layer 60.

Each memory opening is filled with a memory opening fill structure 58, which includes an optional pedestal channel portion 11, a gate dielectric 50, an optional outer interfacial dielectric layer 51, a ferroelectric semiconductor channel layer 60, an optional inner interfacial dielectric layer 53, a dielectric core 62, and a drain region 63.

Referring to FIG. 5K, a first alternative configuration of a memory opening fill structure 58 is illustrated, which can be derived from the memory opening fill structure of FIG. 5J by omitting the outer interfacial dielectric layer 51.

Referring to FIG. 5L, a second alternative configuration of a memory opening fill structure 58 is illustrated, which can be derived from the memory opening fill structure of FIG. 5J by omitting the inner interfacial dielectric layer 53.

Figure 5M:
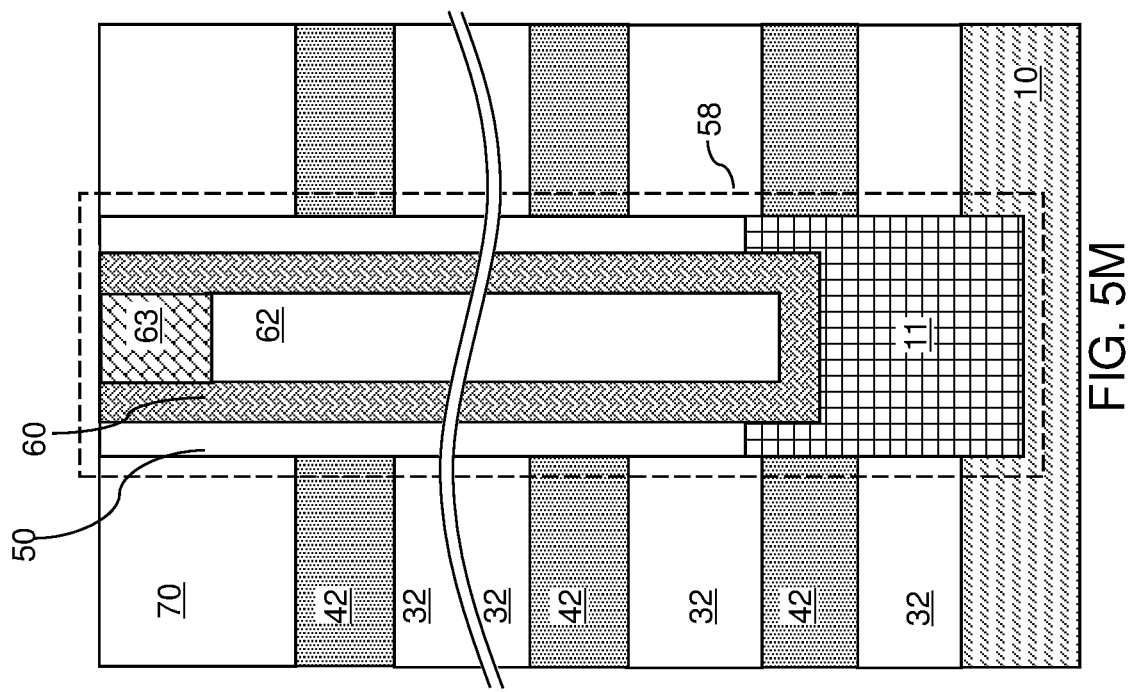

Referring to FIG. 5M, a third alternative configuration of a memory opening fill structure 58 is illustrated, which can be derived from the memory opening fill structure of FIG. 5J by omitting the outer interfacial dielectric layer 51 and the inner interfacial dielectric layer 53.

Figure 6:
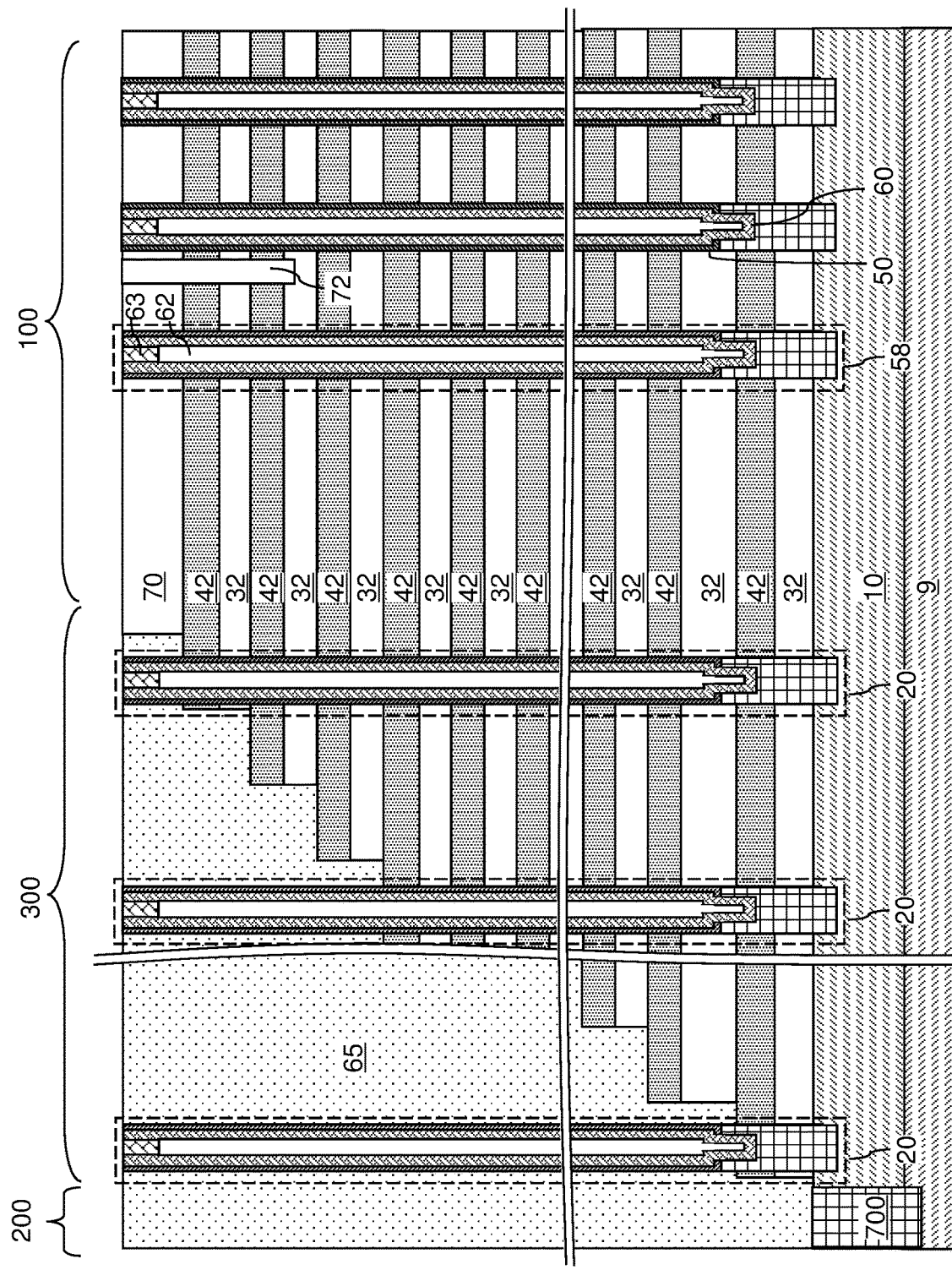
FIG. 6 is a schematic vertical cross-sectional view of the first exemplary structure after formation of memory stack structures and support pillar structures according to the first embodiment of the present disclosure.

Referring to FIG. 6, the first exemplary structure is illustrated after formation of memory opening fill structures 58 and support pillar structure 20 within the memory openings 49 and the support openings 19, respectively. An instance of a memory opening fill structure 58 may be formed within each memory opening 49 of the structure of FIGS. 4A and 4B. An instance of the support pillar structure 20 may be formed within each support opening 19 of the structure of FIGS. 4A and 4B.

The combination of proximal portions of electrically conductive layers that are formed as the spacer material layers, or formed by replacement of the sacrificial material layers 42 with an electrically conductive material, each memory opening fill structure 58 comprises a NAND string including a ferroelectric semiconductor channel layer 60. This configural allows easier lateral scaling of a NAND string compared to prior art structures including a vertical stack of ferroelectric dielectric memory elements and a vertical polysilicon channel.

Typically, conventional ferroelectric three-dimensional NAND memory cells employing a combination of ferroelectric dielectric memory elements and vertical polysilicon channel suffer from short retention time. Major causes of such a short retention time include depolarization field effect during cell operation and leakage current through the ferroelectric dielectric material. Depolarization field is the result of potential drop across a ferroelectric film and band bending in an adjacent polysilicon channel, which lead to charge trapping at the interface between the ferroelectric dielectric material and the polysilicon channel. Thus, charge trapping and gate leakage current can cause charge accumulation at the interface between the ferroelectric dielectric material and the polysilicon channel, and can lead to threshold voltage (Vt) drift and destruction of the memory state in the ferroelectric dielectric memory elements.

According to an aspect of the present disclosure, a ferroelectric semiconductor channel layer 60 is employed as a component of a NAND string. A ferroelectric semiconductor material is employed as the material of a channel through which electrical current flows. The material for the gate dielectric 50 may be selected independent of the material of the ferroelectric semiconductor material of the ferroelectric semiconductor channel layer 60. Thus, a high quality dielectric material, such as silicon oxide, having a high breakdown field may be employed for the gate dielectric 50. Two or more non-volatile polarization states can exist in the ferroelectric semiconductor material of the ferroelectric semiconductor channel layer 60.

According to an aspect of the present disclosure, a high quality amorphous dielectric material providing high breakdown field may be employed for the gate dielectric 50. In other words, the material of the gate dielectric 50 needs not be a crystalline ferroelectric material, and thus, the quality of the gate dielectric 50 (for example, as measured by the breakdown field) can be significantly enhanced in the ferroelectric memory device of the embodiments of the present disclosure compared to prior art ferroelectric memory devices. Charge trapping and leakage current through the gate dielectric 50 of a memory device of the embodiments of the present disclosure can be significantly reduced or potentially eliminated through use of a high quality dielectric material for the gate dielectric 50.

Further, unlike prior art devices, the ferroelectric memory device of the embodiments of the present disclosure does not experience or experiences less depolarization by electric field effect during operation. This is because mobile charges in the ferroelectric semiconductor channel layer 60 may screen the depolarization field across the semiconductor material. As a result, the ferroelectric memory device of the embodiments of the present disclosure can provide better performance and enhanced reliability over conventional ferroelectric memory devices.

In an illustrative example, the ferroelectric semiconductor channel layer 60 may include, and/or may consist essentially of alpha indium selenide. Alpha indium selenide is a two-dimensional ferroelectric semiconducting material with van der Waals gaps between planes of indium and selenium atoms. Generally, alpha indium selenide provides semiconducting properties due to two-dimensional charge carrier transport properties when the thickness of a film is small, such as less than 10 nm. Alpha indium selenide can maintain ferroelectric properties in multilayer structure, and has rhombohedral R3m structure which is non-centrosymmetric and supports polarization that is switchable by an external electrical field.

The memory device of the embodiments of the present disclosure employing a ferroelectric semiconductor channel layer 60 is expected to provide high performance with a large memory window (as measured by operating voltage variations), and low leakage current. In other words, a ferroelectric semiconductor channel layer 60 can provide a high on/off current ratio, which may be greater than $1.0 \times 10^8$. The high electron mobility of the ferroelectric semiconductor channel layer 60 can also provide higher cell current and enhanced performance over prior art ferroelectric memory devices which contain a polysilicon channel.

The optional outer interfacial dielectric layer 51 and the optional inner interfacial dielectric layer 54 may be employed to provide passivation effect at surface portions of the ferroelectric semiconductor channel layer 60. The outer interfacial dielectric layer 51 can provide passivation effect at the interface with the gate dielectric 50. The inner interfacial dielectric layer 53 can provide passivation effect at the interface with the dielectric core 62.

Figure 7A:
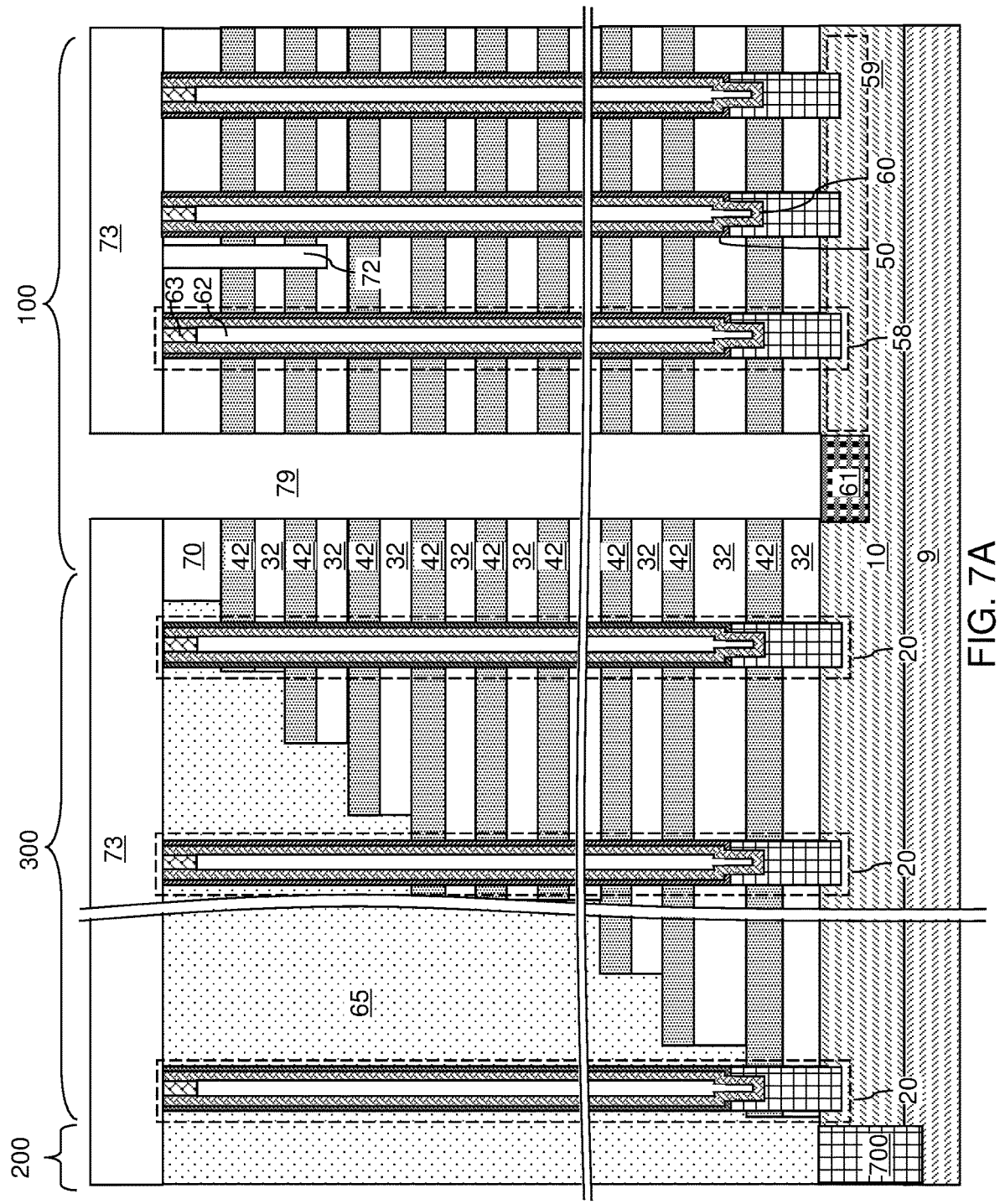
FIG. 7A is a schematic vertical cross-sectional view of the first exemplary structure after formation of backside trenches according to the first embodiment of the present disclosure.
Figure 7B:
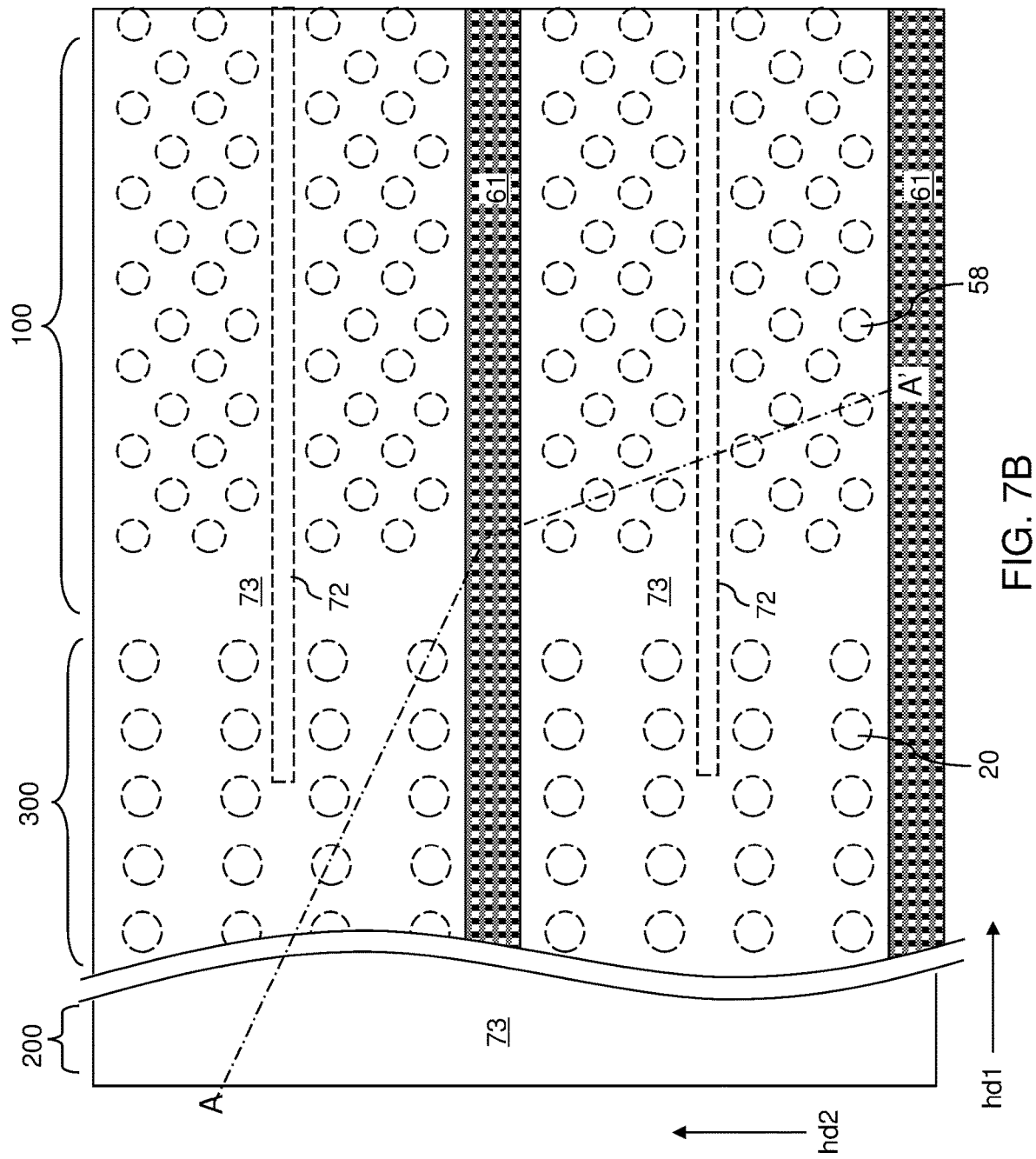
FIG. 7B is a partial see-through top-down view of the first exemplary structure of FIG. 7A. The vertical plane A-A' is the plane of the schematic vertical cross-sectional view of FIG. 7A.
Figure 7C:
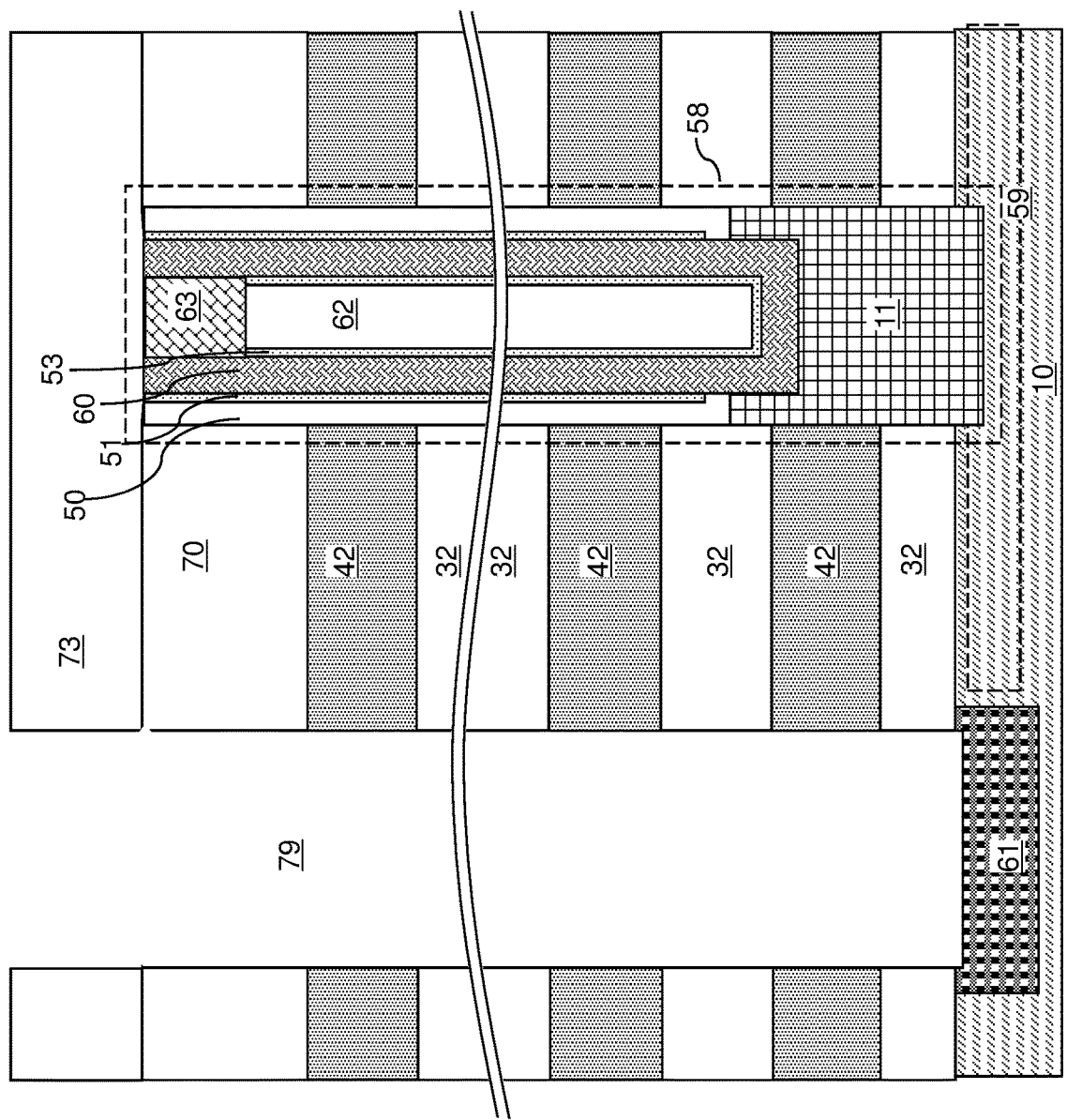
FIG. 7C is a magnified view of a region of the first exemplary structure of FIG. 7A.

Referring to FIGS. 7A-7C, a contact level dielectric layer 73 may be formed over the alternating stack (32, 42) of insulating layer 32 and sacrificial material layers 42, and over the memory opening fill structures 58 and the support pillar structures 20. The contact level dielectric layer 73 includes a dielectric material that is different from the dielectric material of the sacrificial material layers 42. For example, the contact level dielectric layer 73 may include silicon oxide. The contact level dielectric layer 73 may have a thickness in a range from 50 nm to 500 nm, although lesser and greater thicknesses may also be employed.

A photoresist layer (not shown) may be applied over the contact level dielectric layer 73, and is lithographically patterned to form openings in areas between clusters of memory opening fill structures 58. The pattern in the photoresist layer may be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the staircase region 300.

In one embodiment, the backside trenches 79 may laterally extend along a first horizontal direction hd1 and may be laterally spaced apart from each other along a second horizontal direction hd2 that is perpendicular to the first horizontal direction hd1. The memory opening fill structures 58 may be arranged in rows that extend along the first horizontal direction hd1. The drain-select-level isolation structures 72 may laterally extend along the first horizontal direction hd1. Each backside trench 79 may have a uniform width that is invariant along the lengthwise direction (i.e., along the first horizontal direction hd1). Each drain-select-level isolation structure 72 may have a uniform vertical cross-sectional profile along vertical planes that are perpendicular to the first horizontal direction hd1 that is invariant with translation along the first horizontal direction hd1. Multiple rows of memory opening fill structures 58 may be located between a neighboring pair of a backside trench 79 and a drain-select-level isolation structure 72, or between a neighboring pair of drain-select-level isolation structures 72. In one embodiment, the backside trenches 79 may include a source contact opening in which a source contact via structure may be subsequently formed. The photoresist layer may be removed, for example, by ashing.

A source region 61 may be formed at a surface portion of the semiconductor material layer 10 under each backside cavity 79' by implantation of electrical dopants into physically exposed surface portions of the semiconductor material layer 10. An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 contacts the source region 61 and the plurality of pedestal channel portions 11.

Figure 8A:
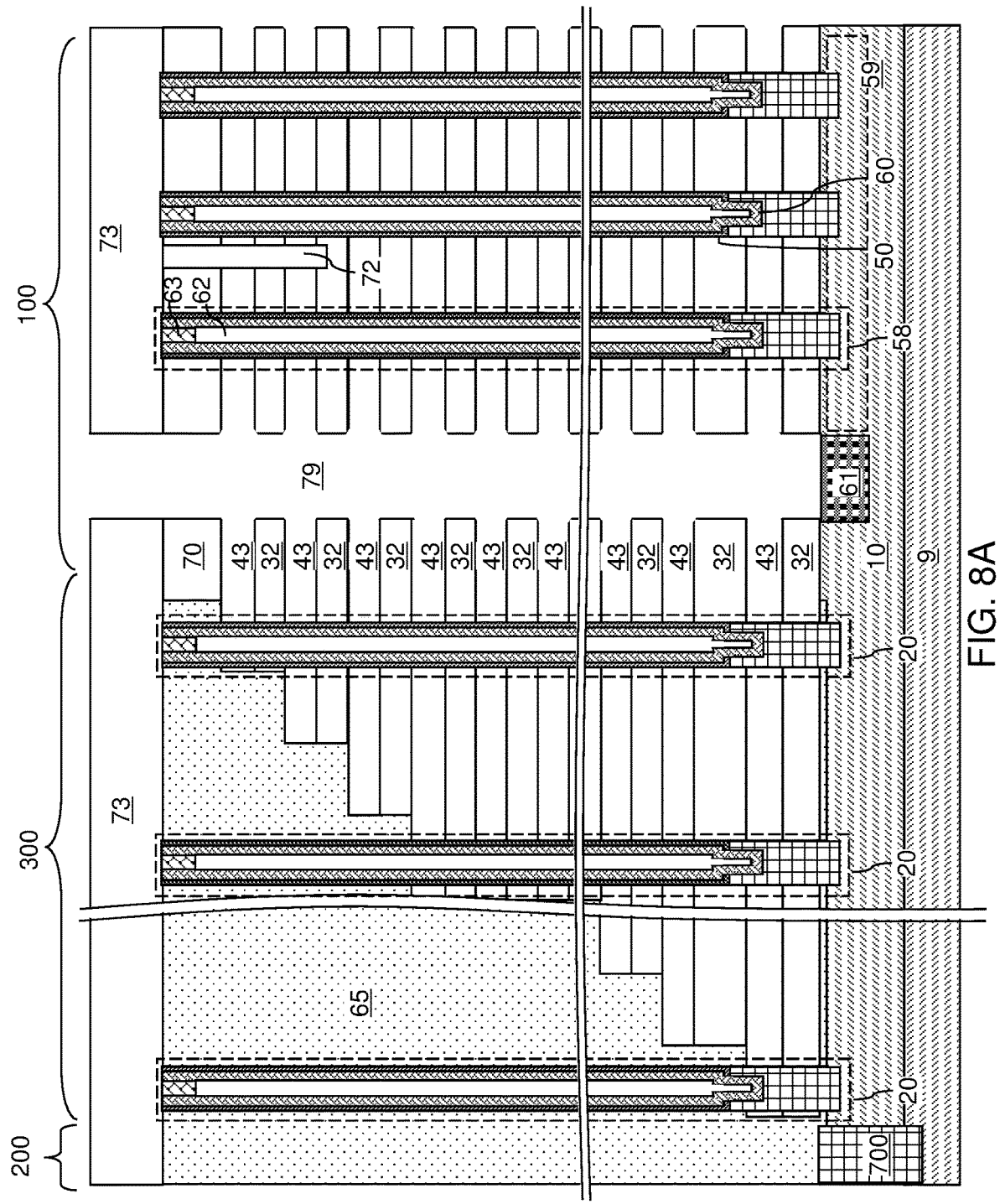
FIG. 8A is a schematic vertical cross-sectional view of the first exemplary structure after formation of backside recesses according to the first embodiment of the present disclosure.
Figure 8B:
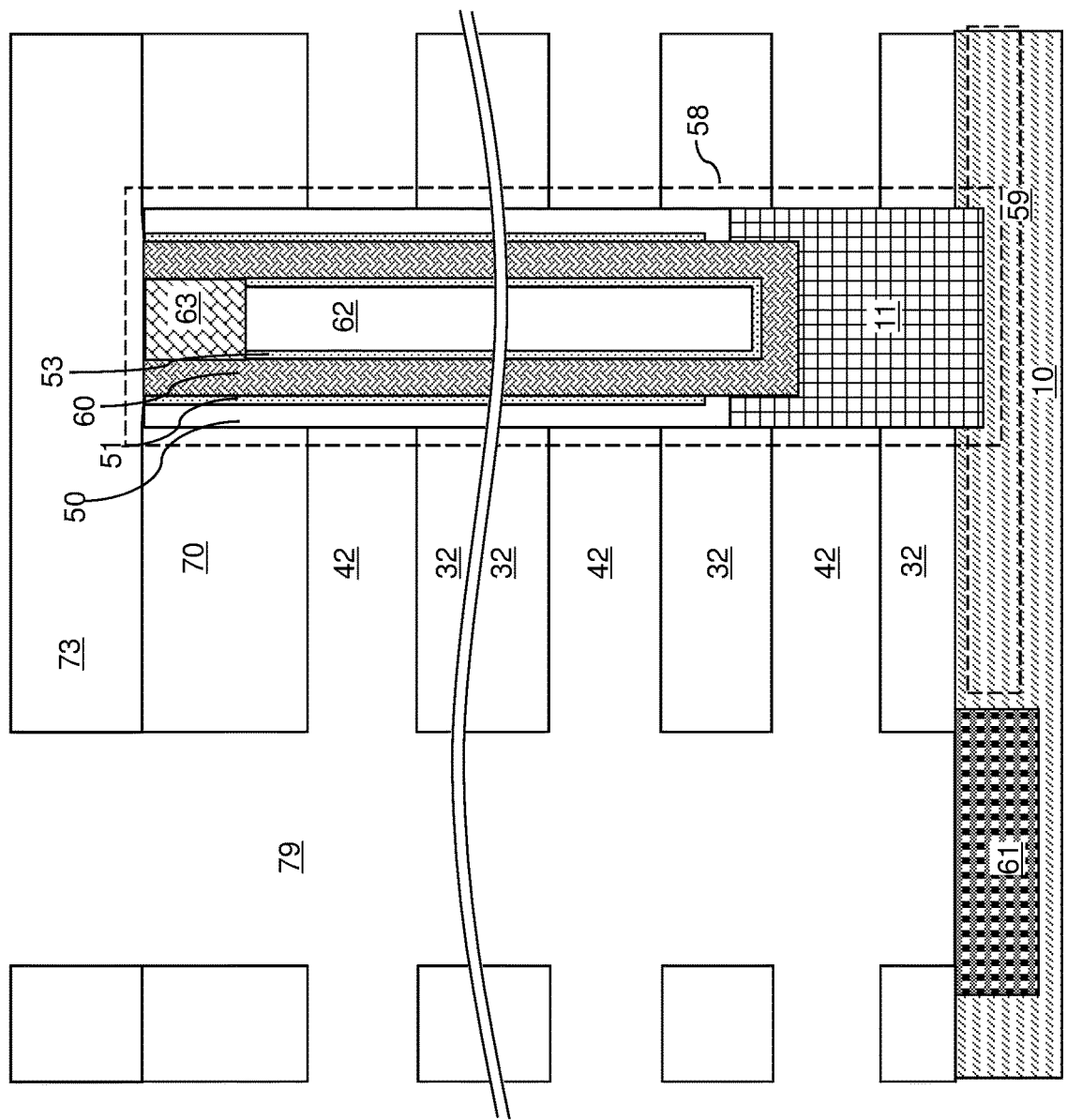
FIG. 8B is a magnified view of a region of the first exemplary structure of FIG. 8A.

Referring to FIGS. 8A and 8B, an etchant that selectively etches the second material of the sacrificial material layers 42 with respect to the first material of the insulating layers 32 may be introduced into the backside trenches 79, for example, employing an etch process. Backside recesses 43 are formed in volumes from which the sacrificial material layers 42 are removed. The removal of the second material of the sacrificial material layers 42 may be selective to the first material of the insulating layers 32, the material of the retro-stepped dielectric material portion 65, the semiconductor material of the semiconductor material layer 10, and the material of the gate dielectric 50. In one embodiment, the sacrificial material layers 42 may include silicon nitride, and the materials of the insulating layers 32 and the retro-stepped dielectric material portion 65 may be selected from silicon oxide and dielectric metal oxides.

The etch process that removes the second material selective to the insulating layers 32 and the gate dielectric 50 may be a wet etch process employing a wet etch solution, or may be a gas phase (dry) etch process in which the etchant is introduced in a vapor phase into the backside trenches 79. For example, if the sacrificial material layers 42 include silicon nitride, the etch process may be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory opening fill structures 58 provide structural support while the backside recesses 43 are present within volumes previously occupied by the sacrificial material layers 42.

Each backside recess 43 may be a laterally extending cavity having a lateral dimension that is greater than the vertical extent of the cavity. In other words, the lateral dimension of each backside recess 43 may be greater than the height of the backside recess 43. A plurality of backside recesses 43 may be formed in the volumes from which the second material of the sacrificial material layers 42 is removed. The memory openings in which the memory opening fill structures 58 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 may define a space for receiving a respective word line of the array of monolithic three-dimensional NAND strings.

Each of the plurality of backside recesses 43 may extend substantially parallel to the top surface of the substrate (9, 10). A backside recess 43 may be vertically bounded by a top surface of an underlying insulating layer 32 and a bottom surface of an overlying insulating layer 32. In one embodiment, each backside recess 43 may have a uniform height throughout.

Figure 9:
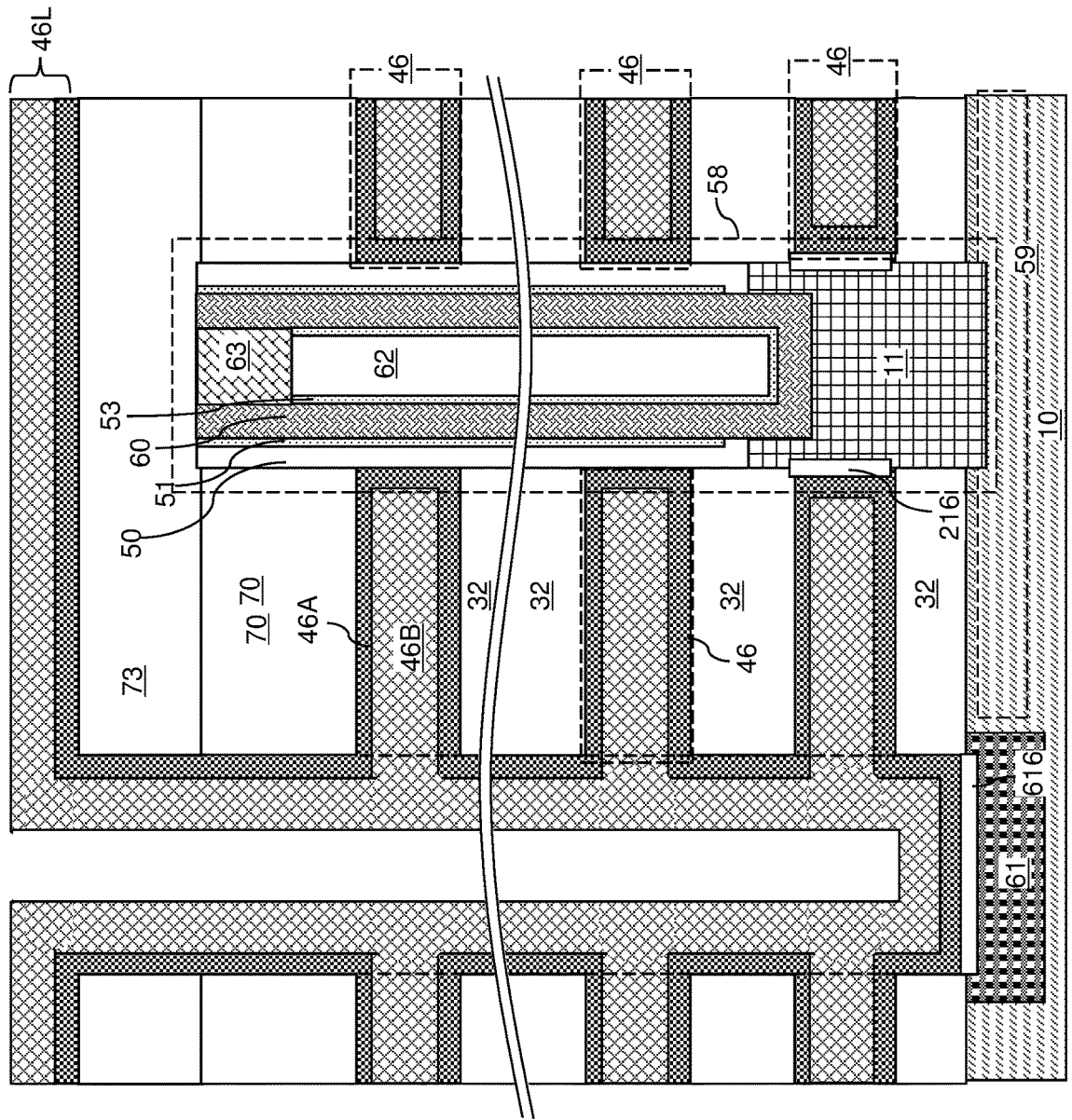
FIG. 9 is a magnified view of a region of the first exemplary structure after formation of electrically conductive layers according to the first embodiment of the present disclosure.

Referring to FIG. 9, physically exposed surface portions of the optional pedestal channel portions 11 and the semiconductor material layer 10 may be converted into dielectric material portions by thermal conversion and/or plasma conversion of the semiconductor materials into dielectric materials. For example, thermal conversion and/or plasma conversion may be employed to convert a surface portion of each pedestal channel portion 11 into a tubular dielectric spacer 216, and to convert each physically exposed surface portion of the semiconductor material layer 10 into a planar dielectric portion 616. In one embodiment, each tubular dielectric spacer 216 may be topologically homeomorphic to a torus, i.e., generally ring-shaped. As used herein, an element is topologically homeomorphic to a torus if the shape of the element may be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 may include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 may include a dielectric oxide, a dielectric nitride, or a dielectric oxynitride of the semiconductor material of the semiconductor material layer 10.

A metallic barrier layer 46A may be deposited in the backside recesses 43. The metallic barrier layer 46A includes an electrically conductive metallic material that may function as a diffusion barrier layer and/or adhesion promotion layer for a metallic fill material to be subsequently deposited. The metallic barrier layer 46A may include a conductive metallic nitride material such as TiN, TaN, WN, or a stack thereof, or may include a conductive metallic carbide material such as TiC, TaC, WC, or a stack thereof. In one embodiment, the metallic barrier layer 46A may be deposited by a conformal deposition process such as chemical vapor deposition (CVD) or atomic layer deposition (ALD). The thickness of the metallic barrier layer 46A may be in a range from 2 nm to 8 nm, such as from 3 nm to 6 nm, although lesser and greater thicknesses may also be employed. In one embodiment, the metallic barrier layer 46A may consist essentially of a conductive metal nitride such as TiN.

A metal fill material is deposited in the plurality of backside recesses 43, on the sidewalls of the at least one the backside trench 79, and over the top surface of the contact level dielectric layer 73 to form a metallic fill material layer 46B. The metallic fill material may be deposited by a conformal deposition method, which may be, for example, chemical vapor deposition (CVD), atomic layer deposition (ALD), electroless plating, electroplating, or a combination thereof. In one embodiment, the metallic fill material layer 46B may consist essentially of at least one elemental metal. The at least one elemental metal of the metallic fill material layer 46B may be selected, for example, from tungsten, cobalt, ruthenium, titanium, and tantalum. In one embodiment, the metallic fill material layer 46B may consist essentially of a single elemental metal. In one embodiment, the metallic fill material layer 46B may be deposited employing a fluorine-containing precursor gas such as $WF_6$. In one embodiment, the metallic fill material layer 46B may be a tungsten layer including a residual level of fluorine atoms as impurities. The metallic fill material layer 46B is spaced from the insulating layers 32 and the memory opening fill structures 58 by the metallic barrier layer 46A, which is a metallic barrier layer that blocks diffusion of fluorine atoms therethrough.

A plurality of electrically conductive layers 46 may be formed in the plurality of backside recesses 43, and a continuous electrically conductive material layer 46L may be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact level dielectric layer 73.

Each sacrificial material layer 42 may be replaced with an electrically conductive layer 46. A backside cavity 79' is present in the portion of each backside trench 79 that is not filled with the continuous electrically conductive material layer 46L. A tubular dielectric spacer 216 laterally surrounds a pedestal channel portion 11. A bottommost electrically conductive layer 46 laterally surrounds each tubular dielectric spacer 216 upon formation of the electrically conductive layers 46.

Figure 10A:
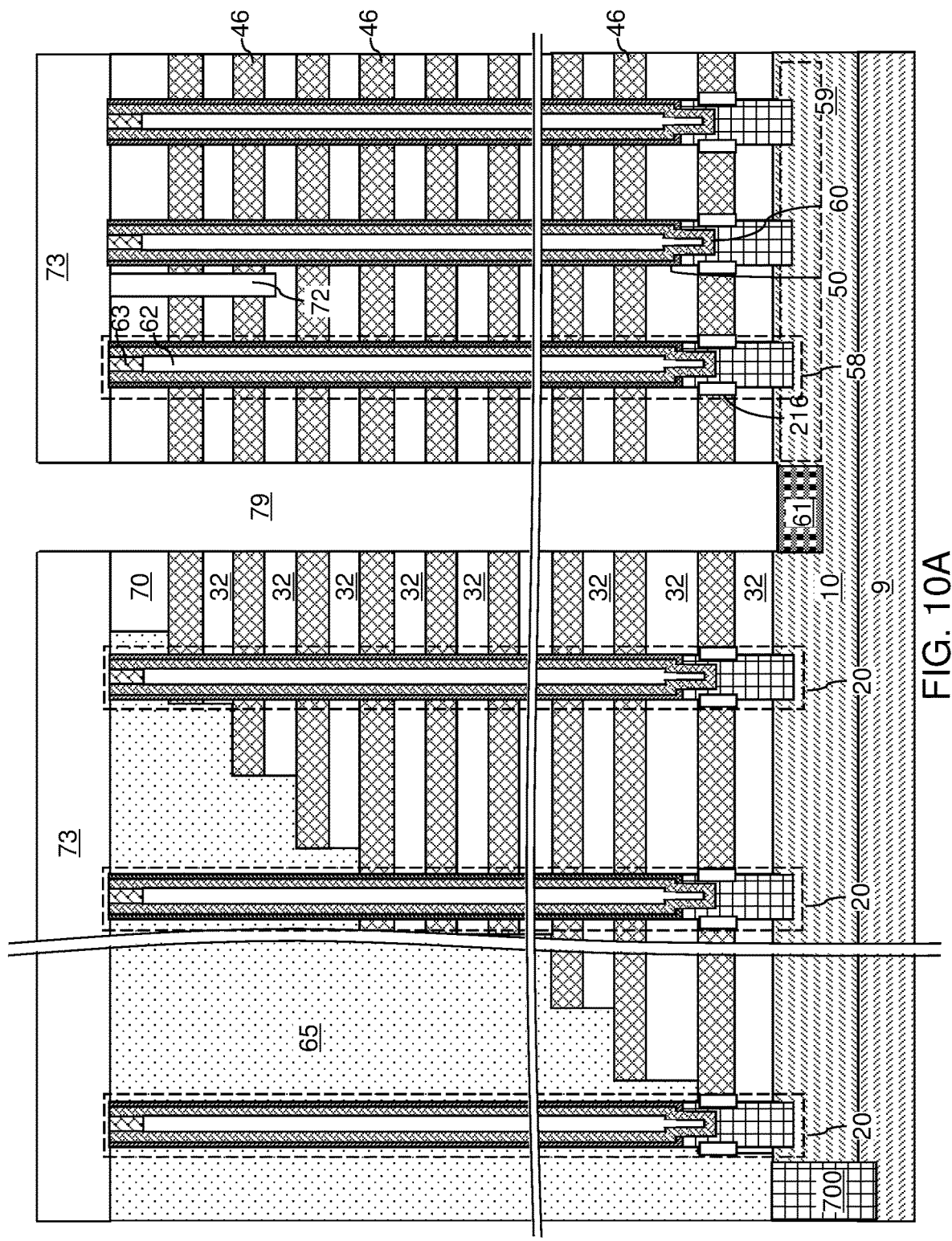
FIG. 10A is a schematic vertical cross-sectional view of the first exemplary structure after removal of a deposited conductive material from within the backside trench according to the first embodiment of the present disclosure.
Figure 10B:
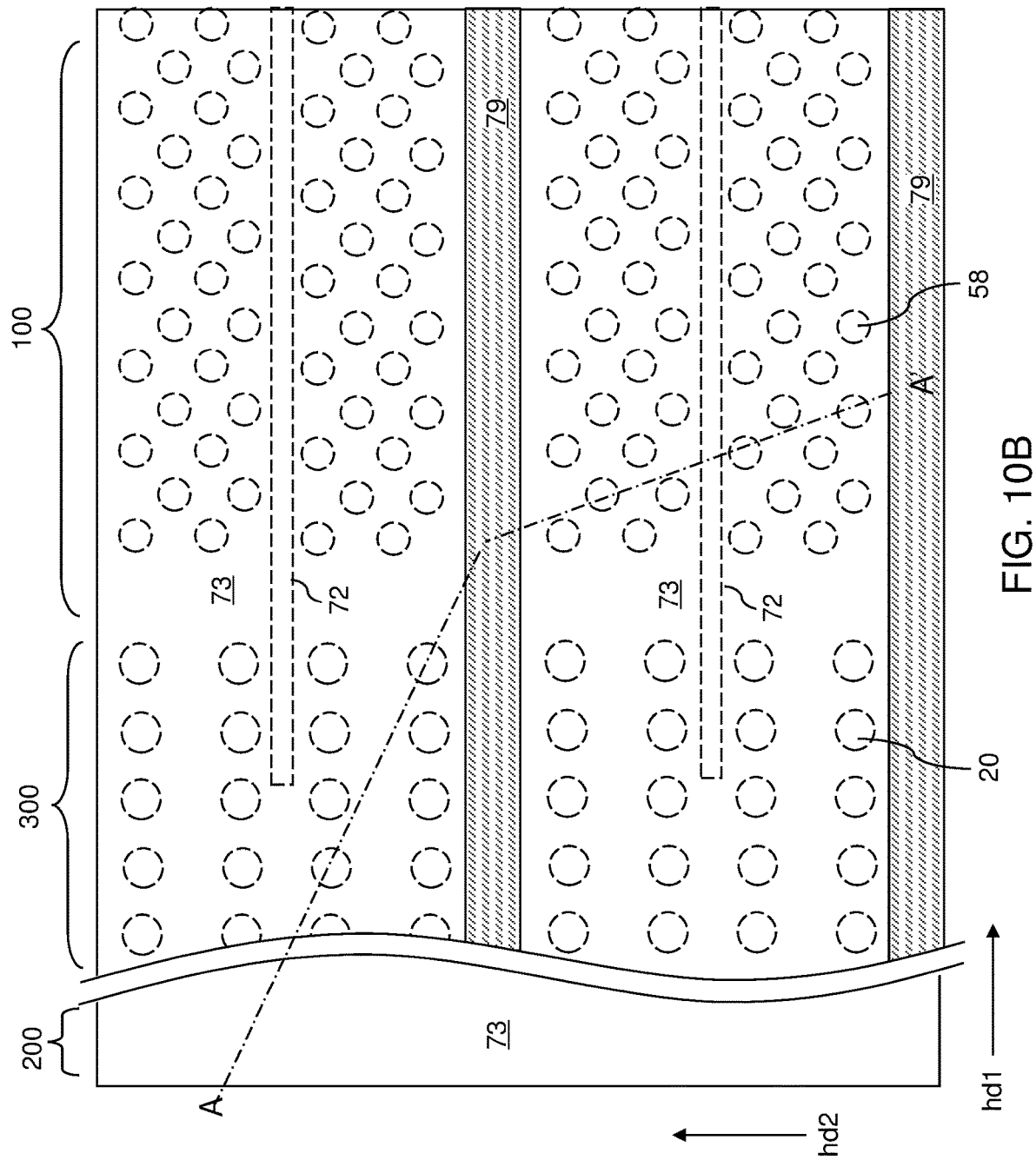
FIG. 10B is a partial see-through top-down view of the first exemplary structure of FIG. 10A. The vertical plane A-A' is the plane of the schematic vertical cross-sectional view of FIG. 10A.
Figure 10C:
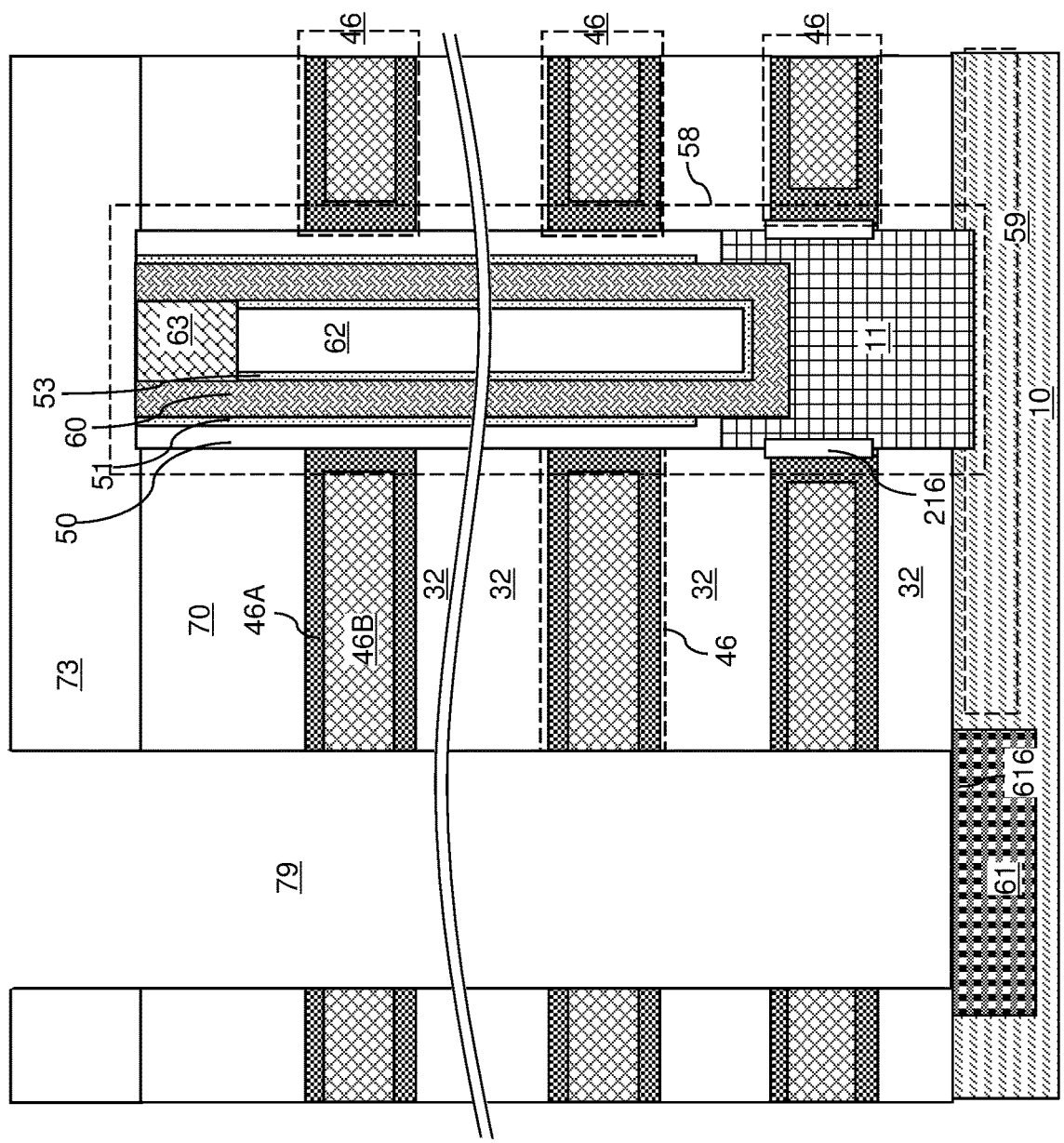
FIG. 10C is a magnified view of a region of the first exemplary structure of FIG. 10A.

Referring to FIGS. 10A-10C, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 may be a conductive line structure. Thus, the sacrificial material layers 42 are replaced with the electrically conductive layers 46.

Each electrically conductive layer 46 may function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory opening fill structures 58. In other words, each electrically conductive layer 46 may be a word line that functions as a common control gate electrode for the plurality of vertical memory devices. The planar dielectric portions 616 may be removed during removal of the continuous electrically conductive material layer 46L. A backside cavity 79' is present within each backside trench 79.

Figure 11:
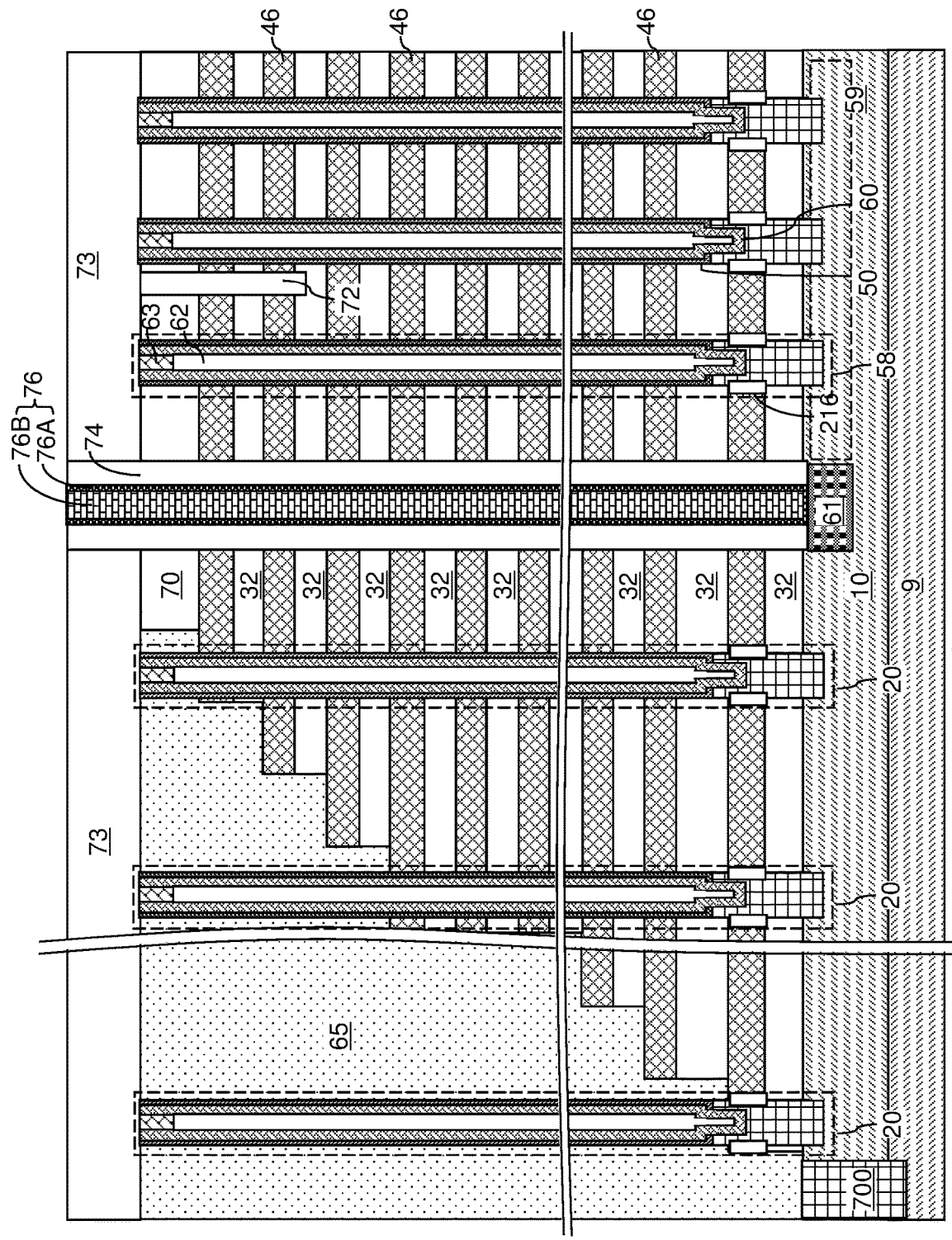
FIG. 11 is a schematic vertical cross-sectional view of the first exemplary structure after formation of an insulating spacer and a backside contact structure according to the first embodiment of the present disclosure.

Referring to FIG. 11, an insulating material layer may be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer may include silicon oxide. The insulating material layer may be formed, for example, by low pressure chemical vapor deposition (LPCVD) or atomic layer deposition (ALD). The thickness of the insulating material layer may be in a range from 1.5 nm to 60 nm, although lesser and greater thicknesses may also be employed.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 may be physically exposed at the bottom of each backside trench 79.

A bottommost electrically conductive layer 46 provided upon formation of the electrically conductive layers 46 within the alternating stack (32, 46) may comprise a select gate electrode for the field effect transistors. Each source region 61 is formed in an upper portion of the substrate (9, 10).

A backside contact via structure 76 may be formed within each backside cavity 79'. Each contact via structure 76 may fill a respective backside cavity 79'. The contact via structures 76 may be formed by depositing at least one conductive material in the remaining unfilled volume (i.e., the backside cavity 79') of the backside trench 79. For example, the at least one conductive material may include a conductive liner 76A and a conductive fill material portion 76B. The conductive liner 76A may include a conductive metallic liner such as TiN, TaN, WN, TiC, TaC, WC, an alloy thereof, or a stack thereof. The thickness of the conductive liner 76A may be in a range from 3 nm to 30 nm, although lesser and greater thicknesses may also be employed. The conductive fill material portion 76B may include a metal or a metallic alloy. For example, the conductive fill material portion 76B may include W, Cu, Al, Co, Ru, Ni, an alloy thereof, or a stack thereof.

The at least one conductive material may be planarized employing the contact level dielectric layer 73 overlying the alternating stack (32, 46) as a stopping layer. If chemical mechanical planarization (CMP) process is employed, the contact level dielectric layer 73 may be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61.

Figure 12A:
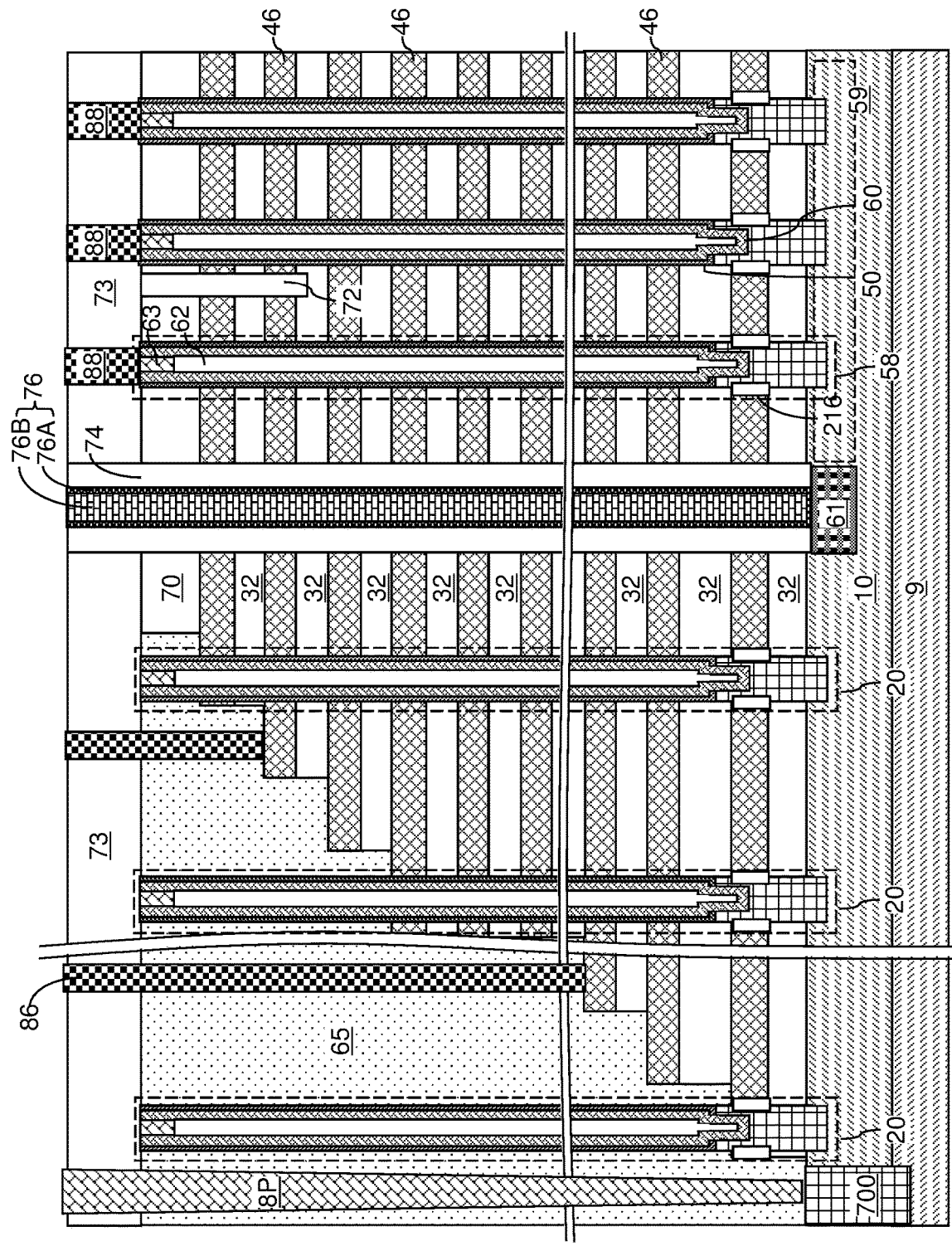
FIG. 12A is a schematic vertical cross-sectional view of the first exemplary structure after formation of additional contact via structures according to the first embodiment of the present disclosure.
Figure 12B:
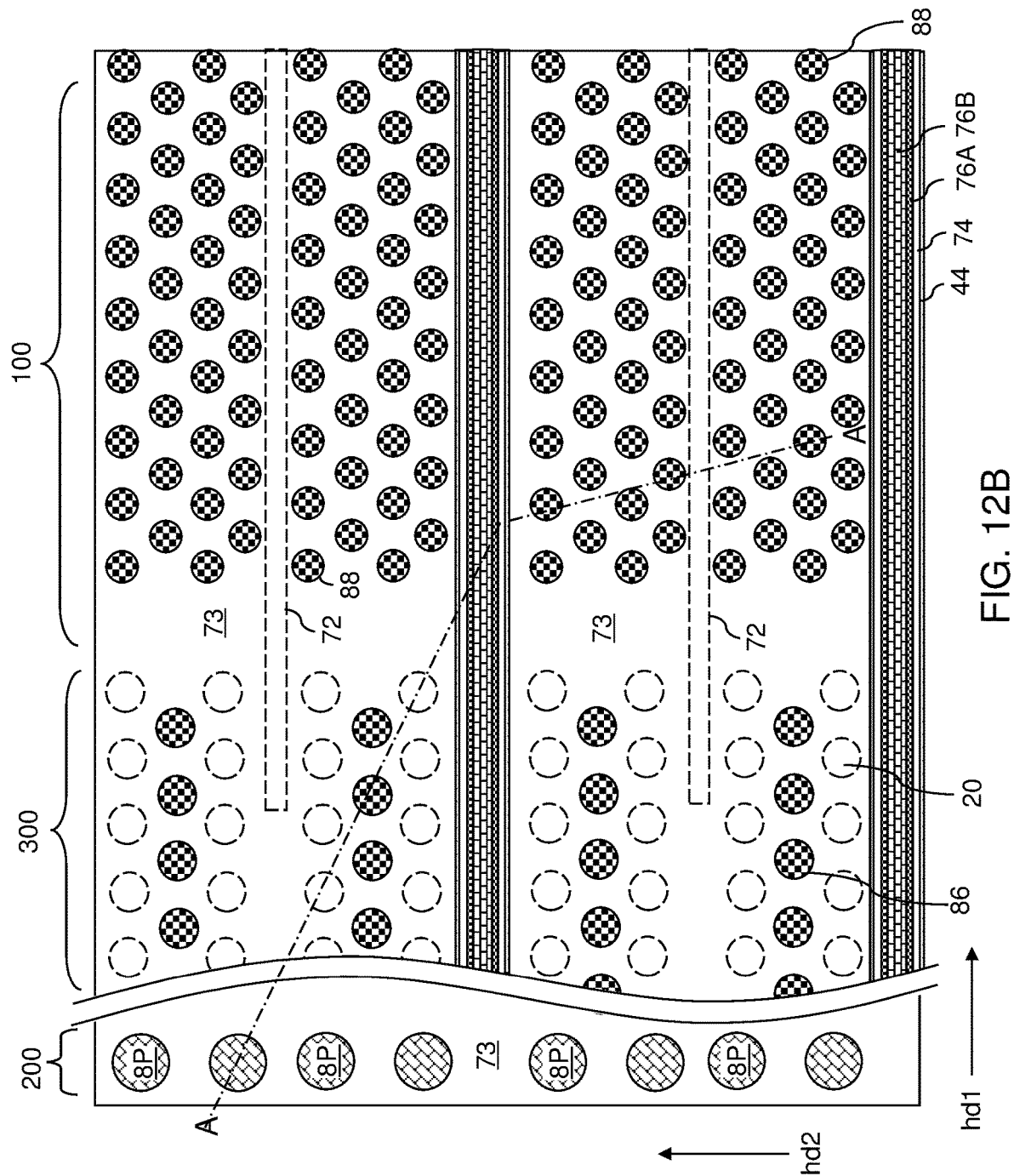
FIG. 12B is a top-down view of the first exemplary structure of FIG. 12A. The vertical plane A-A' is the plane of the schematic vertical cross-sectional view of FIG. 12A.
Figure 12C:
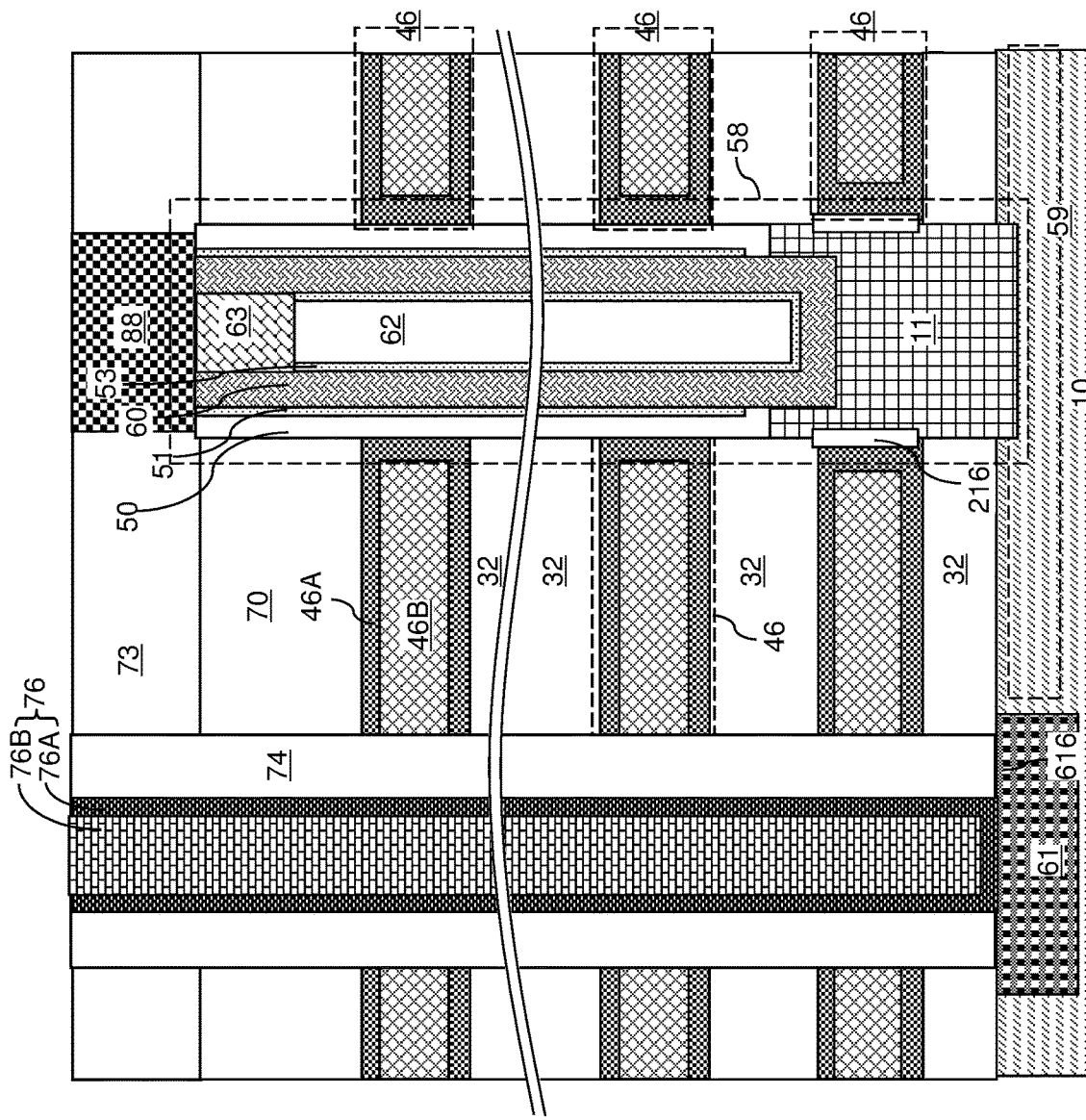
FIG. 12C is a magnified view of a region of the first exemplary structure of FIG. 12A.

Referring to FIGS. 12A-12C, additional contact via structures (88, 86, 8P) may be formed through the contact level dielectric layer 73, and optionally through the retro-stepped dielectric material portion 65. For example, drain contact via structures 88 may be formed through the contact level dielectric layer 73 on each drain region 63. Word line contact via structures 86 may be formed on the electrically conductive layers 46 through the contact level dielectric layer 73, and through the retro-stepped dielectric material portion 65. Peripheral device contact via structures 8P may be formed through the retro-stepped dielectric material portion 65 directly on respective nodes of the at least one semiconductor device 700, which may include a peripheral circuit for operating a three-dimensional memory array. In one alternative embodiment, the peripheral devices may be formed on a separate substrate and then bonded to the memory devices. In that case, the peripheral device contact via structures 8P may be omitted. In another alternative embodiment, the peripheral devices may be formed underneath the alternating stack (32, 46).

Figure 13A:
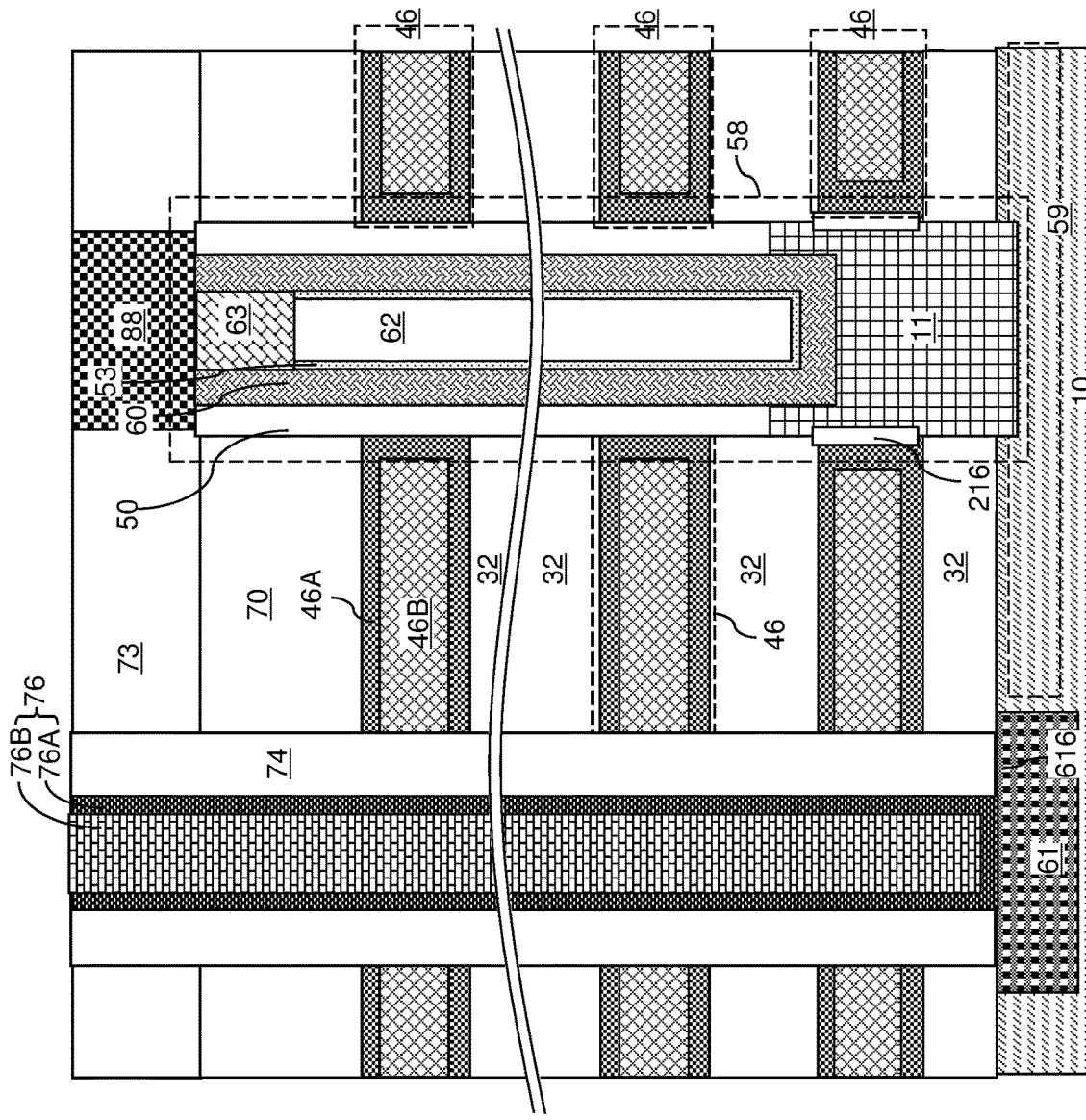
FIGS. 13A-13C are magnified views of a region including a memory opening fill structure and a backside trench of alternative configurations of the first exemplary structure.

Referring to FIG. 13A, a first alternative configuration of a memory opening fill structure 58 is illustrated, which can be derived from the memory opening fill structure of FIGS. 12A-12C by omitting the outer interfacial dielectric layer 51.

Figure 13B:
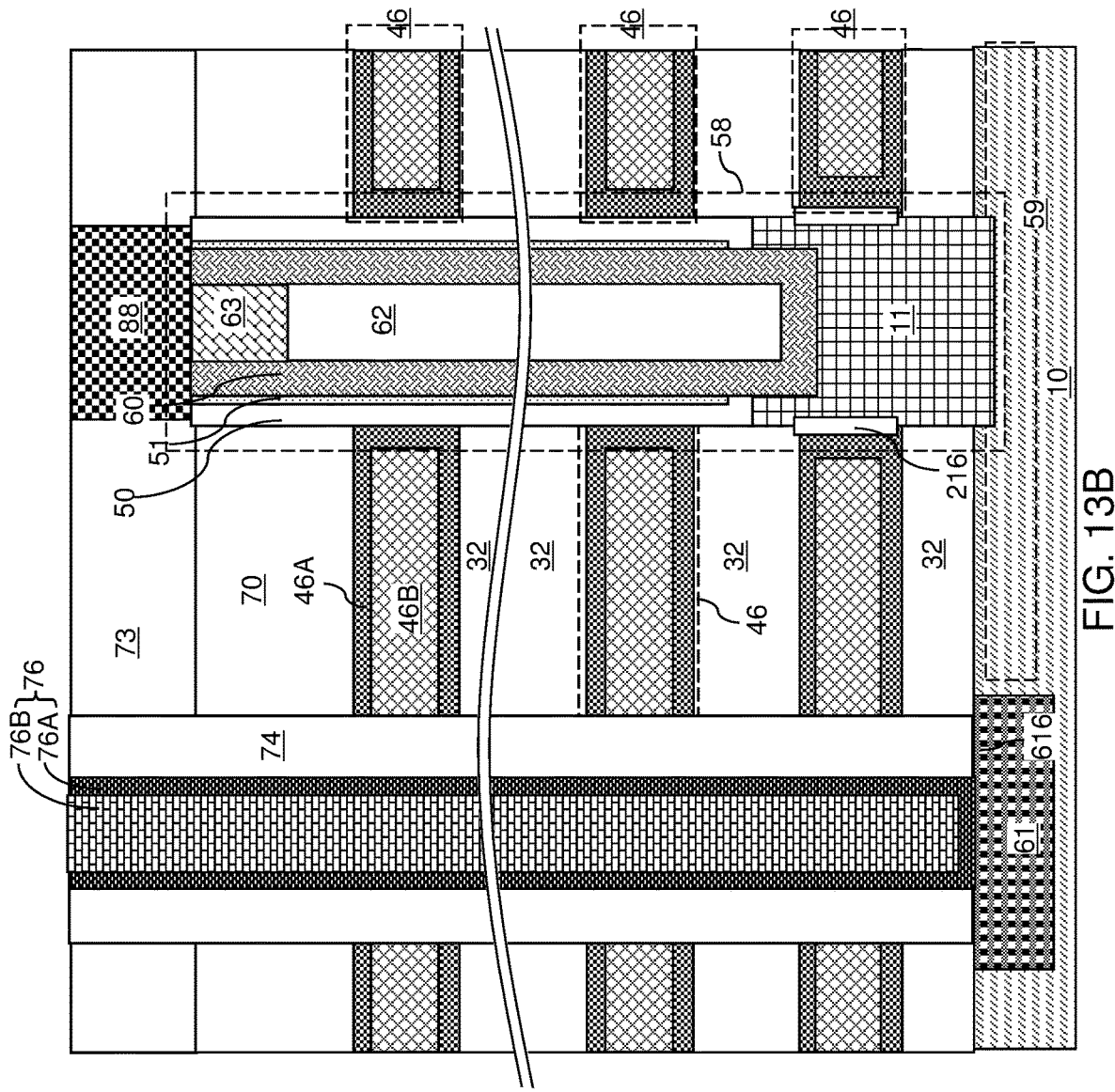

Referring to FIG. 13B, a second alternative configuration of a memory opening fill structure 58 is illustrated, which can be derived from the memory opening fill structure of FIGS. 12A-12C by omitting the inner interfacial dielectric layer 53.

Figure 13C:
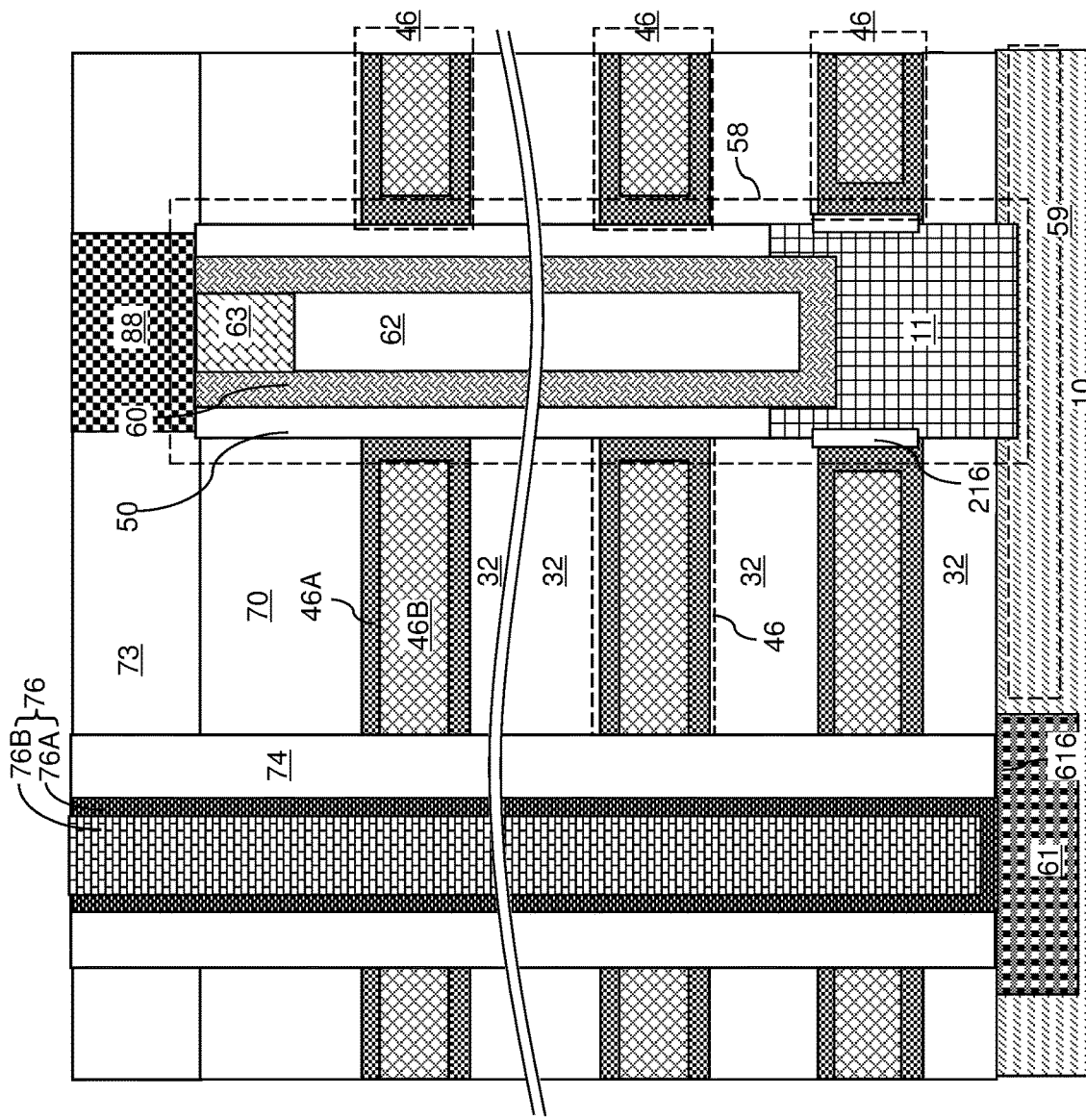

Referring to FIG. 13C, a third alternative configuration of a memory opening fill structure 58 is illustrated, which can be derived from the memory opening fill structure of FIGS. 12A-12C by omitting the outer interfacial dielectric layer 51 and the inner interfacial dielectric layer 53.

Figure 14:
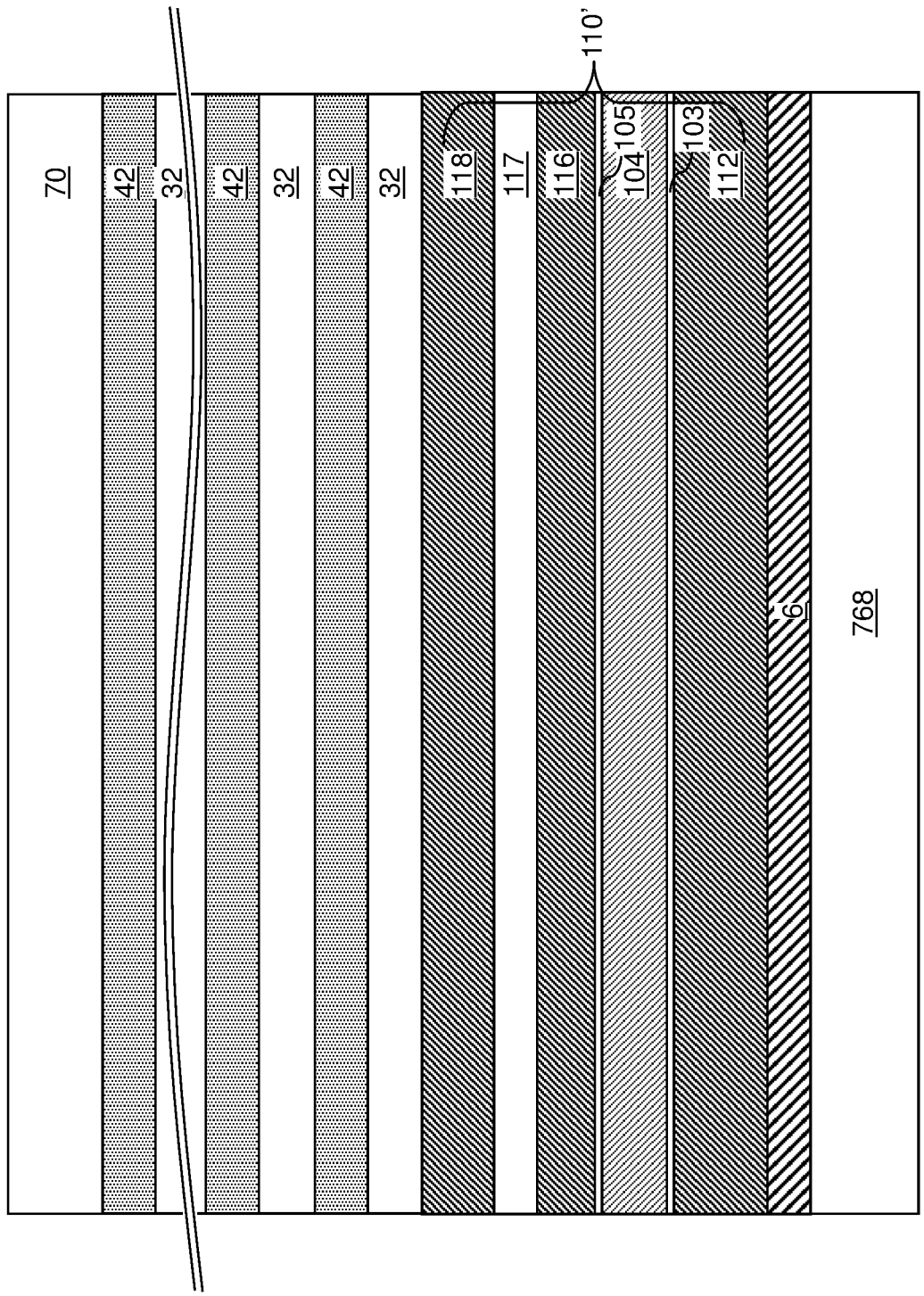
FIG. 14 is a vertical cross-sectional view of a second exemplary structure according to a second embodiment of the present disclosure.

Referring to FIG. 14, a second exemplary structure according to a second embodiment of the present disclosure may be derived from the first exemplary structure illustrated in FIG. 2 by employing a structure including at least one dielectric material layer 768, an optional conductive plate layer 6, and in-process source-level material layers 110' in lieu of the substrate (9, 10) and the at least one semiconductor device 700. Optionally, an underlying semiconductor substrate (not shown), underlying semiconductor devices (not shown) such as field effect transistors, and underlying metal interconnect structures (not shown) embedded in the at least one dielectric material layer 768 may be employed. In this case, the underlying semiconductor devices may include a peripheral circuit such as sense amplifiers, word line drivers, power supply circuits, or other peripheral devices that may be employed to control operation of a three-dimensional memory array to be subsequently formed through the alternating stack (32, 42).

The optional conductive plate layer 6, if present, provides a high conductivity conduction path for electrical current that flows into, or out of, the in-process source-level material layers 110'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses may also be used.

The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level semiconductor layer 112 and the upper source-level semiconductor layer 116 may include a doped semiconductor material such as doped polysilicon or doped amorphous silicon. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped polysilicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The in-process source-level material layers 110' may be formed directly above a subset of the semiconductor devices on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional conductive plate layer 6 and the in-process source-level material layers 110' may be patterned to provide openings in areas in which through-memory-level contact via structures and through-dielectric contact via structures are to be subsequently formed. Patterned portions of the stack of the conductive plate layer 6 and the in-process source-level material layers 110' are present in each memory array region 100 in which three-dimensional memory stack structures are to be subsequently formed.

The optional conductive plate layer 6 and the in-process source-level material layers 110' may be patterned such that an opening extends over a staircase region 300 in which contact via structures contacting word line electrically conductive layers are to be subsequently formed. In one embodiment, additional openings in the optional conductive plate layer 6 and the in-process source-level material layers 110' may be formed within the area of a memory array region 100, in which a three-dimensional memory array including memory stack structures is to be subsequently formed.

Figure 15:
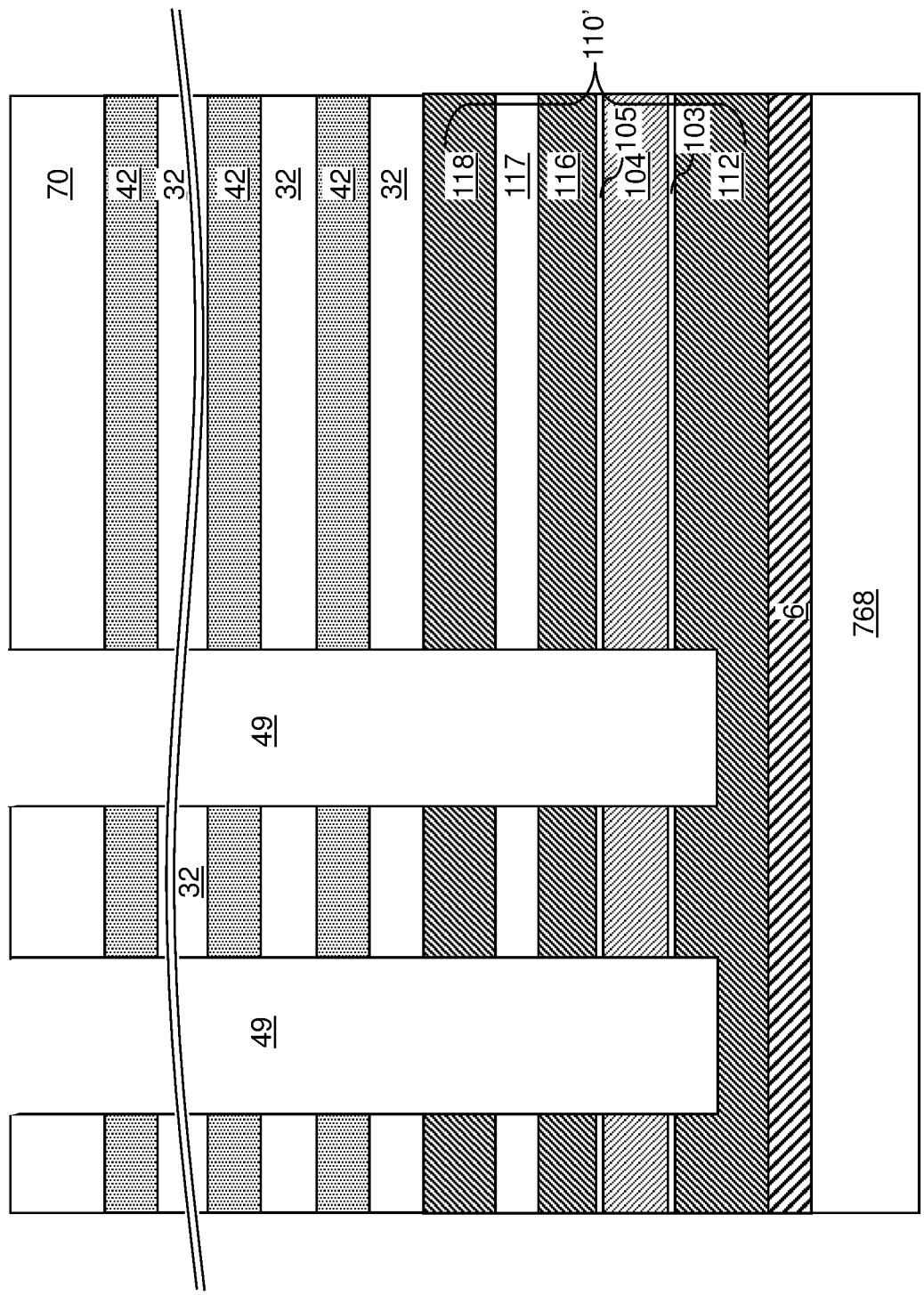
FIG. 15 is a vertical cross-sectional view of the second exemplary structure after formation of memory openings according to the second embodiment of the present disclosure.

Referring to FIG. 15, the processing steps of FIGS. 3, 4A, and 4B can be performed to form memory openings 49 and support openings (not illustrated).

Figure 16:
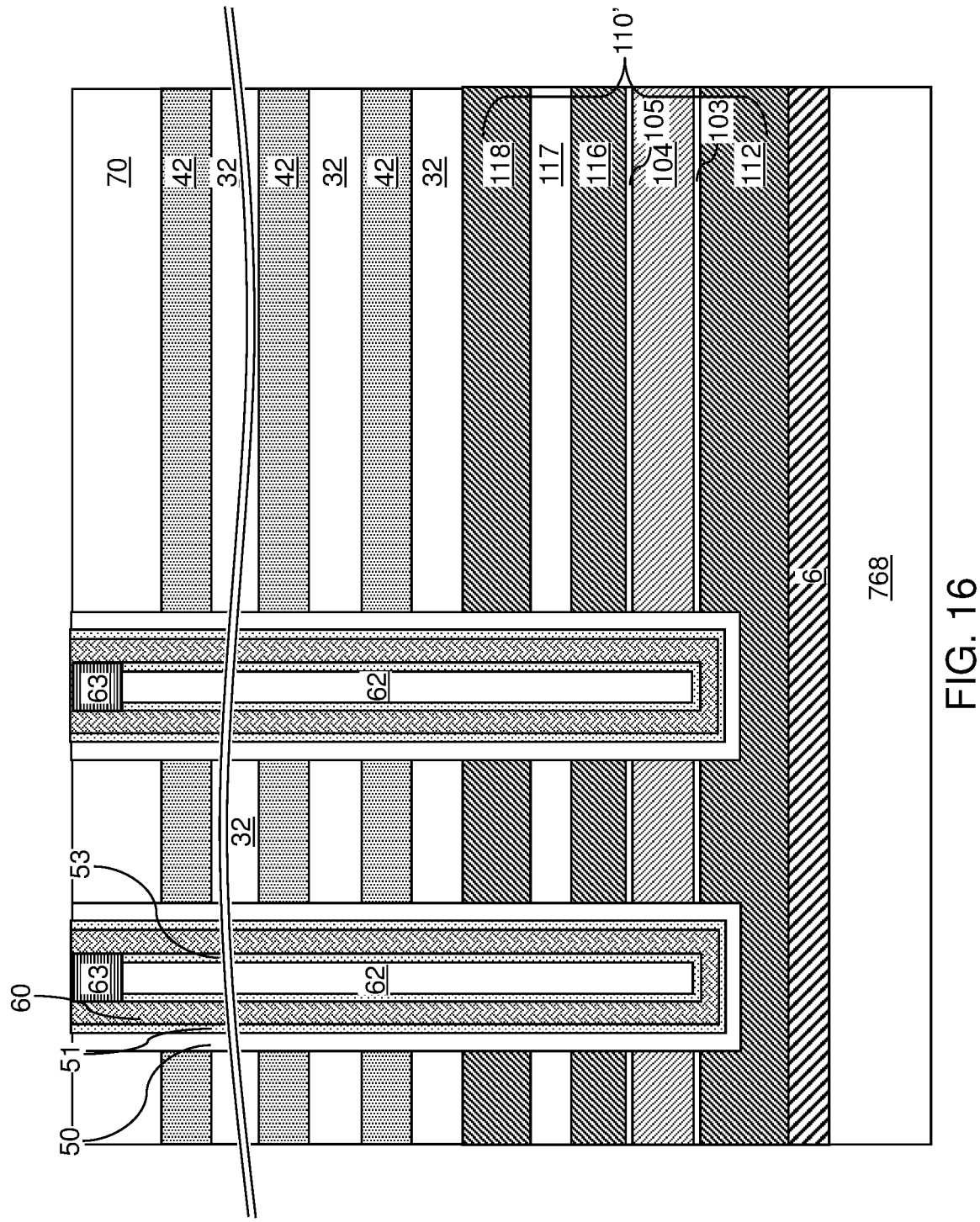
FIG. 16 is a vertical cross-sectional view of the second exemplary structure after formation of memory opening fill structures according to the second embodiment of the present disclosure.

Referring to FIG. 16, the processing steps of FIGS. 5C, 5D, and 5H-5J may be performed to form a memory opening fill structure 58. The processing steps of FIGS. 5B, 5E, 5F, and 5G may be omitted. Optionally, the outer interfacial dielectric layer 51 and/or the inner interfacial dielectric layer 53 may be omitted.

Figure 17:
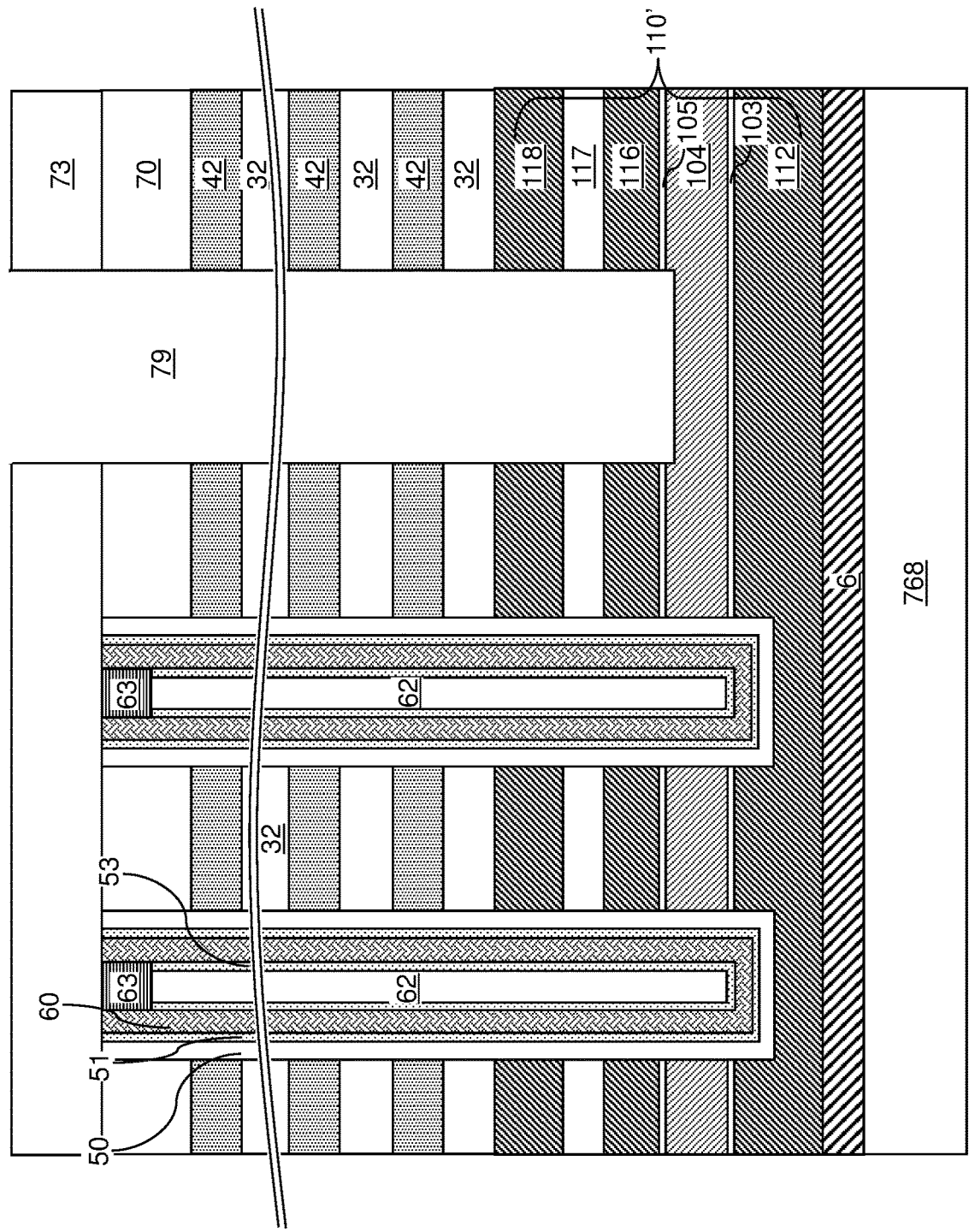
FIG. 17 is a vertical cross-sectional view of the second exemplary structure after formation of a backside trench according to the second embodiment of the present disclosure.

Referring to FIG. 17, the processing steps of FIGS. 7A-7C may be performed to form a contact-level dielectric layer 73 and backside trenches 79. In this case, the bottom surface of each backside trench 79 may reach the source-level sacrificial layer 104.

Figure 18:
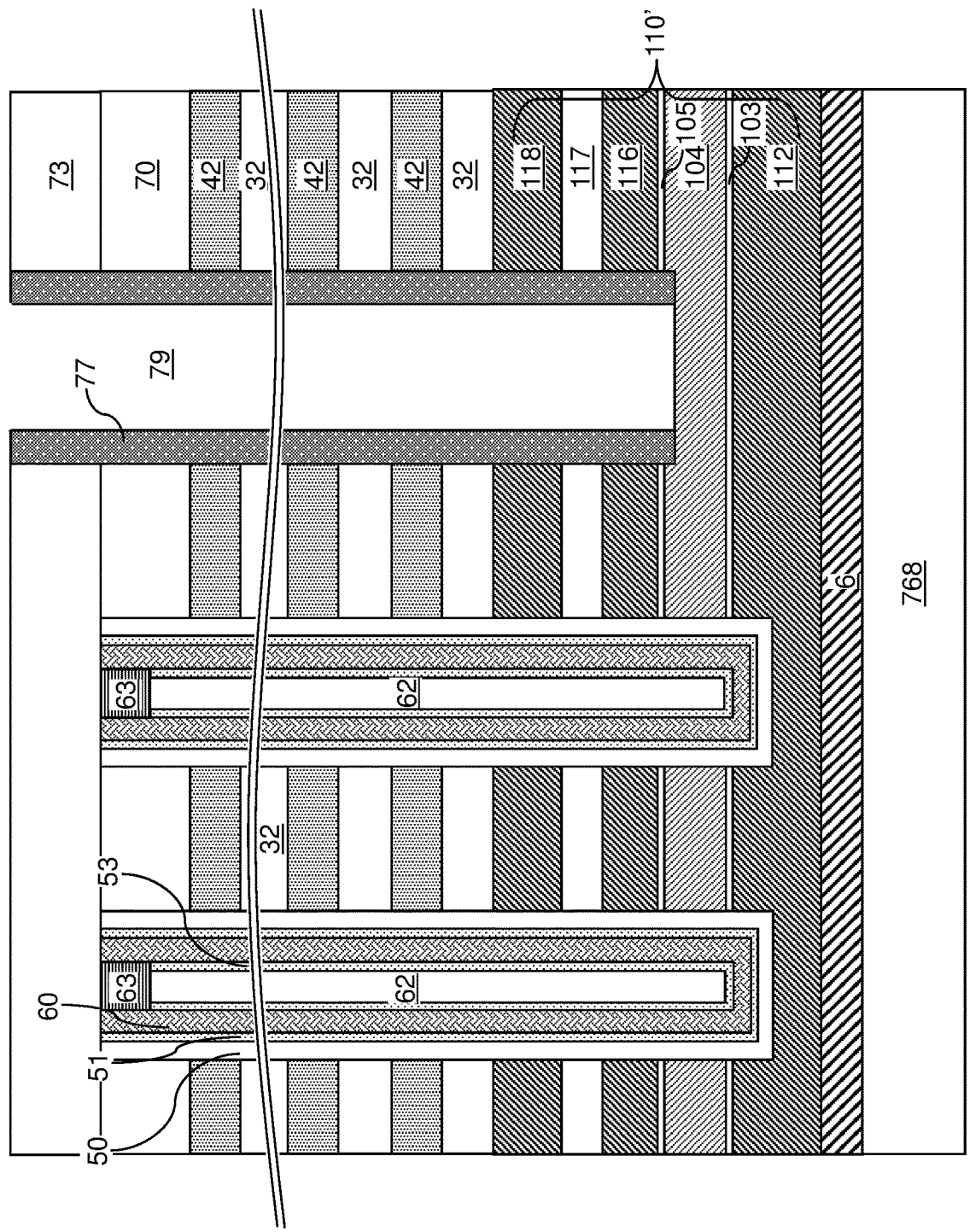
FIG. 18 is a vertical cross-sectional view of the second exemplary structure after formation of a backside trench spacer according to the second embodiment of the present disclosure.

Referring to FIG. 18, a backside trench spacer 77 may be formed on sidewalls of each backside trench 79. For example, a conformal spacer material layer may be deposited in the backside trenches 79 and over the contact-level dielectric layer 73, and may be anisotropically etched to form the backside trench spacers 77. The backside trench spacers 77 include a material that is different from the material of the source-level sacrificial layer 104. For example, the backside trench spacers 77 may include silicon nitride.

Figure 19:
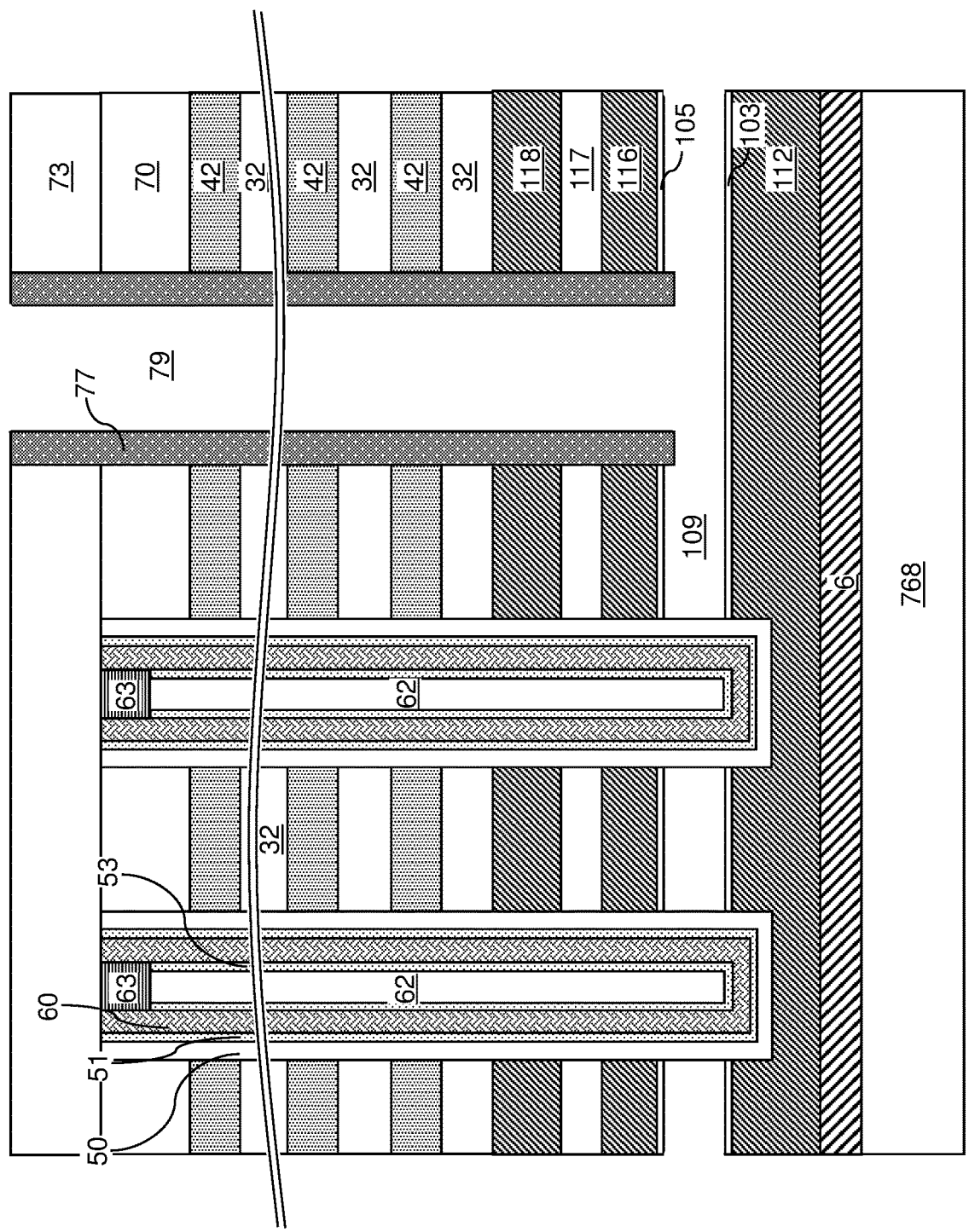
FIG. 19 is a vertical cross-sectional view of the second exemplary structure after formation of a source cavity according to the second embodiment of the present disclosure.

Referring to FIG. 19, an etchant that etches the material of the source-level sacrificial layer 104 selective to the materials of the alternating stack (32, 42), the insulating cap layer 70, the contact-level dielectric layer 73, the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy, the backside trench spacers 77 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the backside trench spacers 77 and the upper and lower sacrificial liners (105, 103). A source cavity 109 is formed in the volume from which the source-level sacrificial layer 104 is removed.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, even if sidewalls of the upper source-level semiconductor layer 116 are physically exposed or even if a surface of the lower source-level semiconductor layer 112 is physically exposed upon formation of the source cavity 109 and/or the backside trench spacers 77, collateral etching of the upper source-level semiconductor layer 116 and/or the lower source-level semiconductor layer 112 is minimal, and the structural change to the exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and that are physically exposed to the source cavity 109.

Figure 20:
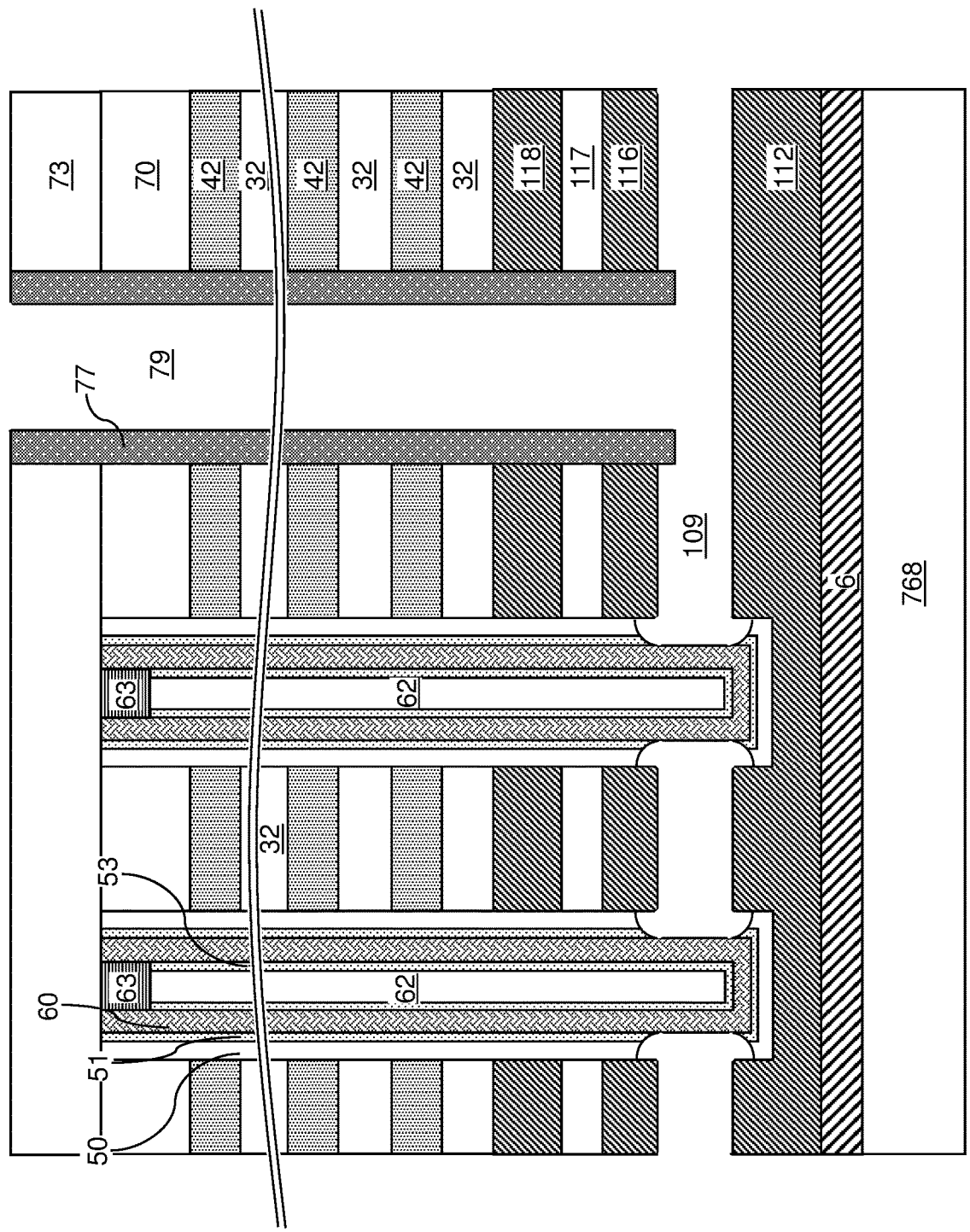
FIG. 20 is a vertical cross-sectional view of the second exemplary structure after physically exposing lower portions of the ferroelectric semiconductor channel layers according to the second embodiment of the present disclosure.

Referring to FIG. 20, a sequence of isotropic etchants, such as wet etchants, may be applied to the physically exposed portions of the gate dielectrics 50 and the optional outer interfacial dielectric layers 51, if present. Cylindrical surfaces of the ferroelectric semiconductor channel layers 60 at the level of the source cavity 109. The upper and lower sacrificial liners (105, 103) may be collaterally etched during removal of the portions of the gate dielectrics 50 located at the level of the source cavity 109. The source cavity 109 may be expanded in volume by removal of the portions of the gate dielectrics 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. Generally, the source cavity 109 is formed by isotropically etching the source-level sacrificial layer 104 and a bottom portion of each of the gate dielectrics 50 selective to at least one source-level semiconductor layer (such as the lower source-level semiconductor layer 112 and the upper source-level semiconductor layer 116) and the ferroelectric semiconductor channel layers 60.

Figure 21:
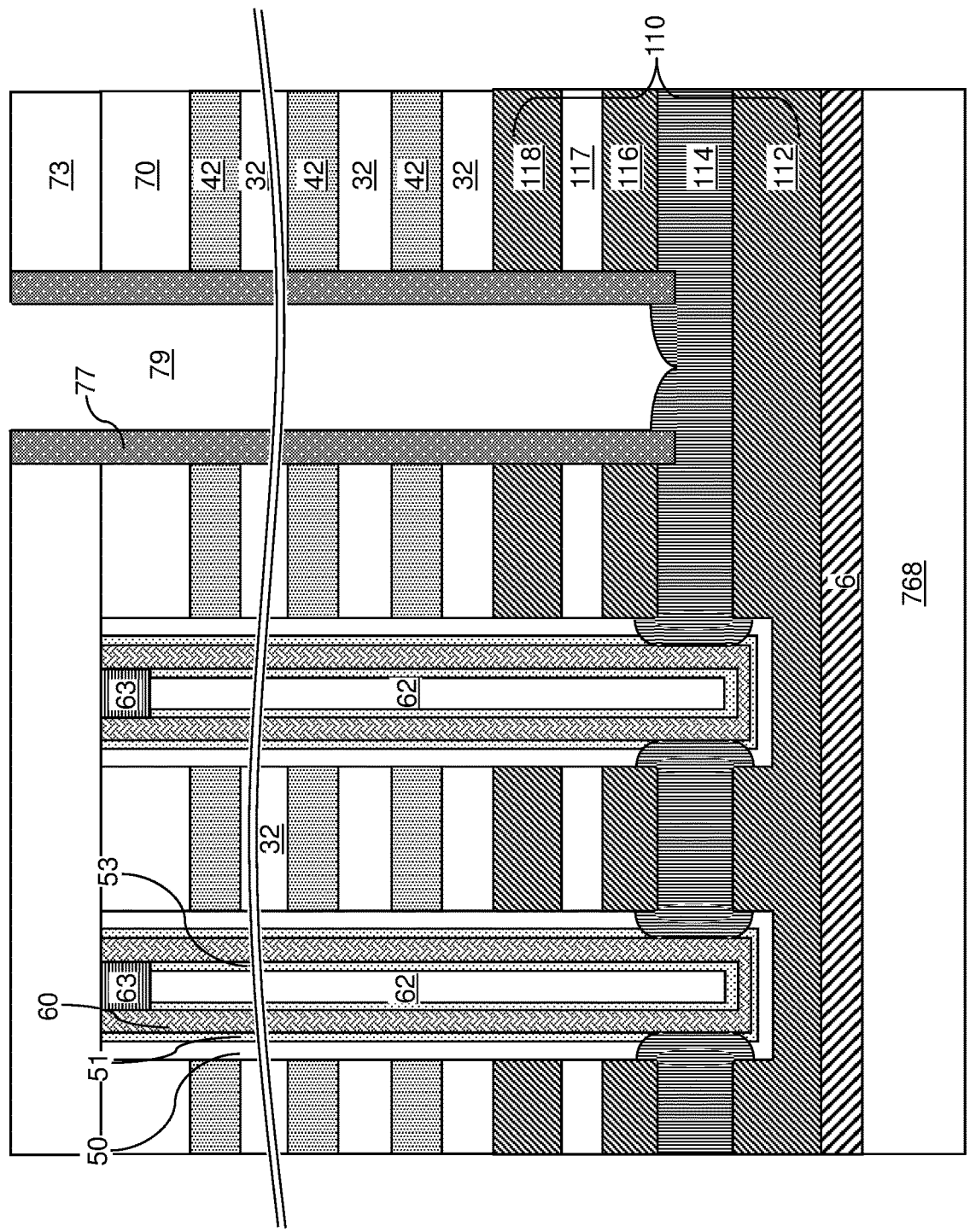
FIG. 21 is a vertical cross-sectional view of the second exemplary structure after formation of a source contact layer according to the second embodiment of the present disclosure.

Referring to FIG. 21, a semiconductor material having a doping of the second conductivity type may be deposited on the physically exposed semiconductor surfaces around the source cavity 109. The physically exposed semiconductor surfaces include bottom portions of outer sidewalls of the ferroelectric semiconductor channel layers 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the ferroelectric semiconductor channel layers 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the ferroelectric semiconductor channel layers 60. The atomic concentration of the dopants of the second conductivity type in the deposited semiconductor material may be in a range from $1.0\times10^{20}/cm^3$ to $2.0\times10^{21}/cm^3$, such as from $2.0\times10^{20}/cm^3$ to $8.0\times10^{20}/cm^3$. The source contact layer 114 as initially formed may consist essentially of semiconductor atoms and electrical dopants (such as p-type dopants or n-type dopants). Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114, and the source contact layer 114 contacts bottom end portions of inner sidewalls of the backside trench spacers 77. In one embodiment, the source contact layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 116 constitutes a buried source layer (112, 114, 116). The set of layers including the buried source layer (112, 114, 116), the source-level insulating layer 117, and the source-select-level conductive layer 118 constitutes source-level material layers 110, which replaces the in-process source-level material layers 110'. A substrate including the source contact layer 114 is provided. The source contact layer 114 is in contact with a bottom surface of the gate dielectric 50 and is in contact with an outer sidewall of the ferroelectric semiconductor channel layers 60.

Figure 22:
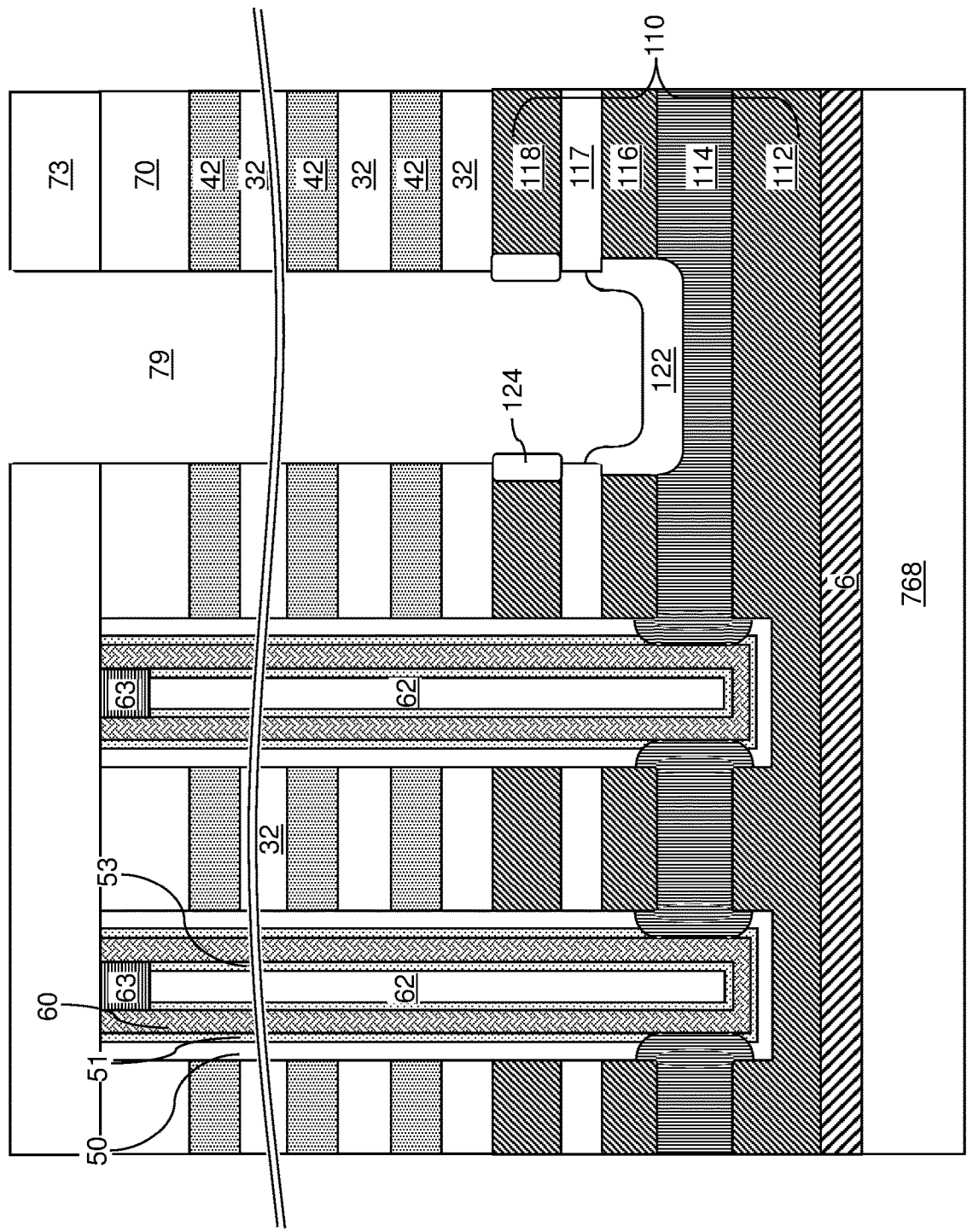
FIG. 22 is a vertical cross-sectional view of the second exemplary structure after formation of dielectric semiconductor oxide portions according to the second embodiment of the present disclosure.

Referring to FIG. 22, the backside trench spacers 77 may be removed selective to the insulating layers 32, the insulating cap layer 70, the contact-level dielectric layer 73, and the source contact layer 114 using an isotropic etch process. For example, if the backside trench spacers 77 include silicon nitride, a wet etch process using hot phosphoric acid may be performed to remove the backside trench spacers 77. In one embodiment, the isotropic etch process that removes the backside trench spacers 77 may be combined with a subsequent isotropic etch process that etches the sacrificial material layers 42 selective to the insulating layers 32, the insulating cap layer 70, the contact-level dielectric layer 73, and the source contact layer 114.

An oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122, and surface portions of the source-select-level conductive layer 118 may be converted into annular dielectric semiconductor oxide spacers 124.

Figure 23:
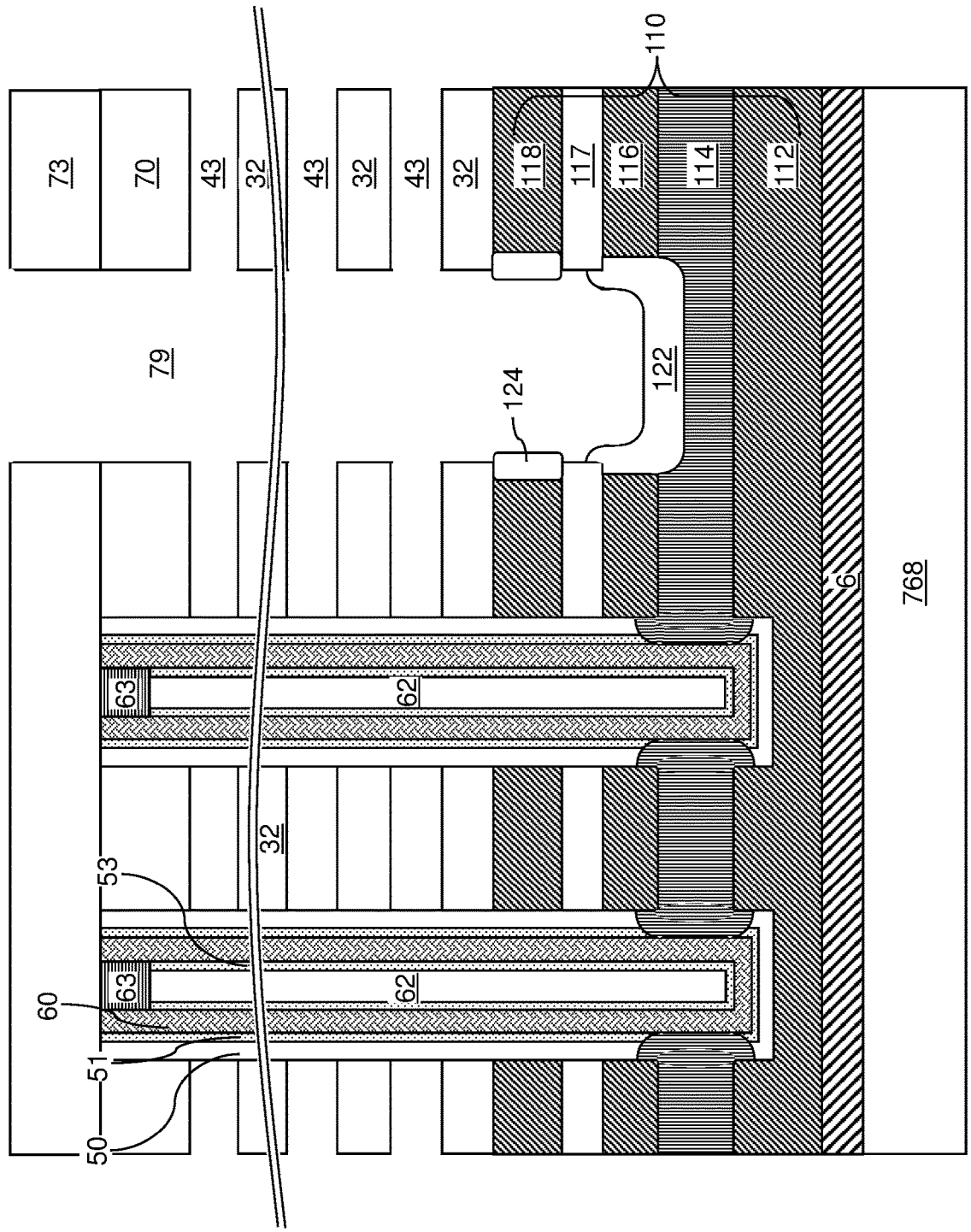
FIG. 23 is a vertical cross-sectional view of the second exemplary structure after formation of backside recesses according to the second embodiment of the present disclosure.

Referring to FIG. 23, the sacrificial material layers 42 are removed selective to the insulating layers 32, the insulating cap layer 70, the contact-level dielectric layer 73, and the source contact layer 114, the dielectric semiconductor oxide plates 122, and the annular dielectric semiconductor oxide spacers 124. For example, an etchant that selectively etches the materials of the sacrificial material layers 42 with respect to the materials of the insulating layers 32, the insulating cap layer 70, the retro-stepped dielectric material portion (not illustrated), and the material of the gate dielectrics 50 may be introduced into the backside trenches 79, for example, using an isotropic etch process. For example, the sacrificial material layers 42 may include silicon nitride, the materials of the insulating layers 32, the insulating cap layer 70, the retro-stepped dielectric material portion 65, and the gate dielectrics 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers 42 include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses 43 are formed in volumes from which the sacrificial material layers 42 are removed. Each of the backside recesses 43 may be a laterally extending cavity having a lateral dimension that is greater than the vertical extent of the cavity. In other words, the lateral dimension of each of the backside recesses 43 may be greater than the height of the respective backside recess 43. A plurality of backside recesses 43 may be formed in the volumes from which the material of the sacrificial material layers 42 is removed. Each of the backside recesses 43 may extend substantially parallel to the top surface of the substrate semiconductor layer 9. A backside recess 43 may be vertically bounded by a top surface of an underlying insulating layer 32 and a bottom surface of an overlying insulating layer 32. In one embodiment, each of the backside recesses 43 may have a uniform height throughout.

Figure 24:
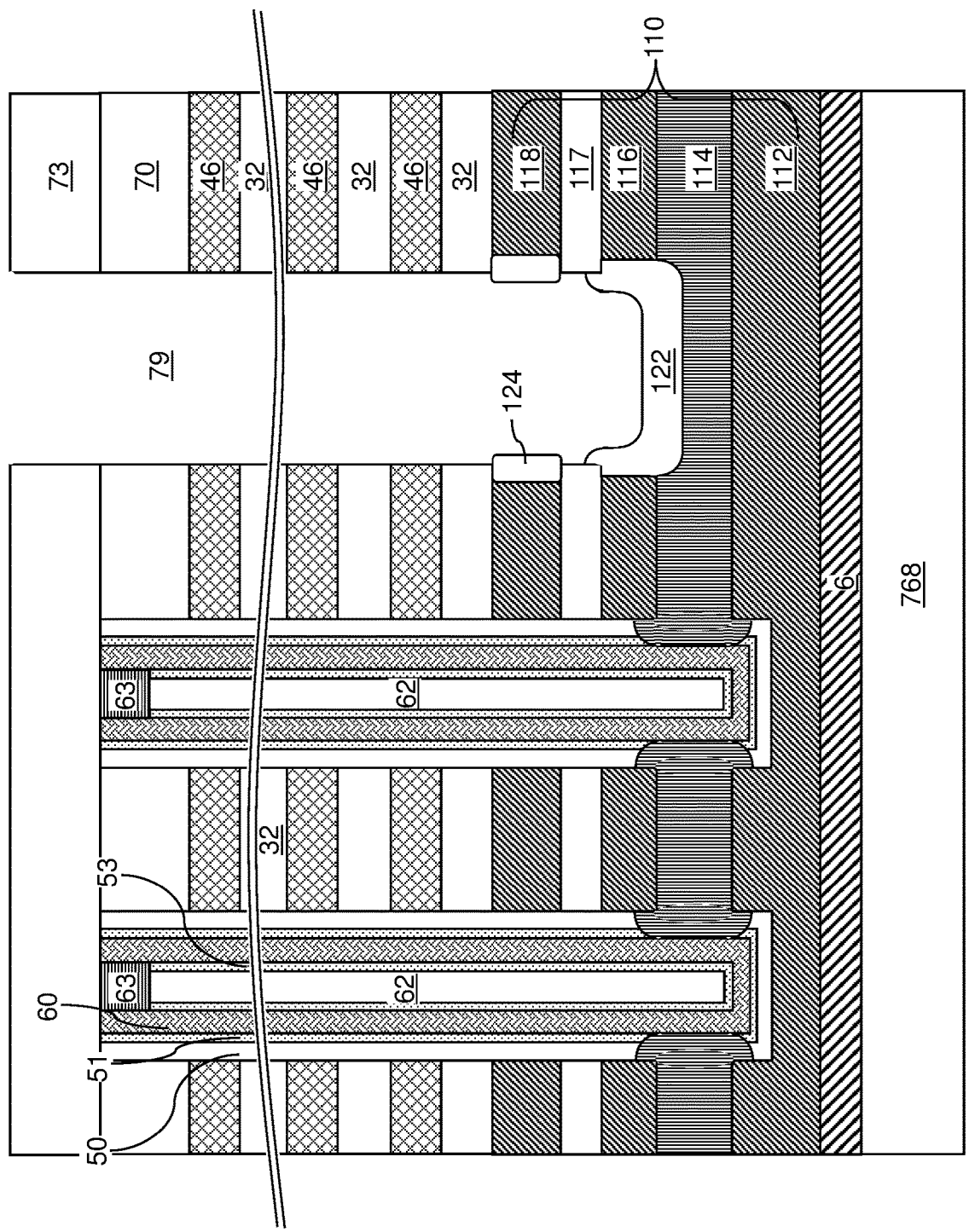
FIG. 24 is a vertical cross-sectional view of the second exemplary structure after formation of electrically conductive layers according to the second embodiment of the present disclosure.

Referring to FIG. 24, at least one conductive material may be deposited in the plurality of backside recesses 43, on the sidewalls of the backside trenches 79, and over the contact-level dielectric layer 73. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses 43 include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses 43 may be a combination of titanium nitride layer and a tungsten fill material.

Electrically conductive layers 46 may be formed in the backside recesses 43 by deposition of the at least one conductive material. Each of the electrically conductive layers 46 may include a respective conductive metallic nitride liner and a respective conductive fill material. Thus, the sacrificial material layers 42 may be replaced with the electrically conductive layers 46. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the contact-level dielectric layer 73, for example, by an anisotropic or isotropic etch. Each remaining portion of the deposited metallic material in the backside recesses constitutes an electrically conductive layer 46. Sidewalls of the electrically conductive material layers 46 may be physically exposed to a respective backside trench 79.

Each electrically conductive layer 46 may be a conductive sheet including openings therein. A first subset of the openings through each electrically conductive layer 46 may be filled with memory opening fill structures 58. A second subset of the openings through each electrically conductive layer 46 may be filled with the support pillar structures 20. Each electrically conductive layer 46 may have a lesser area than any underlying electrically conductive layer 46 because of the stepped surfaces in the staircase region 300. Each electrically conductive layer 46 may have a greater area than any overlying electrically conductive layer 46 because of the stepped surfaces.

In some embodiment, drain-select-level isolation structures 72 may be provided at topmost levels of the electrically conductive layers 46. A subset of the electrically conductive layers 46 located at the levels of the drain-select-level isolation structures 72 constitutes drain select gate electrodes. A subset of the electrically conductive layer 46 located underneath the drain select gate electrodes may function as combinations of a control gate and a word line located at the same level. The control gate electrodes within each electrically conductive layer 46 are the control gate electrodes for a vertical stack of memory elements located at each level of the electrically conductive layers 46, which are portions of the ferroelectric semiconductor channel layer 60. A subset of the electrically conductive layers 46 may comprise word lines for the memory elements.

Figure 25:
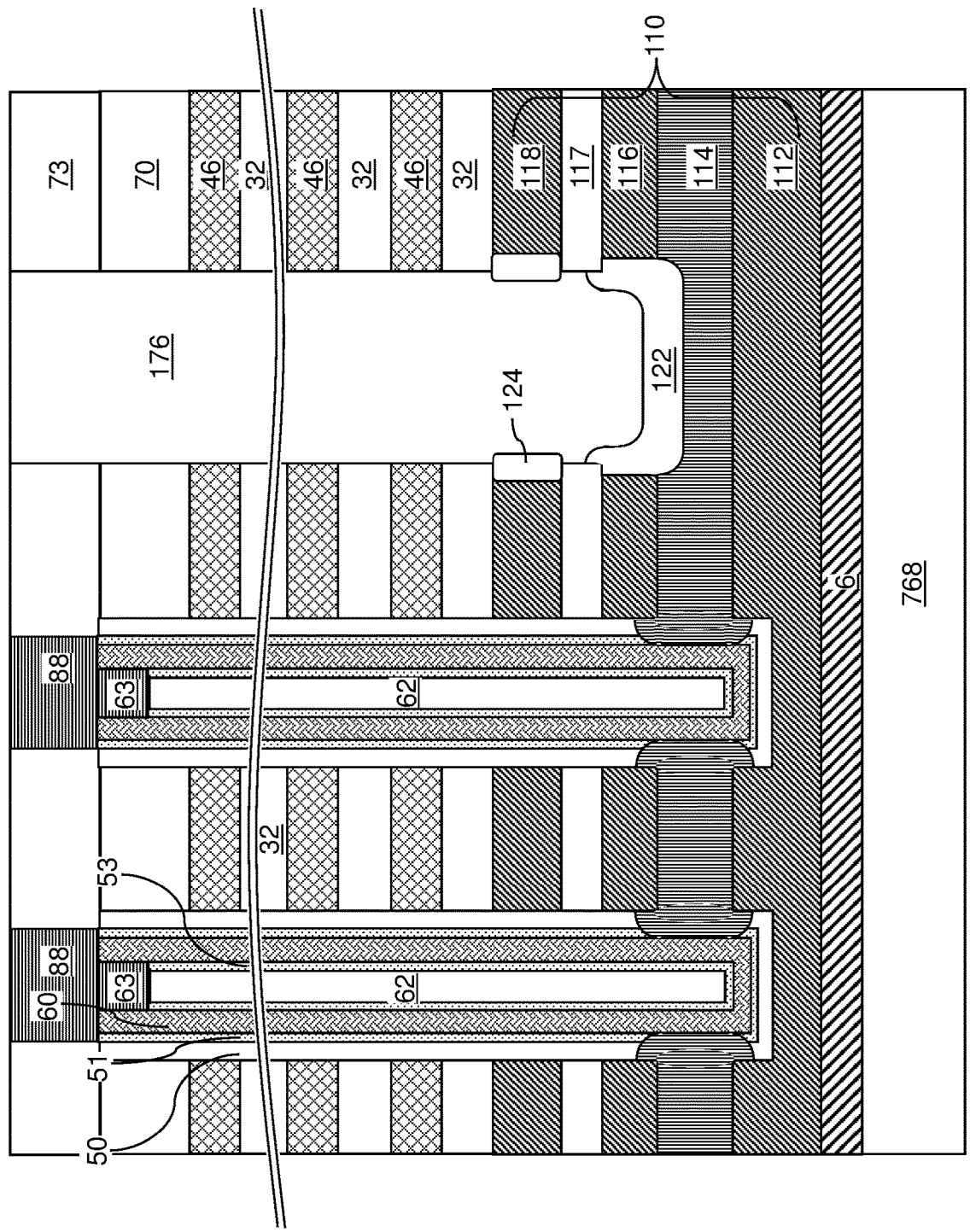
FIG. 25 is a vertical cross-sectional view of the second exemplary structure after formation of a backside trench fill structure and drain contact via structures according to the second embodiment of the present disclosure.

Referring to FIG. 25, a dielectric material layer may be conformally deposited in the backside trenches 79 and over the contact-level dielectric layer 73 by a conformal deposition process. The dielectric material layer may include, for example, silicon oxide. Each portion of the dielectric material layer filling a respective one of the backside trenches 79 constitutes a backside trench fill structure 176, which may be a dielectric wall structure. A horizontally-extending portion of the dielectric material layer that overlies the contact-level dielectric layer 73 may be removed by a planarization process (such as a recess etch process or a chemical mechanical polishing process), or may be incorporated into the contact-level dielectric layer 73.

Subsequently, the processing steps of FIGS. 12A-12C may be performed to form various contact via structures such as the drain contact via structures 88.

Figure 26A:
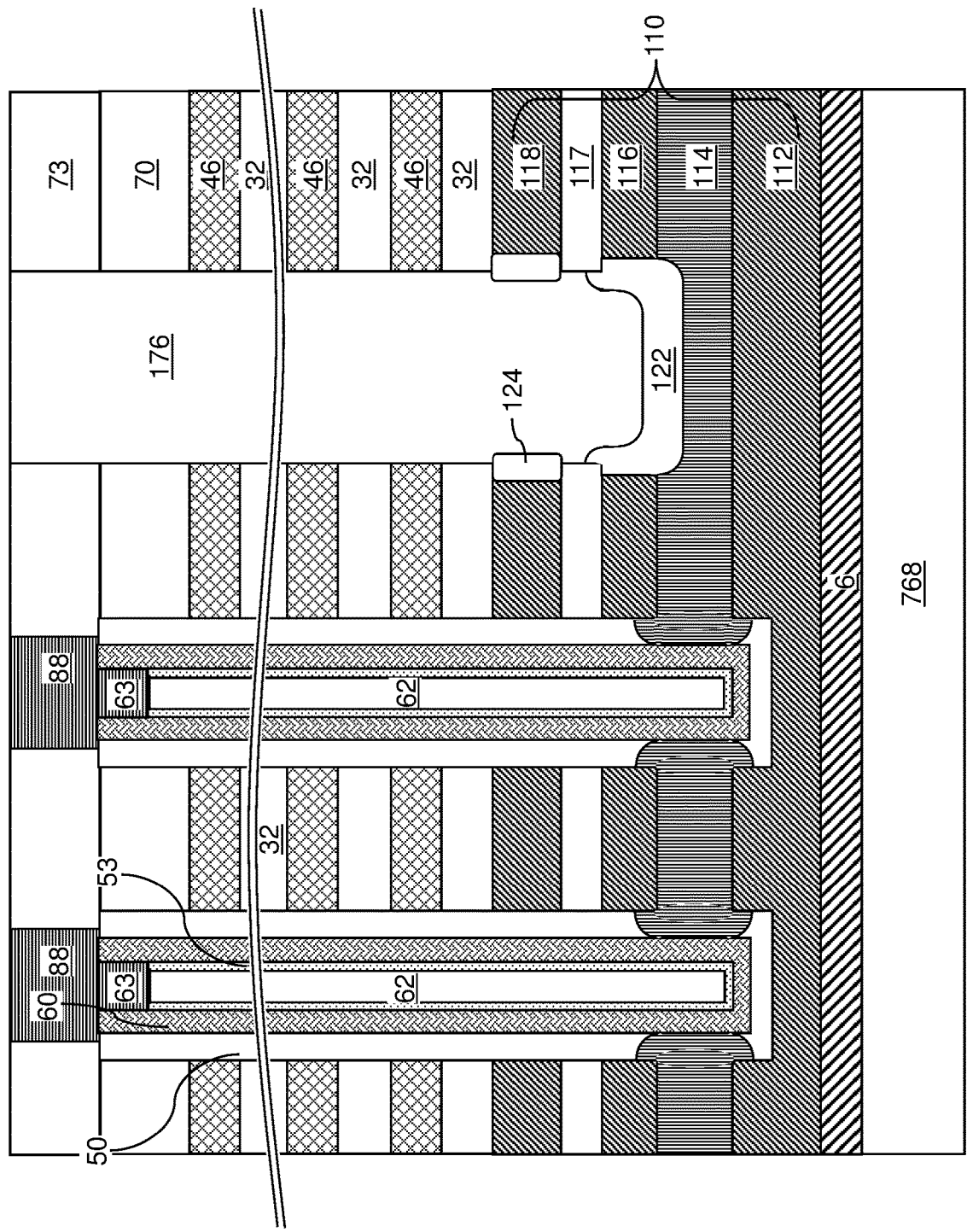
FIGS. 26A-26C are alternative configurations of the second exemplary structure.

Referring to FIG. 26A, a first alternative configuration of a memory opening fill structure 58 is illustrated, which can be derived from the memory opening fill structure of FIG. 25 by omitting the outer interfacial dielectric layer 51.

Figure 26B:
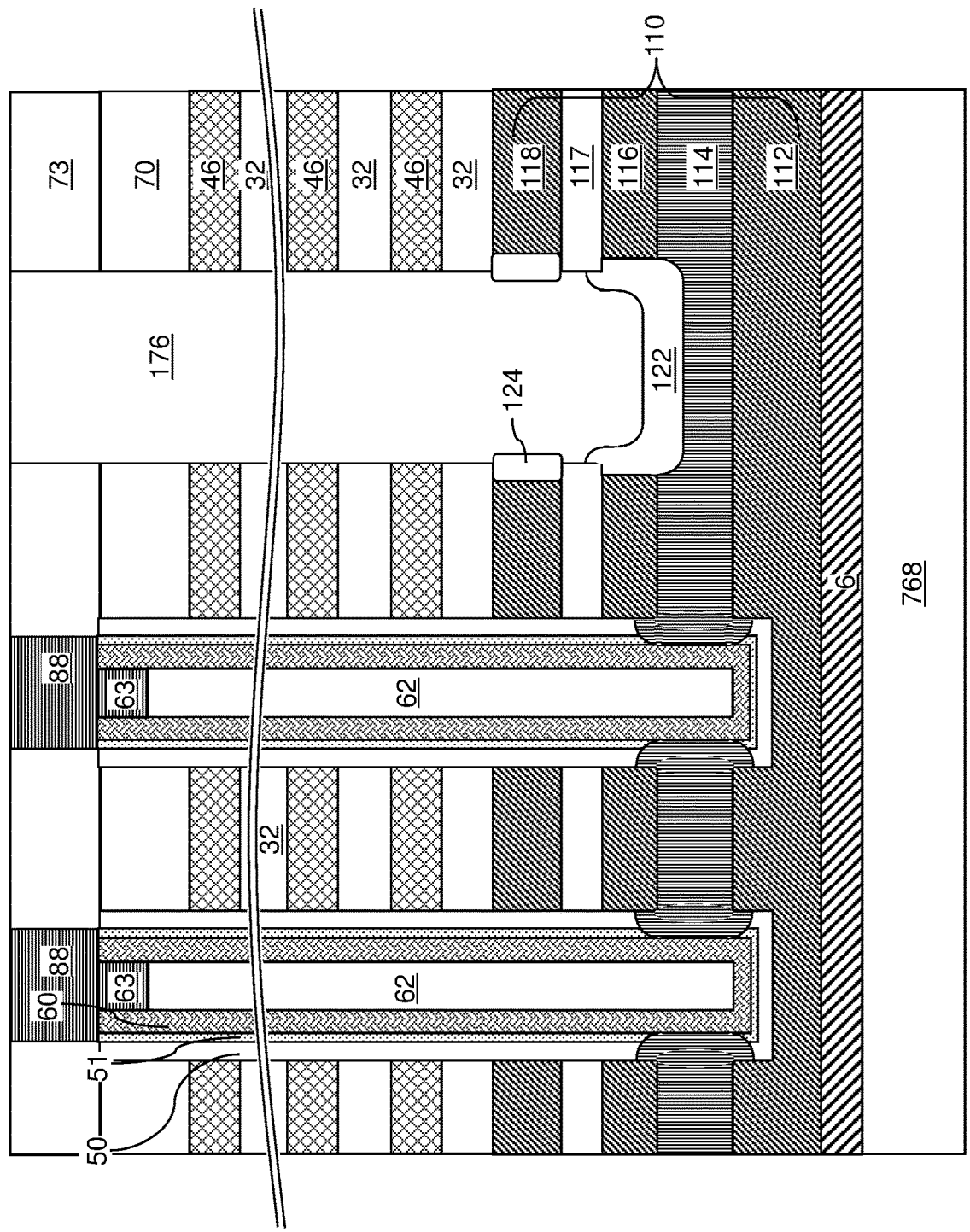

Referring to FIG. 26B, a second alternative configuration of a memory opening fill structure 58 is illustrated, which can be derived from the memory opening fill structure of FIG. 25 by omitting the inner interfacial dielectric layer 53.

Figure 26C:
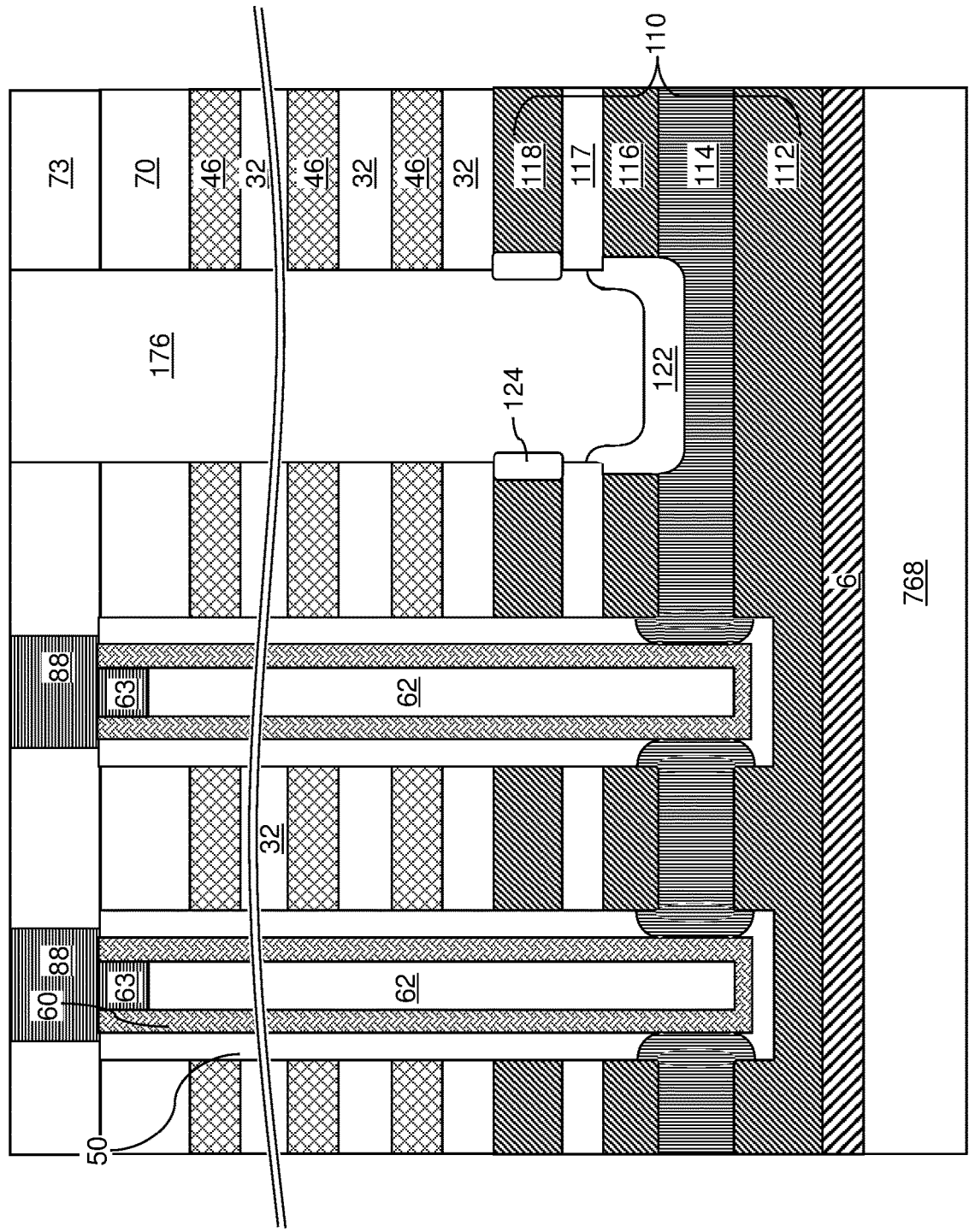

Referring to FIG. 26C, a third alternative configuration of a memory opening fill structure 58 is illustrated, which can be derived from the memory opening fill structure of FIG. 25 by omitting the outer interfacial dielectric layer 51 and the inner interfacial dielectric layer 53.

Referring to FIGS. 1-26C and according to various embodiments of the present disclosure, a semiconductor structure (e.g., memory device) comprises an alternating stack of insulating layers 32 and electrically conductive layers 46 located over a substrate; a memory opening 49 vertically extending through the alternating stack (32, 46); and a memory opening fill structure 58 located within the memory opening 49, wherein the memory opening fill structure 58 comprises a gate dielectric 50 and a ferroelectric semiconductor channel layer 60 that is laterally spaced from the electrically conductive layers 46 by the gate dielectric 50.

In one embodiment, the ferroelectric semiconductor channel layer 60 comprises an indium selenide material. In one embodiment, the indium selenide material has a rhombohedral R3m crystalline structure and has a material composition of $In_2Se_{3+\delta}$, wherein $\delta$ is in a range from 0.3 to 0.5. In one embodiment, the ferroelectric semiconductor channel layer 60 has a charge carrier mobility in range from 400 $cm^2/(V \cdot s)$ to 500 $cm^2/(V \cdot s)$.

In one embodiment, the ferroelectric semiconductor channel layer 60 has a lateral thickness in a range from 0.65 nm to 10 nm. In one embodiment, the ferroelectric semiconductor channel layer 60 has a tubular configuration with a uniform thickness between an inner sidewall and an outer sidewall.

In one embodiment, a drain region 63 contacts a top end of the ferroelectric semiconductor channel layer 60. The drain region 63 may comprise a material selected from a doped elemental semiconductor material, a doped compound semiconductor material, a stack including a titanium layer and a gold layer, a stack including a nickel layer and a gold layer, or a metal silicide material.

In one embodiment, cylindrical sidewalls of the electrically conductive layers 46 are in direct contact with an outer sidewall of the gate dielectric 50. In one embodiment, the gate dielectric 50 may have a homogeneous material composition throughout, which may be a material composition of silicon oxide.

In one embodiment, an inner sidewall of the gate dielectric 50 contacts an outer sidewall of the ferroelectric semiconductor channel layer 60.

In one embodiment, the semiconductor structure comprises an outer interfacial dielectric layer 51 contacting an inner sidewall of the gate dielectric 50 and an outer sidewall of the ferroelectric semiconductor channel layer 60.

In one embodiment, the semiconductor structure comprises a dielectric core 62 laterally surrounded by and contacting an inner sidewall of the ferroelectric semiconductor channel layer 60. In another embodiment, the semiconductor structure comprises: an inner interfacial dielectric layer 53 contacting an inner sidewall of the ferroelectric semiconductor channel layer 60; and a dielectric core 62 laterally surrounded by and contacting an inner sidewall of the inner interfacial dielectric layer 53.

In one embodiment, the substrate (9, 10) comprises a semiconductor material layer 10; and the memory opening fill structure 58 comprises a pedestal channel portion 11 in contact with the semiconductor material layer 10, in contact with a bottom surface of the gate dielectric 50, in contact with a bottom surface of the ferroelectric semiconductor channel layer 60, and laterally surrounded by a bottommost electrically conductive layer 46 among the electrically conductive layers 46.

In one embodiment, the substrate (768, 6, 110) comprises a source contact layer 114 in contact with an outer sidewall of the ferroelectric semiconductor channel layer 60.

In one embodiment, the semiconductor structure comprises: additional memory openings 49 vertically extending through the alternating stack (32, 46); and additional memory opening fill structures 58 located within the memory openings 49, wherein the semiconductor structure comprises a three-dimensional memory array including a two-dimensional array of ferroelectric semiconductor channel layers 60 located within the additional memory opening fill structures 58.

Programming of each ferroelectric memory element in a ferroelectric semiconductor channel layer 60 may be effected by applying a bias voltage to an electrically conductive layer 46 that laterally surrounds a selected ferroelectric memory element, which is an annular portion of the ferroelectric semiconductor channel layer 60 laterally surrounded by the electrically conductive layer 46. While the source regions 61 and the drain region 63 of a selected ferroelectric memory cell are electrically grounded and while the drain regions 63 of unselected NAND strings are electrically floating, the electrically conductive layer 46 laterally surrounding a selected ferroelectric memory element is electrically biased with a positive programming voltage or with a negative programming voltage that induces negative polarization charges or positive polarization charges at an annular interface between the gate dielectric 50 and an annular outer surface of the adjacent portion of the ferroelectric semiconductor channel layer 60 (i.e., of the adjacent selected ferroelectric memory element). The absolute value of the magnitude of the programming voltage may be in a range from 4 V to 8V, although lesser and greater voltages may also be employed.

For example, a negative voltage pulse on an electrically conductive layer 46 (i.e., word line) having a magnitude of −4 to −8V, results in a positive polarization charge at the channel/gate dielectric interface, and the transistor threshold voltage shifts to a lower value. In other words, the polarization vector points away from the electrically conductive layer 46, and more positive polarization charge accumulates at the channel 60/gate dielectric 50 interface, while the more negative polarization charge accumulates at the channel 60/dielectric core 62 interface.

In contrast, a positive voltage pulse on an electrically conductive layer 46 (i.e., word line) having a magnitude of +4 to +8V, results in a negative polarization charge at the channel/gate dielectric interface, and the transistor threshold voltage shifts to a higher value. In other words, the polarization vector points toward the electrically conductive layer 46, and more negative polarization charge accumulates at the channel 60/gate dielectric 50 interface, while the more positive polarization charge accumulates at the channel 60/dielectric core 62 interface.

During a read operation, a pass gate bias voltage that locally increases the electrical conductivity may be applied to each level of the electrically conductive layers 46 other than to the selected level for reading the memory state, to which a lower read bias voltage is applied.

Figure 27:
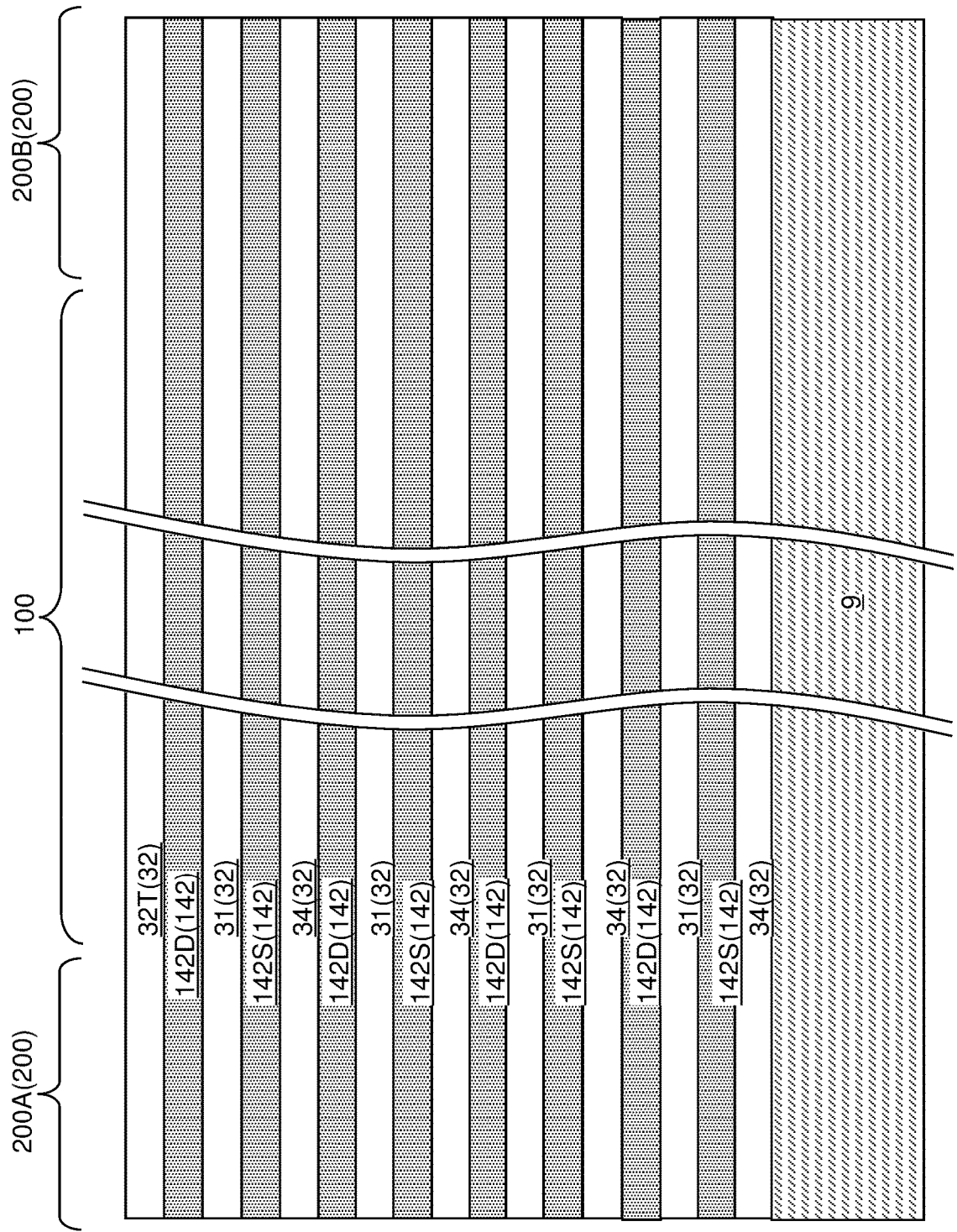
FIG. 27 is a vertical cross-sectional view of a third exemplary structure after formation of multiple instances of a unit layer stack including a vertical-isolation insulating layer, a source spacer material layer, a channel-level insulating layer, and a drain spacer material layer according to a third embodiment of the present disclosure.

Referring to FIG. 27, a third exemplary structure according to a third embodiment of the present disclosure comprise a substrate, which may include a substrate semiconductor layer 9. One or more instances of a unit layer stack can be formed over the top surface of the substrate. In one embodiment, the one or more instances of the unit layer stack comprise a plurality of instances of the unit layer stack that are vertically stacked. As used herein, a "unit layer stack" refers to a layer stack of multiple layers that functions as a unit of repetition within a structure in which multiple instances of the layer stack is repeated.

The unit layer stack can include a vertical-isolation insulating layer 34, a source spacer material layer, a channel-level insulating layer 31, and a drain spacer material layer. Each source spacer material layer can be formed as, or can be subsequently replaced with, a source electrically conductive layer. Each drain spacer material layer is formed as, or is subsequently replaced with, a drain electrically conductive layer. In case each source spacer material layer is subsequently replaced with a source electrically conductive layer and each drain spacer material layer is subsequently replaced with a drain electrically conductive layer, each source spacer material layer may be formed as a source-level sacrificial material layer 142S and each drain spacer material layer may be formed as a drain-level sacrificial material layer 142D. In this case, the unit layer stack can include a vertical-isolation insulating layer 34, a source-level sacrificial material layer 142S, a channel-level insulating layer 31, and a drain-level sacrificial material layer 142D. The source-level sacrificial material layers 142S and the drain-level sacrificial material layers 142D are collectively referred to as sacrificial material layers 142. A topmost insulating layer 32T may be formed in lieu of the vertical-isolation insulating layer 34 for the topmost instance of the unit layer stack (34, 142S, 31, 142D). The vertical-isolation insulating layers 34, the channel-level insulating layer 31, and the topmost insulating layer 32T are collectively referred to as insulating layers 32.

While the present disclosure is described employing an embodiment in which each source spacer material layer is formed as a source-level sacrificial material layer 142S and each drain spacer material layer is formed as a drain-level sacrificial material layer 142D, embodiments are expressly contemplated herein in which the each source spacer material layer is formed as a source electrically conductive layer (e.g., heavily doped semiconductor, metal, metal alloy and/or conductive metal nitride layer) and each drain spacer material layer is formed as a drain electrically conductive layer (e.g., heavily doped semiconductor, metal, metal alloy and/or conductive metal nitride layer).

The total number of repetitions of the unit layer stack (34, 142S, 31, 142D) can be the same as the total number of levels of vertical field effect transistors to be subsequently formed, which can be the same as the total number of levels of memory elements to be subsequently formed. As used herein, a "level" refers to a volume of a device located between a horizontal plane including a top surface of an element of the device and a horizontal plane including a bottom surface of the element of the device.

Therefore, a channel-level insulating layer 31 is an insulating layer 32 that is formed between a horizontal plane including a top surface of a semiconductor channel to be subsequently formed and a horizontal plane including a bottom surface of the semiconductor channel is to be subsequently formed. A vertical-isolation insulating layer 34 is an insulating layer 32 that is formed between a horizontal plane including a top surface of an inter-transistor gap to be subsequently formed and a horizontal plane including a bottom surface of the inter-transistor gap is to be subsequently formed. The number of repetitions of the unit layer stack in the multiple instances of the unit layer stack may be in a range from 2 to 1,024, such as from 8 to 128, although lesser and greater numbers of repetitions can also be employed.

Each of the insulating layers 32 includes a respective insulating material such as a doped silicate glass, undoped silicate glass (e.g., silicon oxide), a metal oxide (e.g., aluminum oxide) or organosilicate glass. The thickness of each channel-level insulating layer 31 can be in a range from 20 nm to 80 nm, and the thickness of each vertical-isolation insulating layers 34 can be in a range from 10 nm to 60 nm, although lesser and greater thicknesses can also be employed.

According to an embodiment of the present disclosure, the channel-level insulating layers 31 include a first insulating material and the vertical-isolation insulating layers 34 include a different second insulating material that can provide a lower etch rate in an isotropic etch process than the first insulating material. For example, the channel-level insulating layers 31 can include borosilicate glass or porous or non-porous organosilicate glass, and the vertical-isolation insulating layers 34 can include undoped silicate glass (i.e., silicon oxide). In this case, the etch rate of the material of the channel-level insulating layers 31 in 100:1 diluted hydrofluoric acid can be at least 10 times, such as 100 or more times, greater than the etch rate of the material of the vertical-isolation insulating layers 34 in 100:1 diluted hydrofluoric acid. In another embodiment, the vertical-isolation insulating layers 34 can comprise a semiconductor oxide material (such as undoped silicate glass formed by decomposition of tetraethylorthosilicate) and the channel-level insulating layers 31 can comprise a metal oxide (such as aluminum oxide) which has a higher etch rate in an aluminum oxide selective etchant than silicon oxide. The topmost insulating layer 32T may comprise the same material as the vertical-isolation insulating layers 34. In other words, the topmost insulating layer 32T may include the second insulating material.

The source-level sacrificial material layers 142S and the drain-level sacrificial material layers 142D include a material that can be removed selective to the materials of the insulating layers 32. For example, if the insulating layers 32 include a doped silicate glass, undoped silicate glass, or organosilicate glass, then the source-level sacrificial material layers 142S and the drain-level sacrificial material layers 142D can include silicon nitride, undoped amorphous silicon, or a silicon-germanium alloy. The thickness of each source-level sacrificial material layer 142S can be in a range from 10 nm to 50 nm, such as from 20 nm to 30 nm, and the thickness of each and the thickness of each drain-level sacrificial material layer 142D can be in a range from 10 nm to 50 nm, such as from 20 nm to 30 nm, although lesser and greater thicknesses can also be employed.

The third exemplary structure can include at least one memory array region 100 in which a three-dimensional array of memory elements is to be subsequently formed, and staircase regions (200A, 200B) in which stepped surfaces of the multiple instances of the unit layer stack (34, 142S, 31, 142D) are to be subsequently formed. The staircase regions may include a source side staircase region 200A and a drain side staircase region 200B.

Figure 28:
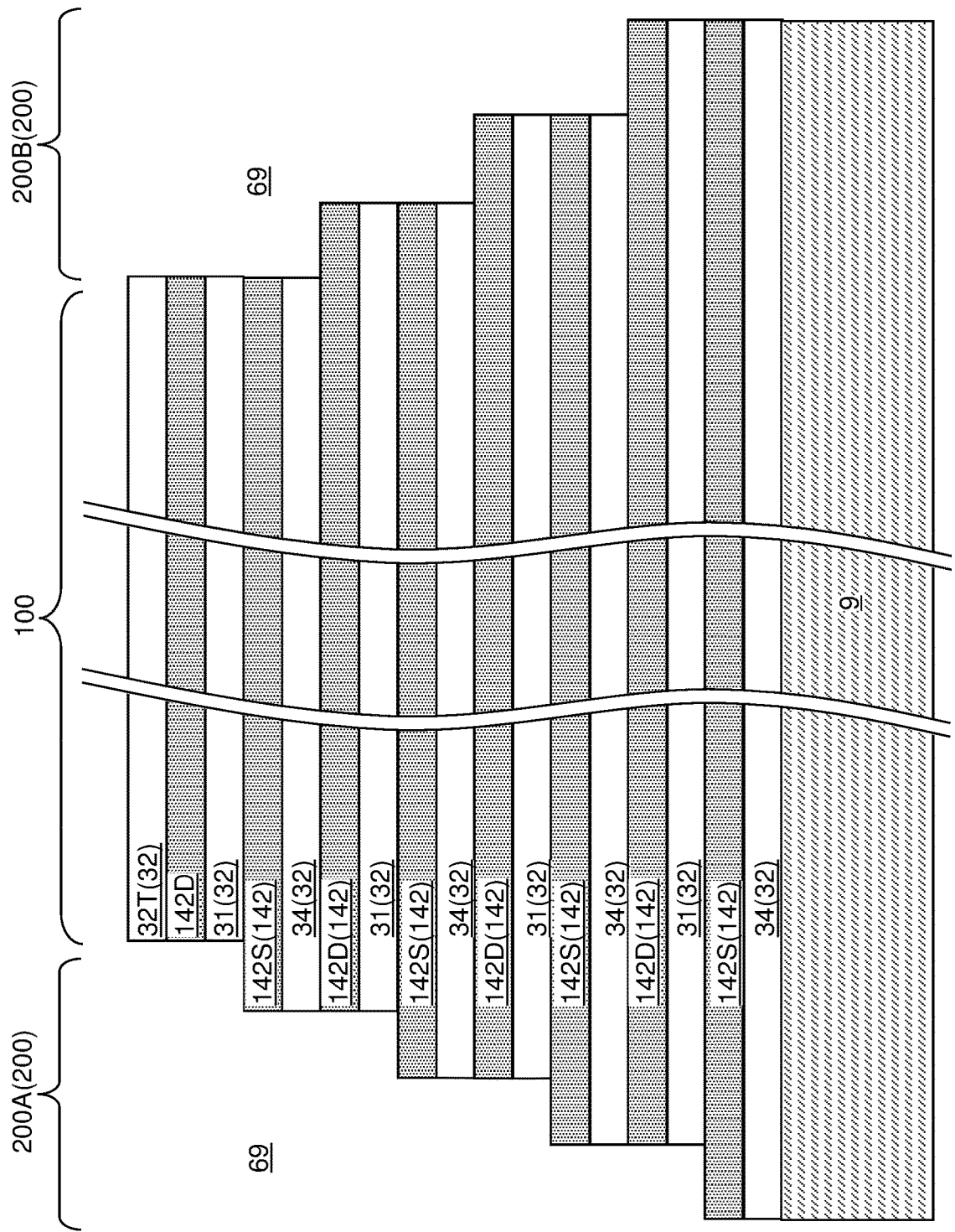
FIG. 28 is a vertical cross-sectional view of the third exemplary structure after formation of stepped surfaces according to the third embodiment of the present disclosure.

Referring to FIG. 28, the multiple instances of the unit layer stack (34, 142S, 31, 142D) can be patterned for form stepped surfaces in the staircase regions (200A, 200B). For example, a trimmable mask layer (not shown) can be formed over the third exemplary structure, and can be patterned to cover each memory array region 100 and proximal portions of the staircase regions (200A, 200B) such that the edges of the trimmable mask layer are formed at location at which outermost vertical steps of stepped surfaces are to be subsequently formed. An anisotropic etch process can be performed to etch through one unit layer stack (34, 142S, 31, 142D) within areas that are not covered by the trimmable mask layer. The trimmable mask layer can be isotropically trimmed so that edges of the trimmable mask layer are formed at which second outermost vertical steps of the stepped surfaces are to be subsequently formed. An anisotropic etch process can be performed to etch through one unit layer stack (34, 142S, 31, 142D) within areas that are not covered by the trimmable mask layer. The isotropic trimming process for the trimmable mask layer and the anisotropic etch process can be repeatedly performed to form stepped surfaces within each of the staircase regions (200A, 200B).

In one embodiment, stepped surfaces in a pair of staircase regions (200A, 200B) located on each side of a memory array region 100 can be vertically offset such that one type of surfaces are physically exposed in one of the staircase regions (200A, 200B) and another type of surfaces are physically exposed in another of the staircase regions (200A, 200B). For example, horizontal surfaces of source-level sacrificial material layers 142S can be physically exposed in the source side staircase region 200A adjacent to one side of the memory array region 100, and horizontal surfaces of drain-level sacrificial material layers 142D can be physically exposed in the drain side staircase region 200B adjacent to the opposite side of the memory array region 100. The vertical offset between the horizontal steps in each pair of staircase regions (200A, 200B) located on opposite sides of the same memory array region 100 can be the same as the thickness of one half of the unit layer stack (34, 142S, 31, 142D), such as the sum of the thickness of a source-level sacrificial material layer 142S and the thickness of a channel-level insulating layer 31, or the sum of the thickness of a drain-level sacrificial material layer 142D and the thickness of a vertical-isolation insulating layer 34. In this case, an etch mask layer (not shown) such as a patterned photoresist layer can cover the memory array region 100 and one of the staircase regions (e.g., 200A), and vertically recess the other staircase region (e.g., 200B) by the thickness of one half of the unit layer stack (34, 142S, 31, 142D).

Stepped cavities 69 having stepped bottom surfaces can be formed in the staircase regions (200A, 200B). The lateral extent of each type of layer within the multiple instances of the unit layer stack (34, 142S, 31, 142D) can decrease with a vertical distance from the substrate 9 upon patterning the stepped surfaces on the multiple instances of the unit layer stack (34, 142S, 31, 142D). The trimmable mask layer can be removed after forming the topmost vertical steps.

Figure 29A:
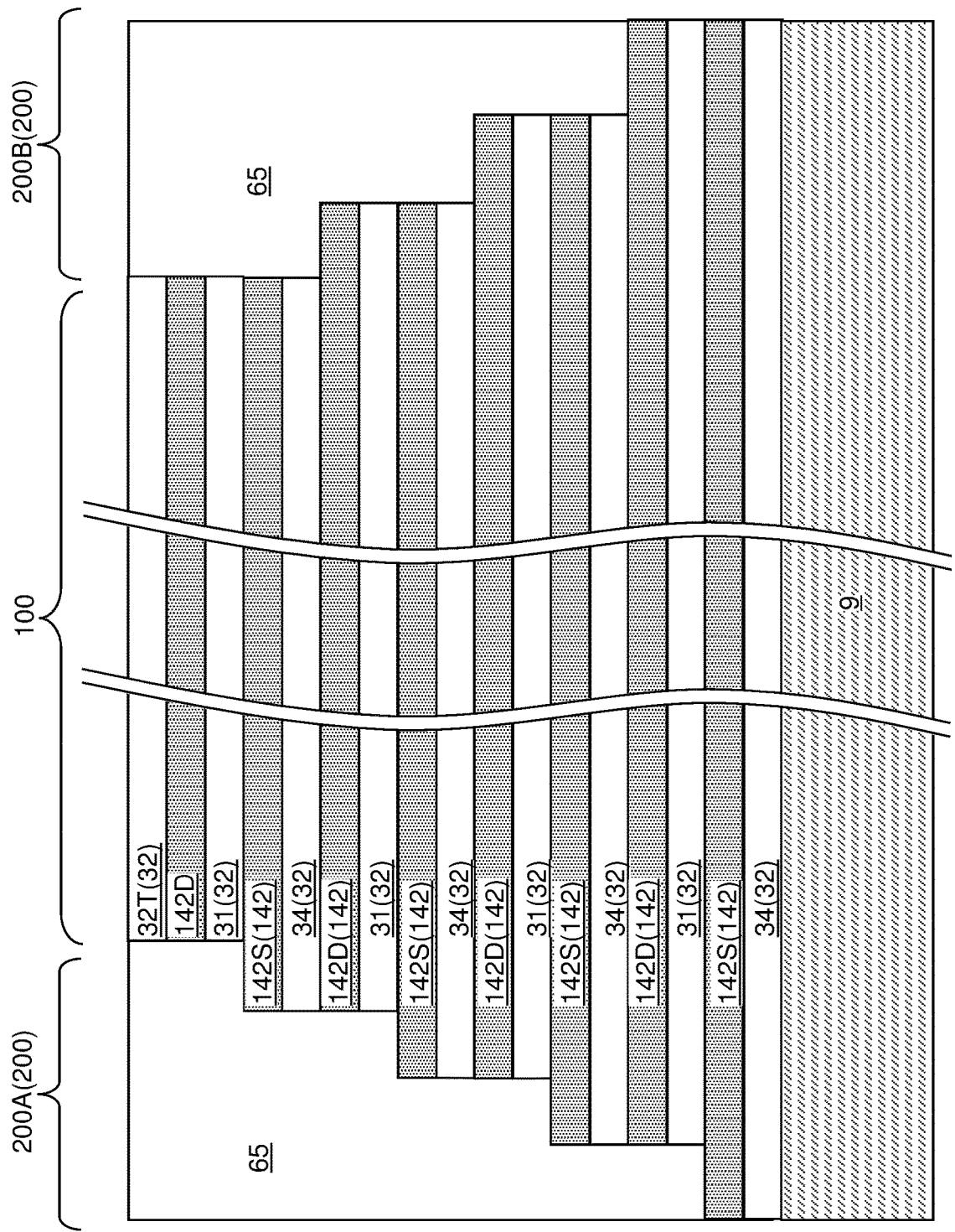
FIG. 29A is a vertical cross-sectional view of the third exemplary structure after formation of retro-stepped dielectric material portions according to the third embodiment of the present disclosure.

Referring to FIGS. 29A and 29B, a retro-stepped dielectric material portion 65 (i.e., an insulating fill material portion) can be formed in each stepped cavity 69 by deposition of a dielectric material therein. For example, a dielectric material such as silicon oxide can be deposited in the stepped cavity. Excess portions of the deposited dielectric material can be removed from above the top surface of the topmost insulating layer 32T, for example, by chemical mechanical planarization (CMP). Each remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 30A:
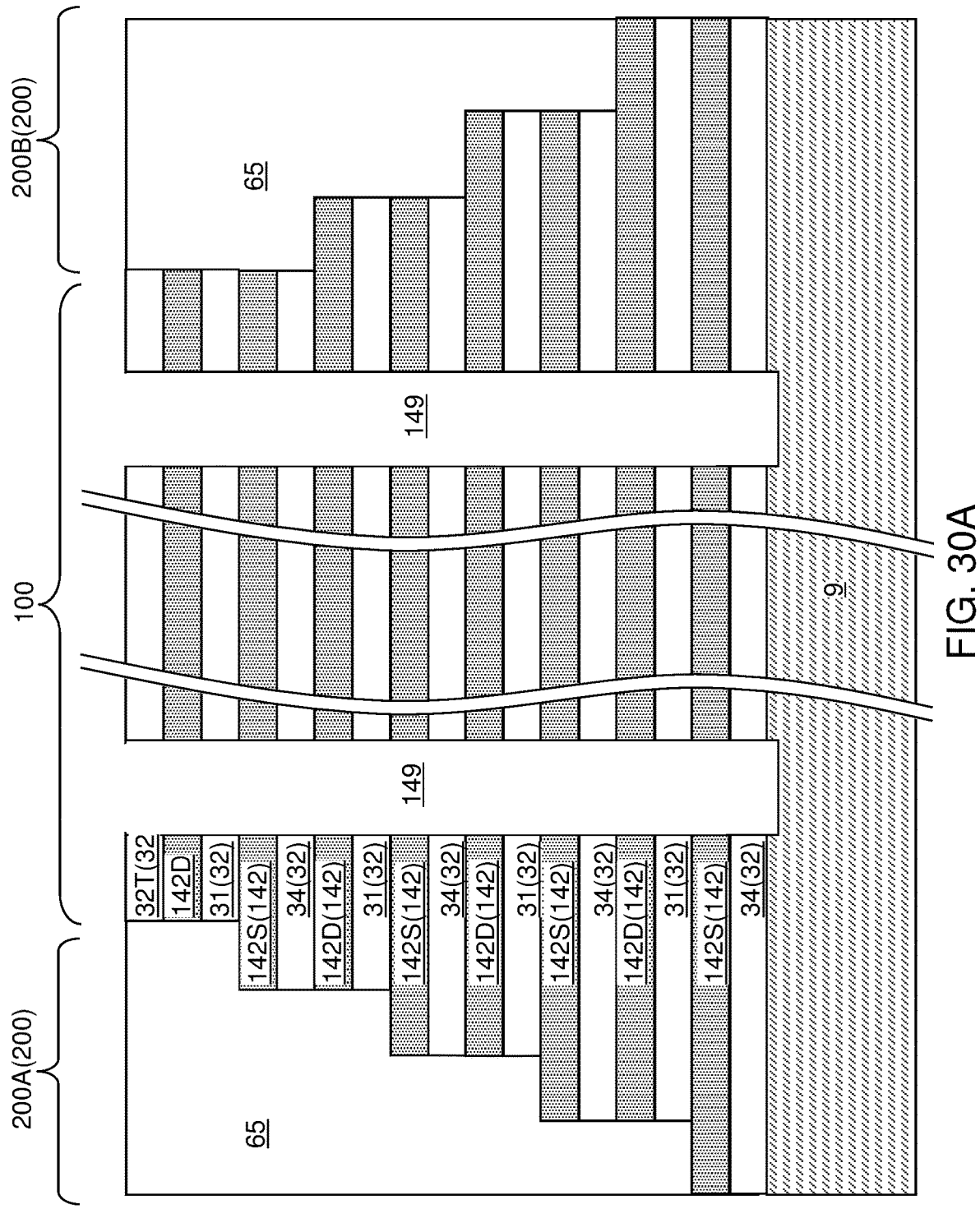
FIG. 30A is a vertical cross-sectional view of the third exemplary structure after formation of memory openings according to the third embodiment of the present disclosure.

Referring to FIGS. 30A and 30B, a lithographic material stack (not shown) including at least a photoresist layer can be formed over the topmost insulating layer 32T and the retro-stepped dielectric material portion 65, and can be lithographically patterned to form openings therein. The openings include a first set of openings formed over the memory array region 100 and an optional second set of openings formed over the staircase regions (200A, 200B). The pattern in the lithographic material stack can be transferred through the topmost insulating layer 32T or the retro-stepped dielectric material portion 65, the multiple instances of the unit layer stack (34, 142S, 31, 142D), and the bottommost insulating layer 32B by at least one anisotropic etch that employs the patterned lithographic material stack as an etch mask. Portions of the multiple instances of the unit layer stack (34, 142S, 31, 142D) located in the memory array region 100 and underlying the first set of openings in the patterned lithographic material stack are etched to form memory openings 149. As used herein, a "memory opening" refers to a structure in which memory elements, such as a memory stack structure, is subsequently formed. The memory openings 149 are formed through the topmost insulating layer 32T and the entirety of the multiple instances of the unit layer stack (34, 142S, 31, 142D) in the memory array region 100. Unmasked regions of the multiple instances of the unit layer stack (34, 142S, 31, 142D) and the retro-stepped dielectric material portions 65 located in the staircase regions (200A, 200B) that underlie the second set of openings in the patterned lithographic material stack can be etched to form optional support openings (not shown). The maximum lateral dimension (such as a diameter of a major axis) of each memory opening 149 may be in a range from 60 nm to 600 nm, such as from 120 nm to 300 nm, although lesser and greater maximum lateral dimensions may also be employed.

The memory openings 149 extend through the entirety of the multiple instances of the unit layer stack (34, 142S, 31, 142D). The chemistry of the anisotropic etch process employed to etch through the materials of the multiple instances of the unit layer stack (34, 142S, 31, 142D) can alternate to optimize etching of the respective materials in the multiple instances of the unit layer stack (34, 142S, 31, 142D). The anisotropic etch can be, for example, a series of reactive ion etches. The sidewalls of the memory openings 149 can be substantially vertical, or can be tapered. The patterned lithographic material stack can be subsequently removed, for example, by ashing.

The memory openings 149 can extend from the top surface of the multiple instances of the unit layer stack (34, 142S, 31, 142D) to at least the horizontal plane including the topmost surface of the substrate 9. Each of the memory openings 149 may include a sidewall (or a plurality of sidewalls) that extends substantially perpendicular to the topmost surface of the substrate 9. A two-dimensional array of memory openings 149 can be formed in the memory array region 100 through the multiple instances of the unit layer stack (34, 142S, 31, 142D). Thus, the two-dimensional array of memory openings 149 can be formed through the alternating stack of the source-level sacrificial material layers 142S and the drain-level sacrificial material layers 142D. In one embodiment, the two-dimensional array of memory openings 149 can be formed as clusters of periodic two-dimensional arrays such as hexagonal arrays. Generally, at least one memory opening 149 can be formed through the one or more instances of the unit layer stack (34, 142S, 31, 142D).

Figure 31:
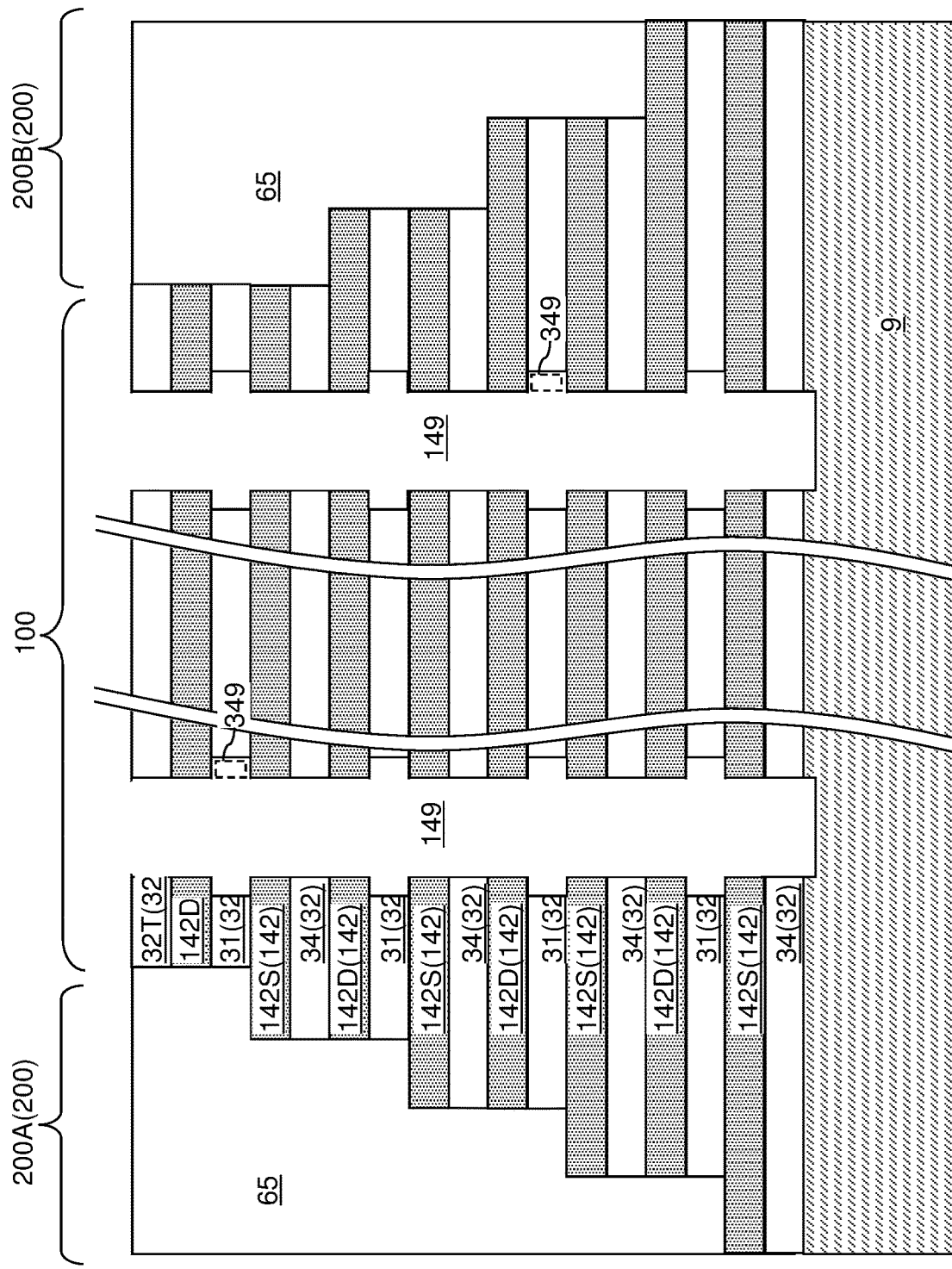
FIG. 31 is a vertical cross-sectional view of the third exemplary structure after formation of lateral recesses around the memory openings according to the third embodiment of the present disclosure.

Referring to FIG. 31, channel cavities (i.e., lateral recesses) 349 can be formed at each level of the channel-level insulating layers 31 by laterally recessing the channel-level insulating layers 31 relative to the vertical-isolation insulating layers 34, the source-level sacrificial material layers 142S, and the drain-level sacrificial material layers 142D. The memory openings 149 are laterally expanded at each level of the channel-level insulating layers 31 by the volumes of the channel cavities 349. As discussed above, the first insulating material of the channel-level insulating layers 31 provides a greater etch rate than the second insulating material of the vertical-isolation insulating layers 34 in an isotropic etch process. The isotropic etch process can be a wet etch process employing 100:1 dilute hydrofluoric acid if the channel-level insulating layers 31 comprises a doped silicate glass or an aluminum oxide selective etch medium if the channel-level insulating layers 31 comprise aluminum oxide. The channel cavities 349 can have a respective tubular shape. A vertical stack of channel cavities 349 can be formed around each of the memory openings 149. The height of each channel cavity 349 can be the same as the height of the channel-level insulating layer 31 that is formed at the same level as the respective channel cavity 349. The lateral recess distance for each of the channel cavities 349 can be in a range from 0.65 nm to 8 nm, such as from 2 nm to 6 nm, although lesser and greater lateral recess distances can also be employed. Generally, at least one lateral recess (i.e., at least one channel cavity 349) can be formed by laterally recessing each channel-level insulating layer 31 selective to all other layers (142S, 34, 142D) within the one or more instances of the unit layer stack (34, 142S, 31, 142D). The total number of channel cavities 349 around each memory opening 149 can be the same as the total number of the instances of the channel-level insulating layer 31 in the unit layer stack (34, 142S, 31, 142D). The total number of the channel cavities 349 in the third exemplary structure can be the same as the product of the total number of the instances of the channel-level insulating layer 31 in the unit layer stack (34, 142S, 31, 142D) and the total number of the memory openings 149 through the unit layer stack (34, 142S, 31, 142D).

Figure 32:
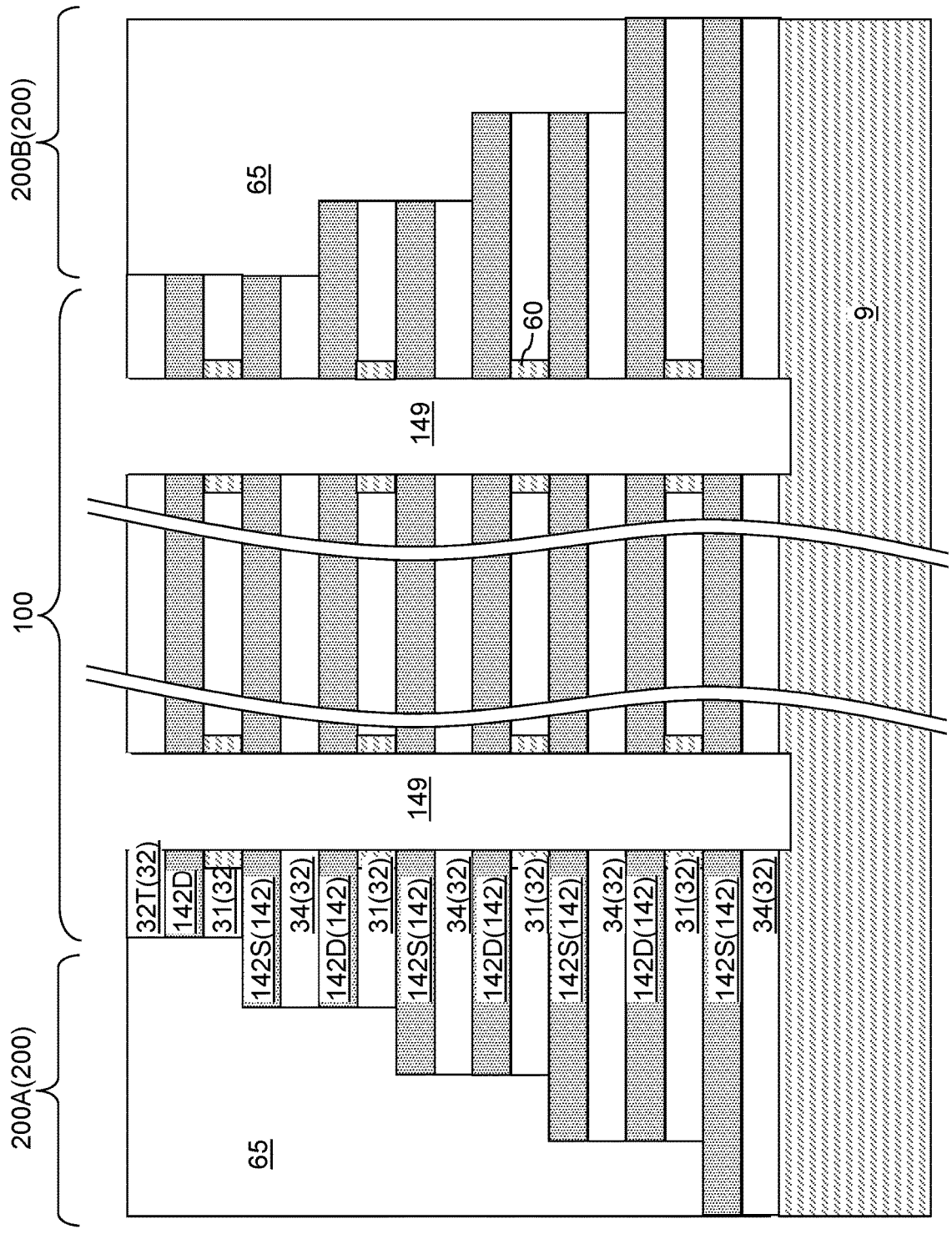
FIG. 32 is a vertical cross-sectional view of the third exemplary structure after formation of ferroelectric semiconductor channels in the lateral recesses according to the third embodiment of the present disclosure.

Referring to FIG. 32, a continuous ferroelectric semiconductor channel layer can be deposited by a conformal deposition process on physically exposed surfaces around the memory openings 149 and over the topmost insulating layer 32T. The continuous ferroelectric semiconductor channel layer includes a semiconducting ferroelectric material, i.e., a ferroelectric material having electrical conductivity in a range from $1.0 \times 10^{-5}$ S/m to $1.0 \times 10^{5}$ S/m. Generally, most ferroelectric materials are insulating, i.e., have electrical conductivity less than $1.0 \times 10^{-5}$ S/m. In one embodiment, the continuous ferroelectric semiconductor channel layer comprises, and/or consists essentially of, an indium selenide material. In one embodiment, the indium selenide material may be an alpha indium selenide material having a rhombohedral R3m crystalline structure and may have a material composition of $In_2Se_{3+\delta}$ as deposited, or after a subsequent anneal process. The value of δ may be in a range from 0 to 0.8, such as 0.3 to 0.5, for example 0.35 to 0.4. For example, the alpha indium selenide may comprise 37 atomic percent indium and 63 atomic percent selenium, a bandgap of ~1.39 eV, room temperature ferroelectricity with Curie temperature above 200° C., and ability to maintain ferroelectricity down to a few atomic layers. In one embodiment, the continuous ferroelectric semiconductor channel layer may have an electron mobility in range from 100 cm$^2$/(V·s) to 2,000 cm$^2$/(V·s), such as 400 to 500 cm$^2$/(V·s), which is about two orders of magnitude higher than that of polysilicon. This material provides a high performance with a large memory window and low leakage (e.g., individual transistor may have a high on/off ratio over $1 \times 10^8$).

The continuous ferroelectric semiconductor channel layer may be deposited by a conformal deposition process such as a chemical vapor deposition process or an atomic layer deposition process. The thickness of the continuous ferroelectric semiconductor channel layer may be in a range from 100% to 200% of the lateral recess distance of the channel cavities 349, i.e., the lateral distance between the recessed sidewalls of the channel-level insulating layers 31 and the vertical plane including sidewalls of the source-level sacrificial material layers 142S and the drain-level sacrificial material layers 142D around each memory opening 149. In one embodiment, the continuous ferroelectric semiconductor channel layer can have a lateral thickness in a range from 0.65 nm to 16 nm, such as from 2 nm to 12 nm. The continuous ferroelectric semiconductor channel layer may be 1 to 10 atomic monolayers thick, and comprise a two-dimensional or quasi-two dimensional layer. The continuous ferroelectric semiconductor channel layer can have a uniform thickness throughout.

In one embodiment, the continuous ferroelectric semiconductor channel layer may be annealed at an elevated temperature, which may be in a range from 500 degrees Celsius to 750 degrees Celsius. The duration of the anneal process may be in a range from 10 minutes to 30 minutes. The anneal process induces crystallization of the deposited material of the continuous ferroelectric semiconductor channel layer into a ferroelectric phase.

An anisotropic etch process, such as a reactive ion etch process, can be performed to etch unmasked portions of the continuous ferroelectric semiconductor channel layer selective to the material of the topmost insulating layer 32T. In one embodiment, the anisotropic etch process may be selective to the materials of the source-level sacrificial material layer 142S, the drain-level sacrificial material layer 142D, the channel-level insulating layers 31, and the vertical-isolation insulating layers 34. Portions of the continuous ferroelectric semiconductor channel layer that are located outside the volumes of the channel cavities 349 are removed by the anisotropic etch process.

Each remaining portion of the continuous ferroelectric semiconductor channel layer that remains in a respective one of the channel cavities 349 constitutes a ferroelectric semiconductor channel 160. In one embodiment, each of the ferroelectric semiconductor channels 160 may have a respective cylindrical inner sidewall that is located within a same cylindrical vertical plane that includes sidewalls of at least one source-level sacrificial material layer 142S and at least one drain-level sacrificial material layer 142D around a respective one of the memory openings 149. In one embodiment, each of the ferroelectric semiconductor channels 160 may have a tubular configuration, and may have a uniform thickness throughout between an inner sidewall and an outer sidewall. In one embodiment, the uniform thickness of each of the ferroelectric semiconductor channels 160 (as measured between an inner sidewall and an outer sidewall) may be in a range from 0.65 nm to 8 nm, such as from 2 nm to 6 nm. In one embodiment, each of the ferroelectric semiconductor channels 160 may be 1 to 10 atomic monolayers thick, and comprise a two-dimensional or quasi-two dimensional layer.

Generally, the ferroelectric semiconductor channels 160 can be formed by conformally depositing and then anisotropically etching a semiconducting ferroelectric material in the memory openings 149 such that discrete ferroelectric semiconductor channels 160 remain in the channel cavities 349. Each remaining tubular portion of the ferroelectric semiconducting material that remains in the at least one lateral recess (i.e., the at least one channel cavity 349) comprise a respective ferroelectric semiconductor channel 160. A ferroelectric semiconductor channel 160 can be formed within each of the at least one lateral recess (i.e., at least one channel cavities 349) around each memory opening 149. A vertical stack of discrete (i.e., vertically separated) ferroelectric semiconductor channels 160 may be formed around each memory opening 149. In one embodiment, each ferroelectric semiconductor channel 160 comprises, and/or consists essentially of, an indium selenide material. In one embodiment, the indium selenide material has a rhombohedral R3m crystalline structure and has a material composition of $In_2Se_{3+\delta}$, wherein $\delta$ is in a range from 0.3 to 0.5. In one embodiment, each ferroelectric semiconductor channel 160 has a lateral thickness of 1 to 10 atomic monolayers. In one embodiment, each ferroelectric semiconductor channel 160 has a lateral thickness in a range from 0.65 nm to 10 nm. In one embodiment, each ferroelectric semiconductor channel 160 has a tubular configuration with a uniform thickness between an inner sidewall and an outer sidewall. In one embodiment, the inner sidewall of each ferroelectric semiconductor channel 160 around a memory opening 149 can be located entirety within a tubular vertical plane including all sidewall surface segments of the memory opening 149.

Figure 33:
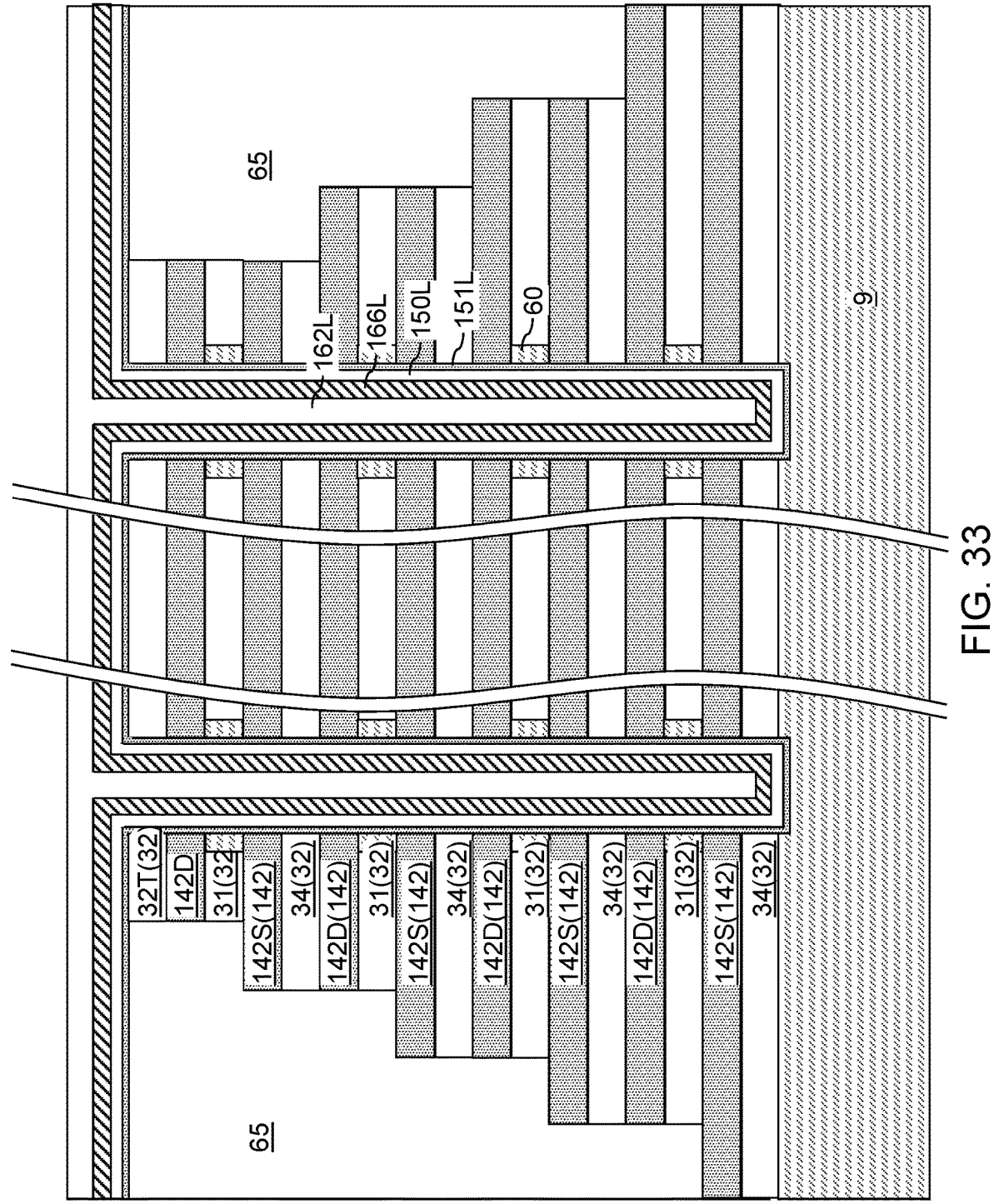
FIG. 33 is a vertical cross-sectional view of the third exemplary structure after deposition of an interfacial dielectric layer, a gate dielectric layer, a gate electrode material layer, and a dielectric fill material layer in the memory openings according to the third embodiment of the present disclosure.

Referring to FIG. 33, an optional continuous interfacial dielectric layer 151L may be formed over the ferroelectric semiconductor channels 160. The optional continuous interfacial dielectric layer 151L, if present, includes a passivation dielectric material that can reduce interfacial states on inner surface portions of the ferroelectric semiconductor channels 160. In one embodiment, the continuous interfacial dielectric layer 151L includes at least one dielectric metal oxide material, which may be, for example, one or more of aluminum oxide, hafnium oxide, aluminum hafnium oxide, lanthanum, oxide, etc. The thickness of the continuous interfacial dielectric layer 151L may be in a range from 1 nm to 3 nm, although lesser and greater thicknesses may also be employed.

A gate dielectric layer 150L can be formed on the continuous interfacial dielectric layer 151L (or on the sidewalls of the memory openings 149 and the ferroelectric semiconductor channels 160 in case the continuous interfacial dielectric layer 151L is not employed) and over the insulating cap layer 70 by a conformal deposition process. The gate dielectric layer 150L may include any dielectric material that can be employed as a gate dielectric material. The gate dielectric layer 150L can include a single dielectric material layer or a stack of a plurality of dielectric material layers.

In one embodiment, the gate dielectric layer 150L can include a dielectric semiconductor compound such as silicon oxide, silicon oxynitride, silicon nitride, or a combination thereof. In one embodiment, the gate dielectric layer 150L can include silicon oxide. In this case, the dielectric semiconductor compound of the gate dielectric layer 150L can be formed by a conformal deposition method such as low pressure chemical vapor deposition or atomic layer deposition.

Alternative or additionally, the gate dielectric layer 150L can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the gate dielectric layer 150L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($La_2O_3$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the gate dielectric layer 150L includes aluminum oxide. In one embodiment, the gate dielectric layer 150L can include multiple dielectric metal oxide layers having different material compositions.

At least one gate electrode material can be subsequently conformally deposited on the gate dielectric layer 150L to form a gate electrode material layer 166L. For example, a layer stack of a metallic nitride liner (e.g., barrier layer) including a conductive metallic nitride (such as TiN, TaN, or WN) and a metal fill layer including a metal (such as W, Co, Mo, Ru, Cu, Al or an alloy thereof) can be sequentially deposited as the at least one gate electrode material. Additionally or alternatively, a heavily doped semiconductor material may be employed as one of the at least one gate electrode material. The lateral thickness of the gate electrode material layer 166L within each memory opening 149 (as measured between an outer sidewall and an inner sidewall) may be may be in a range from 15 nm to 200 nm, such as from 30 nm to 100 nm, although lesser and greater maximum lateral dimensions may also be employed.

A dielectric core layer 162L may be deposited in remaining volumes of the memory openings 149. The dielectric core layer 162L includes a dielectric material such as silicon oxide or organosilicate glass. The dielectric core layer 162L may be deposited by a conformal deposition method such as low pressure chemical vapor deposition (LPCVD), or by a self-planarizing deposition process such as spin coating.

Figure 34A:
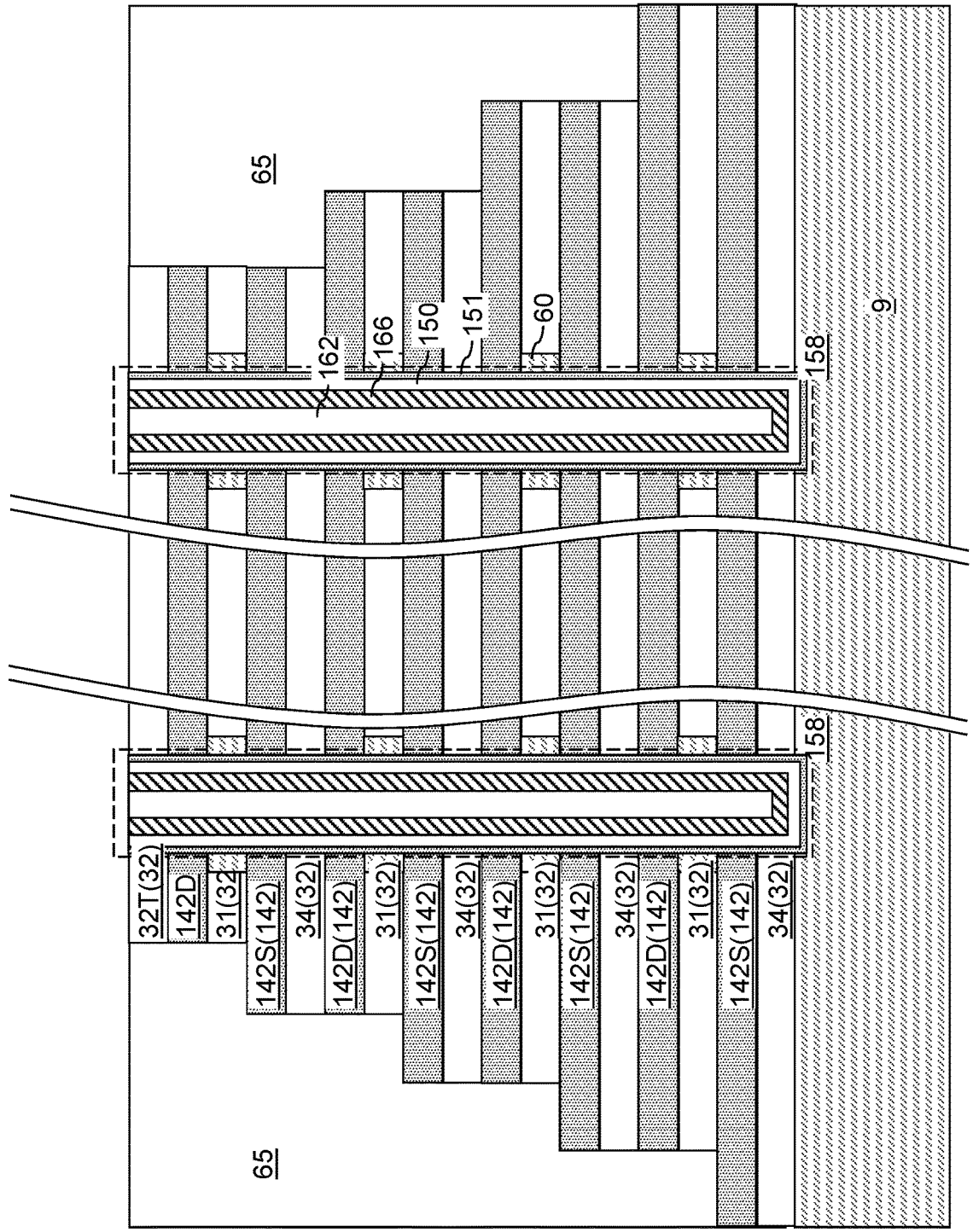
FIG. 34A is a vertical cross-sectional view of the third exemplary structure after formation of memory opening fill structures in the memory openings according to the third embodiment of the present disclosure.

Referring to FIGS. 34A and 34B, portions of the dielectric core layer 162L, the gate electrode material layer 166L, the gate dielectric layer 150L, and the optional continuous interfacial dielectric layer 151L can be removed from above the horizontal plane including the top surface of the topmost insulating layer 32T by a planarization process, which may employ a chemical mechanical polishing (CMP) process and/or a recess etch process. Each remaining portion of the optional continuous interfacial dielectric layer 151L constitutes an optional interfacial dielectric layer 151. Each remaining portion of the gate dielectric layer 150L constitutes a gate dielectric 150. Each remaining portion of the gate electrode material layer 166L constitutes a vertical word line 166. Each remaining portion of the dielectric core layer 162L constitutes a dielectric core 162. Each contiguous combination of material portions that fills a memory opening 149 constitutes a memory opening fill structure 158. Thus, each memory opening fill structure 158 may comprises a dielectric core 162, a vertical word line 166, a gate dielectric 150, and an optional interfacial dielectric layer 151. Each memory opening fill structure 158 may be laterally surrounded by, and may be contacted by, at least one ferroelectric semiconductor channel 160 (which may comprise a vertical stack of tubular ferroelectric semiconductor channels 160). Each ferroelectric semiconductor channel 160 functions as a vertical semiconductor channel and as a ferroelectric memory element. In one embodiment, a two-dimensional array of memory opening fill structures 158 may be formed through the layer stack overlying the substrate. In case each memory opening fill structure 158 is laterally surrounded by, and is contacted by, a respective vertical stack of tubular ferroelectric semiconductor channels 160, a three-dimensional array of memory elements comprising a three-dimensional array of ferroelectric semiconductor channels 160 may be provided.

Figure 35A:
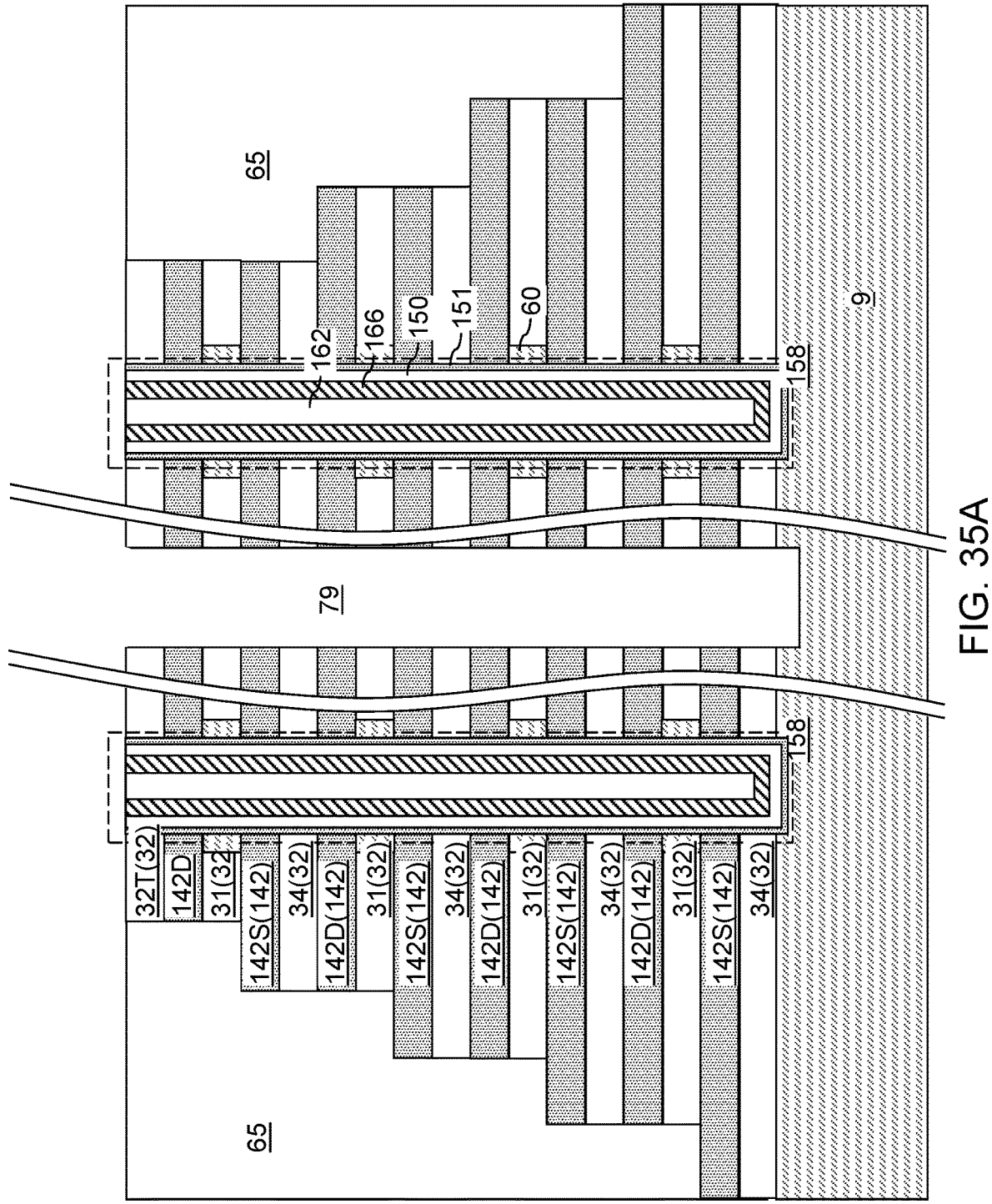
FIG. 35A is a vertical cross-sectional view of the third exemplary structure after formation of a backside trench according to the third embodiment of the present disclosure.

Referring to FIGS. 35A and 35B, a photoresist layer (not shown) can be applied over the topmost insulating layer 32T, and can be lithographically patterned to form openings in areas between clusters of memory opening fill structures 158. The pattern in the photoresist layer can be transferred through the topmost insulating layer 32T and each underlying instance of the unit layer stack (34, 142S, 31, 142D) employing an anisotropic etch to form backside trenches 79, which can vertically extend from the top surface of the topmost insulating layer 32T to the top surface of the substrate (such as the top surface of the substrate semiconductor layer 9), and can laterally extend through the memory array region 100 and the staircase regions (200A, 200B).

In one embodiment, the backside trenches 79 can laterally extend along a first horizontal direction hd1 and can be laterally spaced apart from each other along a second horizontal direction hd2 that is perpendicular to the first horizontal direction hd1. The memory opening fill structures 158 can be arranged in rows that extend along the first horizontal direction hd1. Each backside trench 79 can have a uniform width that is invariant along the lengthwise direction (i.e., along the first horizontal direction hd1). Multiple rows of memory opening fill structures 158 can be located between a neighboring pair of backside trenches 79. The photoresist layer can be removed, for example, by ashing.

Figure 36:
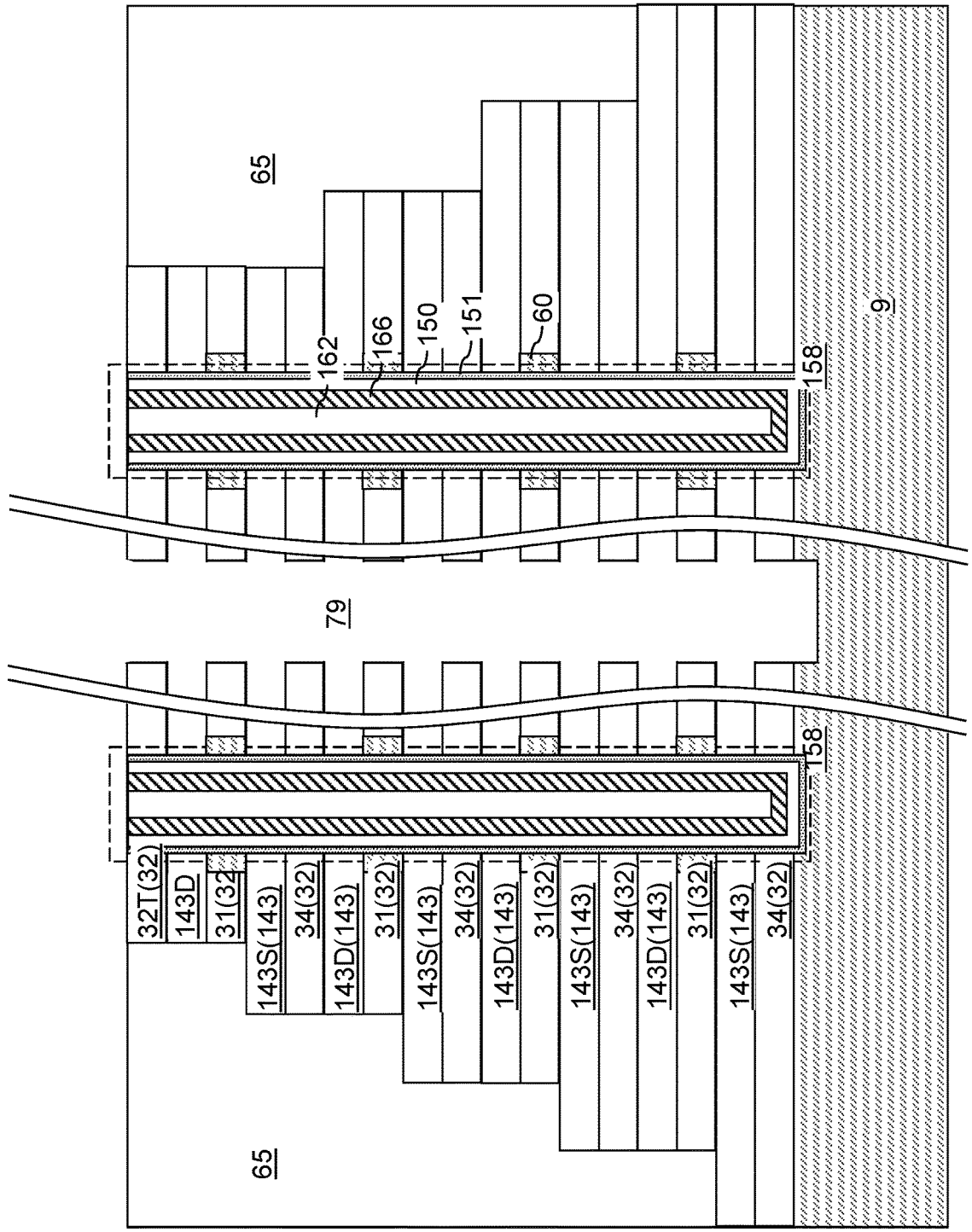
FIG. 36 is a vertical cross-sectional view of the third exemplary structure after formation of backside recesses according to the third embodiment of the present disclosure.

Referring to FIG. 36, an etchant that selectively etches the materials of the source-level sacrificial material layer 142S and drain-level sacrificial material layers 142D with respect to the materials of the insulating layers 32, the retro-stepped dielectric material portions 65, and the interfacial dielectric layers 151 (if present) or the gate dielectrics 150 (in case the interfacial dielectric layers are not present) can be introduced into the backside trenches 79, for example, employing an etch process. Source-level backside recesses 143S and drain-level backside recesses 143D are formed in volumes from which the source-level sacrificial material layer 142S and drain-level sacrificial material layers 142D are removed, respectively. The source-level backside recesses 143S and the drain-level backside recesses 143D are collectively referred to as backside recesses 143.

The etch process can be a wet etch process employing a wet etch solution, or can be a gas phase (dry) etch process in which the etchant is introduced in a vapor phase into the backside trenches 79. For example, if the source-level sacrificial material layer 142S and the drain-level sacrificial material layers 142D include silicon nitride, and if the materials of the insulating layers 32 and the retro-stepped dielectric material portion 65 can include silicon oxide and/or metal oxide, then the etch process can be a wet etch process in which the exemplary structure is immersed within a wet etch tank including phosphoric acid, which etches silicon nitride selective to silicon oxide, silicon, and various other materials.

Each backside recess 143 can be a laterally extending cavity having a lateral dimension that is greater than the vertical extent of the cavity. In other words, the lateral dimension of each backside recess 143 can be greater than the height of the backside recess 143. In one embodiment, a plurality of source-level backside recesses 143S and the drain-level backside recesses 143D can be formed in the volumes from which the materials of the source-level sacrificial material layer 142S and drain-level sacrificial material layers 142D are removed. The memory openings 149 in which the memory opening fill structures 158 are formed are herein referred to as front side openings or front side cavities in contrast with the source-level backside recesses 143S and the drain-level backside recesses 143D. Each of the plurality of source-level backside recesses 143S and the drain-level backside recesses 143D can extend substantially parallel to the top surface of the substrate 9. In one embodiment, each backside recess 143 can have a uniform height throughout.

Figure 37A:
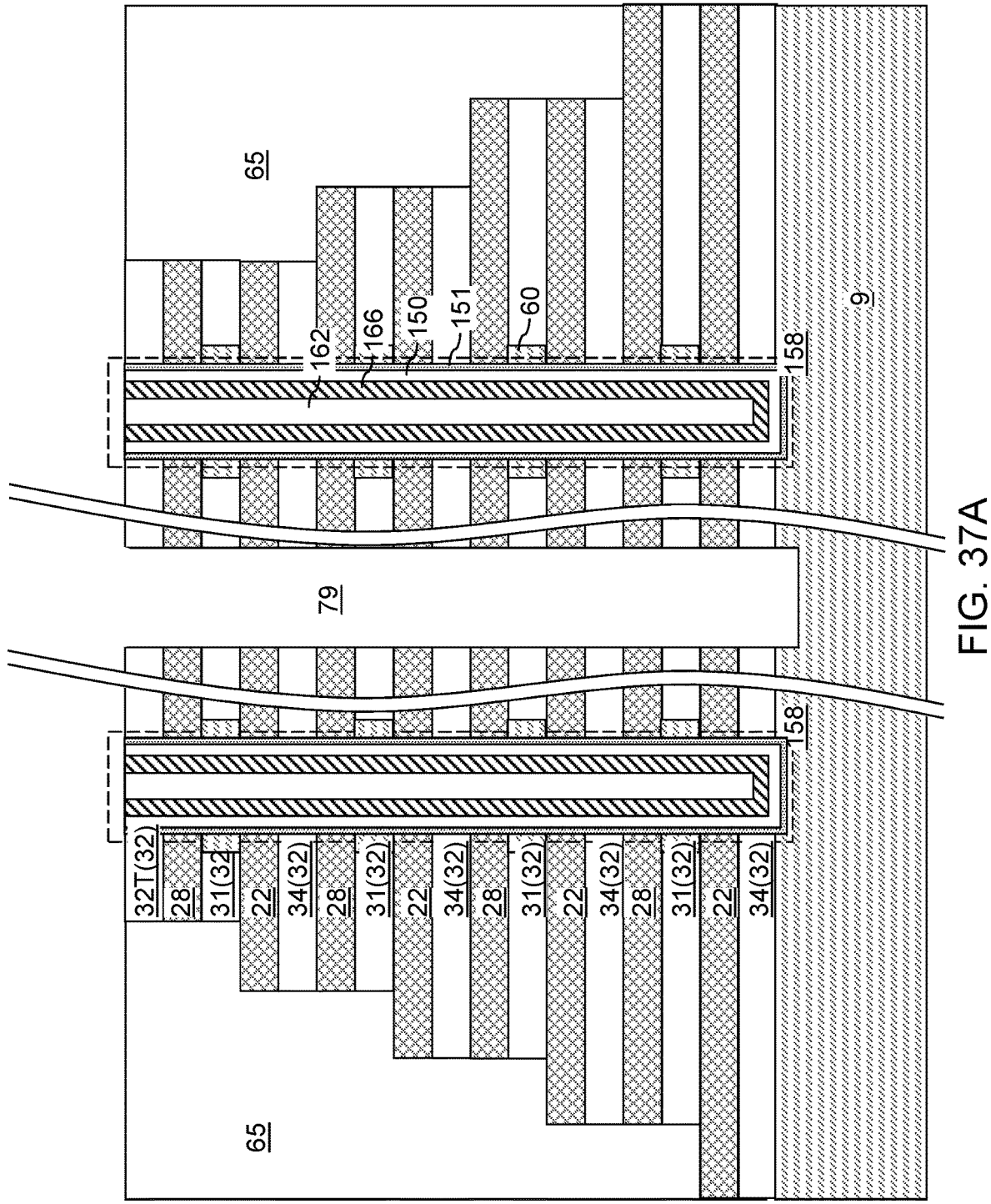
FIG. 37A is a vertical cross-sectional view of the third exemplary structure after formation of source electrically conductive layers and drain electrically conductive layers according to the third embodiment of the present disclosure.

Referring to FIGS. 37A and 37B, at least one metallic material can be deposited in the source-level backside recesses 143S and the drain-level backside recesses 143D through the backside trenches 79. The at least one metallic material can include a metallic nitride material (such as TaN, TiN, or WN) that forms a metallic liner (22L or 28L) and a metallic fill material portion (22F or 28F)) (such as W, Co, Ru, or Mo) that fills remaining volumes of the source-level backside recesses 143S and the drain-level backside recesses 143D that are not filled by the metallic liner. The at least one metallic material fills all volumes of the source-level backside recesses 143S and the drain-level backside recesses 143D. Portions of the at least one metallic material deposited at peripheral portions of the backside trenches 79 or above the topmost insulating layer 32T can be removed by an etch process, which may include an isotropic etch process and/or an anisotropic etch process. Remaining portions of the at least one metallic material that fills the source-level backside recesses 143S constitute source layers 22, which function as source layers. Remaining portions of the at least one metallic material that fills the drain-level backside recesses 143D constitute drain layers 28, which function as bit line layers.

Generally, the source-level sacrificial material layer 142S and the drain-level sacrificial material layers 142D are replaced with the source layers 22 and the drain layers 28, respectively. Insulating layers (31, 34) are located between each vertically neighboring pair of a source layer 22 and drain layer 28. In one embodiment, each of the source layers 22 and the drain layers 28 may consist essentially of at least one electrically conductive material. The channel-level insulating layers 31 have a different composition than the vertical-isolation insulating layers 34. In one embodiment, each ferroelectric semiconductor channel 160 contacts a cylindrical sidewall of a respective channel-level insulating layer 31 located between a respective vertically neighboring pair of a source layer 22 and a drain layer 28. The insulating layers 32 are interlaced with the source layers 22 and the drain layers 28 of the alternating stack of source layers 22 and drain layers 28. The insulating layers 32 comprise channel-level insulating layers 31 in contact with a respective one of the ferroelectric semiconductor channels 160, and vertical-isolation insulating layers 34 located between vertically neighboring pairs of the channel-level insulating layers 31 and not contacting any of the ferroelectric semiconductor channels 160.

In one embodiment, the channel-level insulating layers 31 comprise a doped semiconductor oxide material (e.g., phosphorus doped silicon oxide, such as phosphosilicate glass), and the vertical-isolation insulating layers 34 comprise a semiconductor oxide material (e.g., undoped silicon oxide) having an etch rate in 100:1 dilute hydrofluoric acid at room temperature that is less than 30% of an etch rate of the doped semiconductor oxide material in 100:1 dilute hydrofluoric acid at room temperature.

Figure 38:
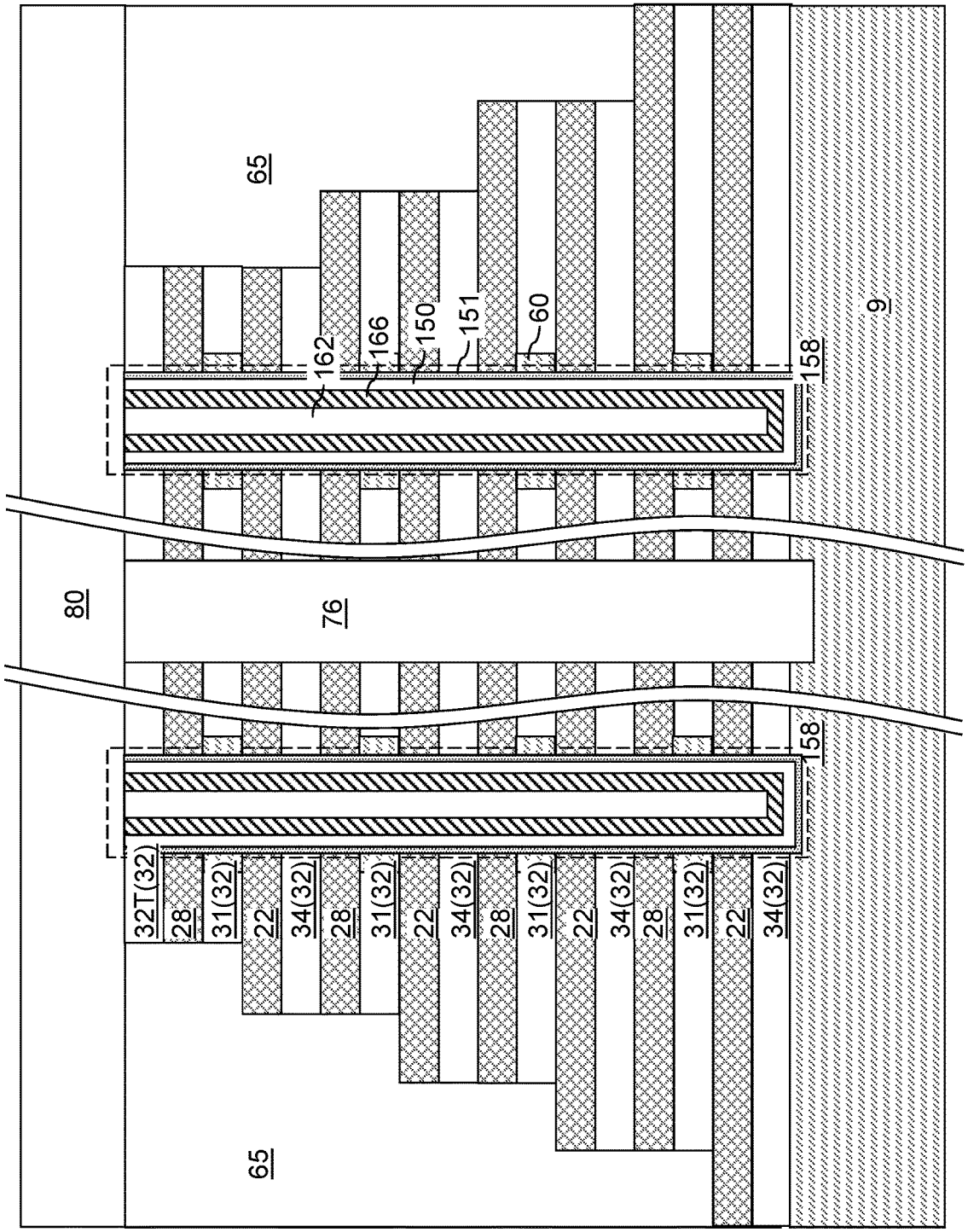
FIG. 38 is a vertical cross-sectional view of the third exemplary structure after formation of a backside trench fill structure according to the third embodiment of the present disclosure.

Referring to FIG. 38, a dielectric material such as silicon oxide can be deposited in each backside trench to form backside trench fill structures 76. Portions of the dielectric material that is deposited over the topmost insulating layer 32T can constitute a contact-level dielectric layer 80. Each backside trench fill structure 76 ca vertically extend through the multiple instances of a unit layer stack including a source layer 22, a channel-level insulating layer 31, a drain layer 28, and a vertical-isolation insulating layer 34.

Figure 39A:
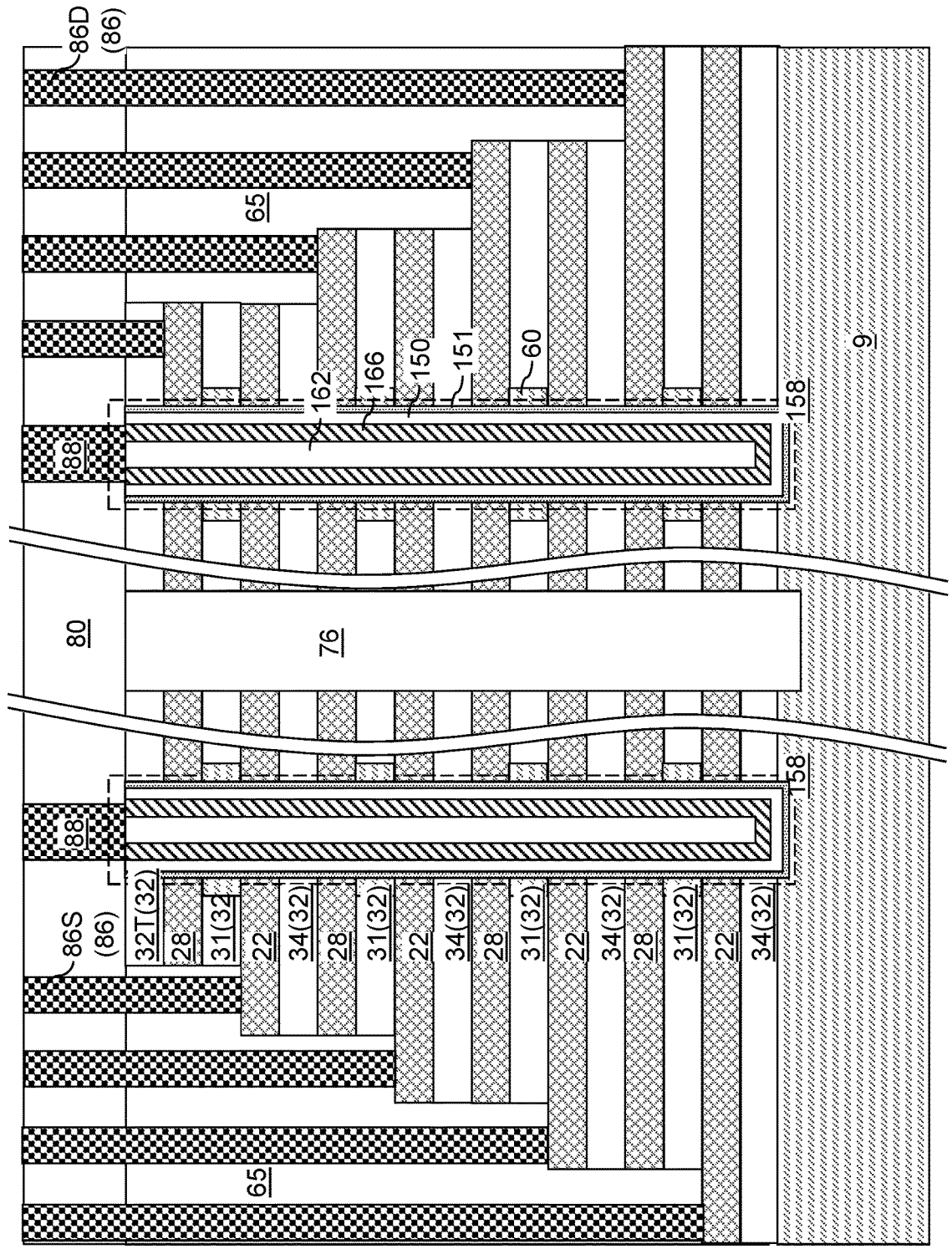
FIG. 39A is a vertical cross-sectional view of the third exemplary structure after formation of layer contact via structures according to the third embodiment of the present disclosure.
Figure 39B:
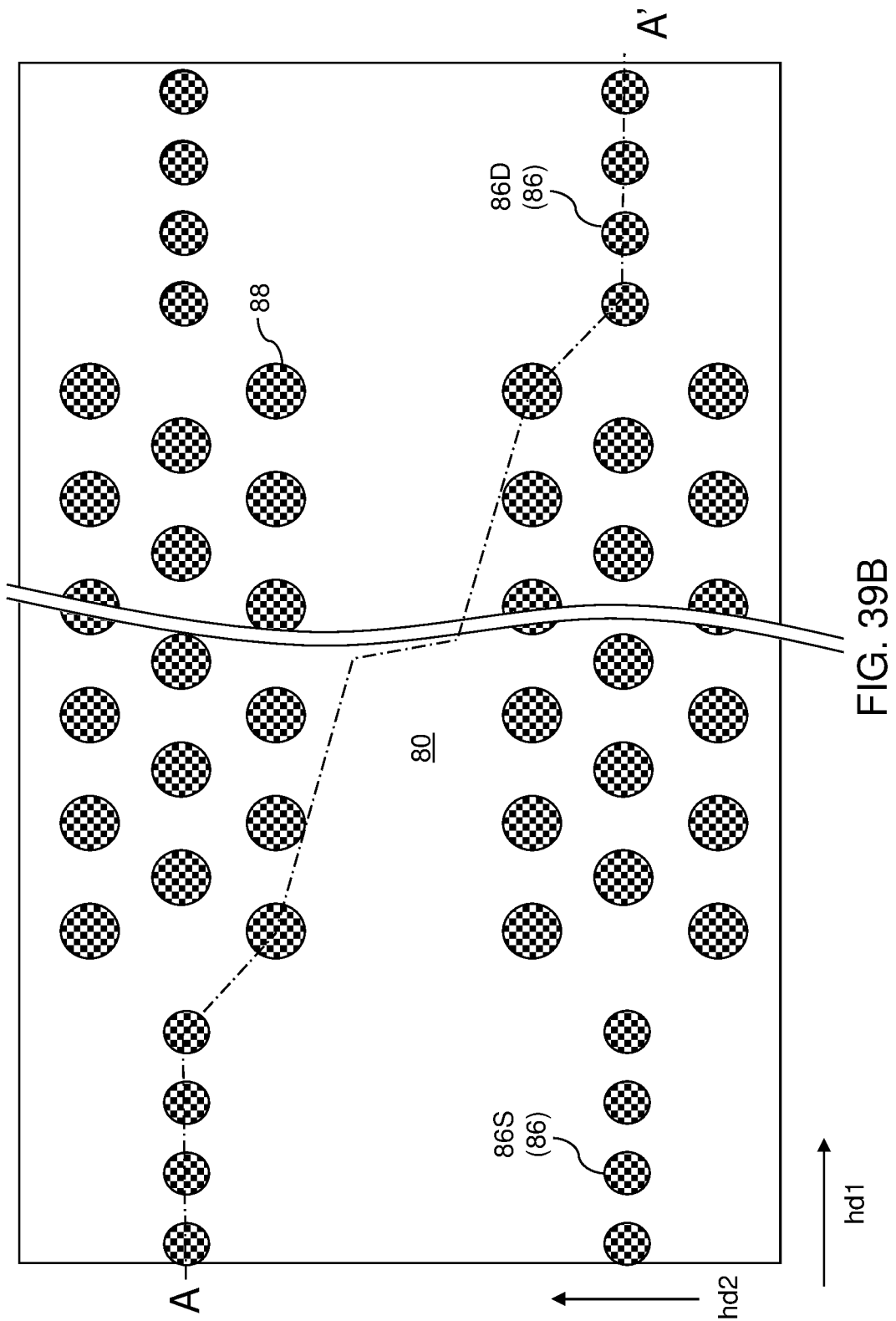
FIG. 39B is a top-down view of the third exemplary structure of FIG. 39A. The zig-zag vertical plane A-A' is the plane of the vertical cross-sectional view of FIG. 39A.

Referring to FIGS. 39A and 39B, contact via structures (88, 86) can be formed through the contact-level dielectric layer 80 and optionally through a retro-stepped dielectric material portion 65. The contact via structures (88, 86) include word line contact via structures 88 each of which contacts a respective one of the vertical word lines 166. Word-line-interconnect metal lines (not shown) can be subsequently formed over the contact-level dielectric layer 80. Each of the word-line-interconnect metal lines can be in electrical contact with a respective one of the vertical word lines 166 through a respective word line contact via structure 88.

Further, the contact via structures (88, 86) include layer contact via structures 86 that contact a respective one of the source layers 22 and the drain layers 28 within the respective staircase regions (200A, 200B). The layer contact via structures 86 include source layer contact via structures 86S and drain layer contact via structures 86D. Each source layer contact via structure 86S contacts a respective one of the source layers 22. Each drain layer contact via structure 86D contacts a respective one of the drain layers 28. Source interconnect metal lines (not shown) and drain interconnect metal lines (not shown) can be subsequently formed over the contact-level dielectric layer 80 to electrically connect each of the layer contact via structures (86S, 86D) to a respective node of a driver circuit, which includes source line drivers, bit line drivers, and a sensing circuit.

In one embodiment, the source layers 22 in the alternating stack of source layers 22 and drain layers 28 have different lateral extents that decrease with a vertical distance from the substrate, and the drain layers 28 in the alternating stack of source layers 22 and drain layers 28 have different lateral extents that decrease with a vertical distance from the substrate. A first retro-stepped dielectric material portion 65 contacts horizontal surfaces of the source layers 22 in the alternating stack and laterally surrounds the source layer contact via structures 86S. A second retro-stepped dielectric material portion 65 contacts horizontal surfaces of the drain layers 28 in the alternating stack and laterally surrounds the drain layer contact via structures 86D.

Referring collectively to FIGS. 27-39B and according to various embodiments of the present disclosure, a memory device includes a ferroelectric semiconductor channel 160, a source region 22 contacting a first portion of the ferroelectric semiconductor channel, a drain region 28 located above the source region and contacting a second portion of the ferroelectric semiconductor channel located above the first portion, a word line 166, and a gate dielectric 150 located between the word line and the ferroelectric semiconductor channel.

In one embodiment, each ferroelectric semiconductor channel 160 comprises, and/or consists essentially of, an indium selenide material. In one embodiment, the indium selenide material has a rhombohedral R3m crystalline structure and has a material composition of $In_2Se_{3+\delta}$, wherein $\delta$ is in a range from 0.3 to 0.5. In one embodiment, each ferroelectric semiconductor channel 160 has a lateral thickness of 1 to 10 atomic monolayers. In one embodiment, each ferroelectric semiconductor channel 160 has a lateral thickness in a range from 0.65 nm to 10 nm.

In one embodiment, the memory device further comprises a unit layer stack (34, 22, 31, 28) located over a substrate 9, wherein the unit layer stack (34, 22, 31, 28) comprises a vertical-isolation insulating layer 34, the source region comprising a source layer 22, a channel-level insulating layer 31, and a drain region comprising a drain layer 28; a memory opening 149 vertically extending through the unit layer stack (34, 22, 31, 28); and a memory opening fill structure 158 located within the memory opening 149. In one embodiment, the memory opening fill structure 158 comprises, from outside to inside, the gate dielectric 150 and the word line 166. In another embodiment, the memory opening fill structure 158 comprises, from outside to inside, the gate dielectric 150, the word line 166 and a dielectric core 162. The channel-level insulating layer 31 is laterally spaced from the gate dielectric 150 by a respective ferroelectric semiconductor channel 160.

In one embodiment, the ferroelectric semiconductor channel 160 has a tubular configuration with a uniform thickness between an inner sidewall and an outer sidewall. In one embodiment, the inner sidewall of the ferroelectric semiconductor channel 160 is located entirety within a tubular vertical plane including all sidewall surface segments of the memory opening 149.

In one embodiment, the ferroelectric semiconductor channel 160 comprises: a first annular horizontal surface contacting the source layer 22; and a second annular horizontal surface contacting the drain layer 28.

In one embodiment, the source layer 22 and the drain layer 28 are in direct contact with an outer sidewall of the gate dielectric 150, or are in direct contact with an interfacial dielectric layer 151 which contacts an outer sidewall of the gate dielectric 150.

In one embodiment, the memory device further comprises a plurality of instances of the unit layer stack (34, 22, 31, 28) that are vertically stacked above the substrate 9. In one embodiment, the gate dielectric 150 and the word line 166 vertically extend through each channel-level insulating layer 31 within the plurality of instances of the unit layer stack (34, 22, 31, 28). In one embodiment, additional memory openings 149 vertically extend through the plurality of instances of the unit layer stack (34, 22, 31, 28); and additional memory opening fill structures 158 located within the additional memory openings 149.

In one embodiment, the memory device comprises a three-dimensional memory array of vertically separated ferroelectric semiconductor channels 160 located around the memory opening fill structure 158. In one embodiment, the memory device comprises a three-dimensional NOR memory device.

The ferroelectric semiconductor channels 160 of the embodiments of the present disclosure can be programmed by applying a positive voltage or a negative voltage to a gate electrode 166 relative to the source region 22 and the drain region 28. The programming voltage may have a magnitude in a range from 4 V to 12 V, such as from 5 V to 8 V, as described above.

The various embodiments of the present disclosure provide ferroelectric memory devices that store data bits within portions of a ferroelectric semiconductor channel. Formation of separate material layers for ferroelectric memory elements and a semiconductor channel is not necessary. Instead, the ferroelectric memory elements and the semiconductor channel are integrated into a single structural element of a ferroelectric semiconductor channel, thereby reducing the production cost and processing time for a three-dimensional memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:
   a ferroelectric semiconductor channel that extends along a vertical direction and has a cylindrical inner sidewall, a cylindrical outer sidewall, a first annular horizontal surface, and a second annular horizontal surface;
   a channel-level insulating layer comprising a cylindrical sidewall that contacts an entirety of the cylindrical outer sidewall of the ferroelectric semiconductor channel;
   a source region contacting an entirety of the first annular horizontal surface of the ferroelectric semiconductor channel;
   a drain region vertically spaced from the source region and contacting an entirety of the second annular horizontal surface of the ferroelectric semiconductor channel;
   a word line; and
   a gate dielectric located between the word line and the ferroelectric semiconductor channel and laterally surrounded by the cylindrical inner sidewall of the ferroelectric semiconductor channel.

2. The memory device of claim 1, wherein the ferroelectric semiconductor channel comprises an indium selenide material.

3. The memory device of claim 2, wherein the indium selenide material has a rhombohedral R3m crystalline structure and has a material composition of $In_2Se_{3+\delta}$, wherein $\delta$ is in a range from 0.3 to 0.5.

4. The memory device of claim 1, wherein the ferroelectric semiconductor channel has a lateral thickness in a range from 0.65 nm to 10 nm.

5. The memory device of claim 1, wherein the memory device comprises a three-dimensional NOR memory device.

6. The memory device of claim 1, wherein the cylindrical sidewall of the channel-level insulating layer continuously extends between the source region and the drain region, and has a first periphery that is located on a horizontal surface of the source region and has a second periphery that is located on a horizontal surface of the drain region.

7. The memory device of claim 1, wherein:
   each of the source region and the drain region comprises a combination of a metallic liner and a metallic fill material portion;
   the metallic liner of the source region and the metallic liner of the drain region have a first material composition and a first thickness; and
   the metallic fill material portion of the source region and the metallic fill material portion of the drain region have a second material composition.

8. A memory device, comprising:
   one or more instances of a unit layer stack located over a substrate, wherein each instance of the unit layer stack comprises:
   a vertical-isolation insulating layer located over the substrate;
   a source layer on the vertical-isolation insulating layer;
   a channel-level insulating layer on the source layer;

a ferroelectric semiconductor channel on the source layer and adjacent to the channel-level insulating layer; and a drain layer on the ferroelectric semiconductor channel and the channel-level insulating layer;

wherein the ferroelectric semiconductor channel extends along a vertical direction and has a cylindrical inner sidewall, a cylindrical outer sidewall, a first annular horizontal surface, and a second annular horizontal surface;

wherein the channel-level insulating layer comprises a cylindrical sidewall that contacts an entirety of the cylindrical outer sidewall of the ferroelectric semiconductor channel;

wherein the source region contacts an entirety of the first annular horizontal surface of the ferroelectric semiconductor channel and contacts a first horizontal surface of the channel-level insulating layer;

wherein a drain region is vertically spaced from the source region and contacts an entirety of the second annular horizontal surface of the ferroelectric semiconductor channel and contacts a second horizontal surface of the channel-level insulating layer;

a word line vertically extends through the one or more instances of the unit layer stack; and a gate dielectric is located between the word line and each ferroelectric semiconductor channel within the one or more instances of the unit layer stack, and is laterally surrounded by the cylindrical inner sidewall of the ferroelectric semiconductor channel within each instance of the unit layer stack.

9. The memory device of claim 8, wherein each ferroelectric semiconductor channel within the one or more instances of the unit layer stack has a tubular configuration with a uniform thickness between the cylindrical inner sidewall and the cylindrical outer sidewall.

10. The memory device of claim 9, wherein:
the word line and the gate dielectric are located within a memory opening that vertically extends through the one or more instances of the unit layer stack; and
the cylindrical inner sidewall of each ferroelectric semiconductor channel is located entirety within a tubular vertical plane including all sidewall surface segments of the memory opening.

11. The memory device of claim 8, wherein the source layer and the drain layer within each instance of the unit layer stack are in direct contact with an outer sidewall of the gate dielectric.

12. The memory device of claim 8, wherein the one or more instances of the unit layer stack comprise a plurality of instances of the unit layer stack that are vertically stacked along the vertical direction above the substrate.

13. The memory device of claim 12, wherein the gate dielectric and the word line vertically extend through each channel-level insulating layer within the plurality of instances of the unit layer stack.

14. The memory device of claim 12, wherein:
the word line and the gate dielectric are located within a memory opening that vertically extends through the one or more instances of the unit layer stack; and
the memory device further comprises:
additional memory openings vertically extending through the plurality of instances of the unit layer stack; and
additional gate dielectrics and additional word lines located within the additional memory openings.

15. The memory device of claim 8, further comprising an interfacial dielectric layer in contact with an outer sidewall of the gate dielectric, wherein, within each instance of the unit layer stack, the source layer and the drain layer are in direct contact with the interfacial dielectric layer.

16. The memory device of claim 8, wherein:
each source layer and each drain layer within the one or more instances of the unit layer stack comprise a combination of a metallic liner and a metallic fill material portion;
each metallic liner within the one or more instances of the unit layer stack has a first material composition and a first thickness; and
each metallic fill material portion within the one or more instances of the unit layer stack has a second material composition.

17. The memory device of claim 8, wherein:
the channel-level insulating layer within each instance of the unit layer stack comprises a first insulating material having a first etch rate in 100:1 dilute hydrofluoric acid;
the vertical-isolation insulating layer within each instance of the unit layer stack comprises a second insulating material having a second etch rate in said 100:1 dilute hydrofluoric acid; and
the first etch rate is at least 10 times the second etch rate.

* * * * *